(12) United States Patent
Yasuda et al.

(10) Patent No.: US 6,338,971 B1
(45) Date of Patent: *Jan. 15, 2002

(54) METHOD OF CORRECTING ALIGNMENT

(75) Inventors: Tsuneo Yasuda; Yoshikatu Tomimatu, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 52 days.

This patent is subject to a terminal disclaimer.

(21) Appl. No.: 09/256,217

(22) Filed: Feb. 24, 1999

(30) Foreign Application Priority Data

Sep. 4, 1998 (JP) ............................................ 10-251234

(51) Int. Cl.$^7$ .............................................. H01L 21/66
(52) U.S. Cl. ........................... 438/14; 438/18; 438/460; 438/462
(58) Field of Search ............................ 438/14, 18, 460, 438/462

(56) References Cited

U.S. PATENT DOCUMENTS 6,092,031 A * 7/2000 Yasuda et al.

FOREIGN PATENT DOCUMENTS

| JP | 62-235732 | 10/1987 |
| JP | 3-202730 | 9/1991 |
| JP | 9-115817 | 5/1997 |

* cited by examiner

Primary Examiner—Kevin M. Picardat
Assistant Examiner—D. M. Collins
(74) Attorney, Agent, or Firm—Oblon, Spivak, McClelland, Maier & Neustadt, P.C.

(57) ABSTRACT

A method of correcting alignment with high alignment precision is provided. A mean value of true shears of the past (true shears for data numbers i=1 to 4) is determined. A difference (VA1) between the immediately preceding true shear (for the data number i=1) and the two-cycle previous true shear (for the data number i=2) is calculated. The product (VA2) of the true shear difference (VA1) and a constant value is calculated. Adding the product (VA2) to the mean value to determine a predicted stepper correction value (Pr1). A stepper set value is determined based on the predicted stepper correction value (Pr1).

17 Claims, 41 Drawing Sheets

MANUFACTURING ERROR

FIG. 10

| | | | 1000 |
|---|---|---|---|
| LOT NO. | | XYZ-100 | XYZ-100 |
| TYPE OF WAFER | | A | A |
| MAJOR STEP | UPPER PATTERN | FIRST MAJOR STEP | SECOND MAJOR STEP |
| | LOWER PATTERN | NOTHING | FIRST MAJOR STEP |
| STEPPER CODE | UPPER PATTERN | STEP1 | STEP2 |
| | LOWER PATTERN | NOTHING | STEP1 |
| EXPOSURE DATE AND TIME | | 10/03. 01:00 | 10/04. 01:00 |
| STEPPER CORRECTION VALUE | OFFSET (X) | 0.01 | 0.02 |
| | S | 0 | 0 |
| LOWER-PATTERN ROTATION | | 0 | 0 |
| OVERLAY CHECKING CORRECTION VALUE | OFFSET (X) | 0.01 | 0.02 |
| | K | -1 | 0 |
| TRUE SHEAR | OFFSET (X) | 0.02 | 0 |
| | S-K | +1 | 0 |
| STEP-ROTATION | | -1 | -1 |
| SELF-ROTATION | | -1 | -1 |

FIG. 17

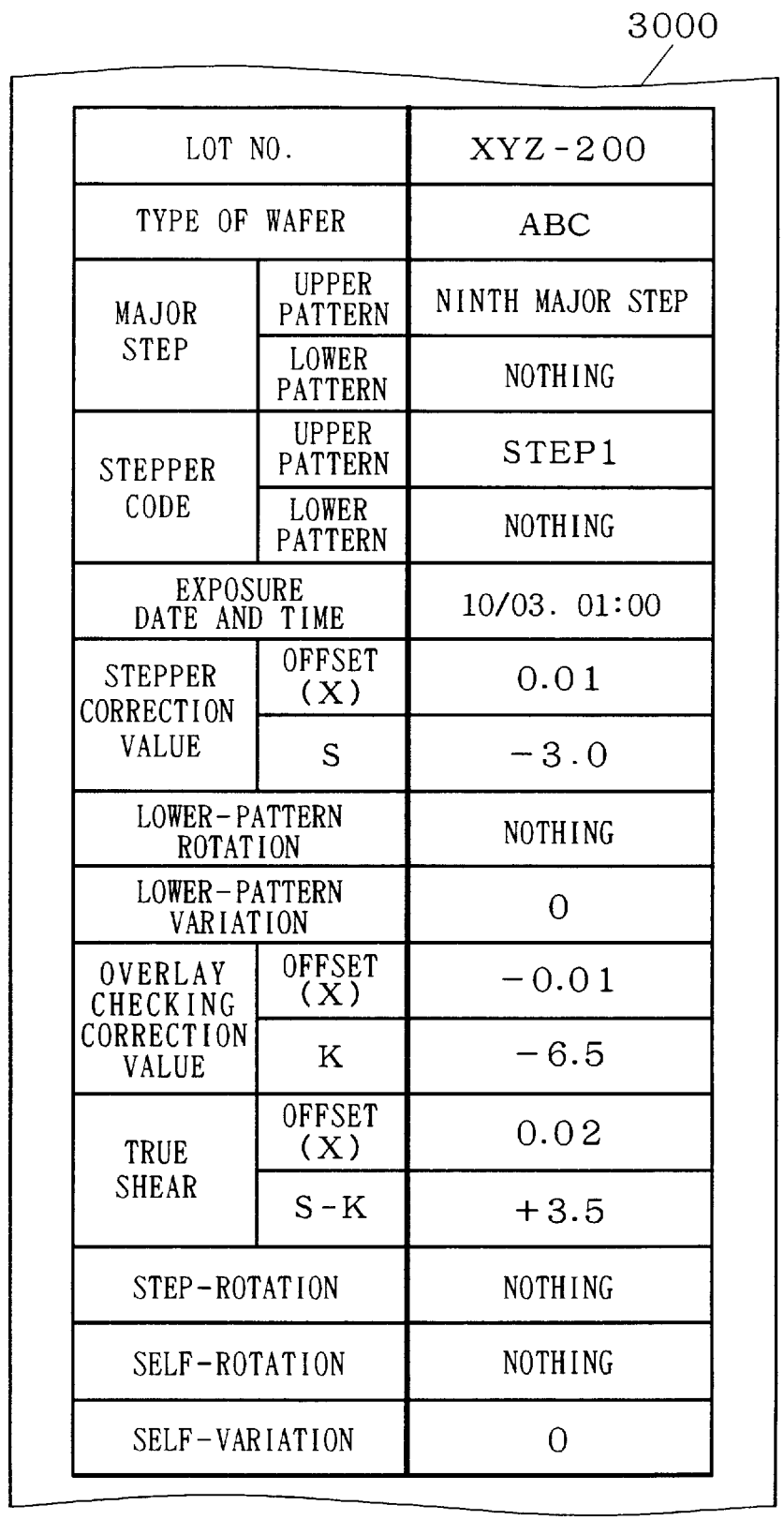

| LOT NO. | | XYZ-200 |
|---|---|---|
| TYPE OF WAFER | | ABC |
| MAJOR STEP | UPPER PATTERN | NINTH MAJOR STEP |
| | LOWER PATTERN | NOTHING |
| STEPPER CODE | UPPER PATTERN | STEP1 |
| | LOWER PATTERN | NOTHING |
| EXPOSURE DATE AND TIME | | 10/03. 01:00 |
| STEPPER CORRECTION VALUE | OFFSET (X) | 0.01 |
| | S | -3.0 |
| LOWER-PATTERN ROTATION | | NOTHING |
| LOWER-PATTERN VARIATION | | 0 |
| OVERLAY CHECKING CORRECTION VALUE | OFFSET (X) | -0.01 |
| | K | -6.5 |
| TRUE SHEAR | OFFSET (X) | 0.02 |
| | S-K | +3.5 |
| STEP-ROTATION | | NOTHING |
| SELF-ROTATION | | NOTHING |
| SELF-VARIATION | | 0 |

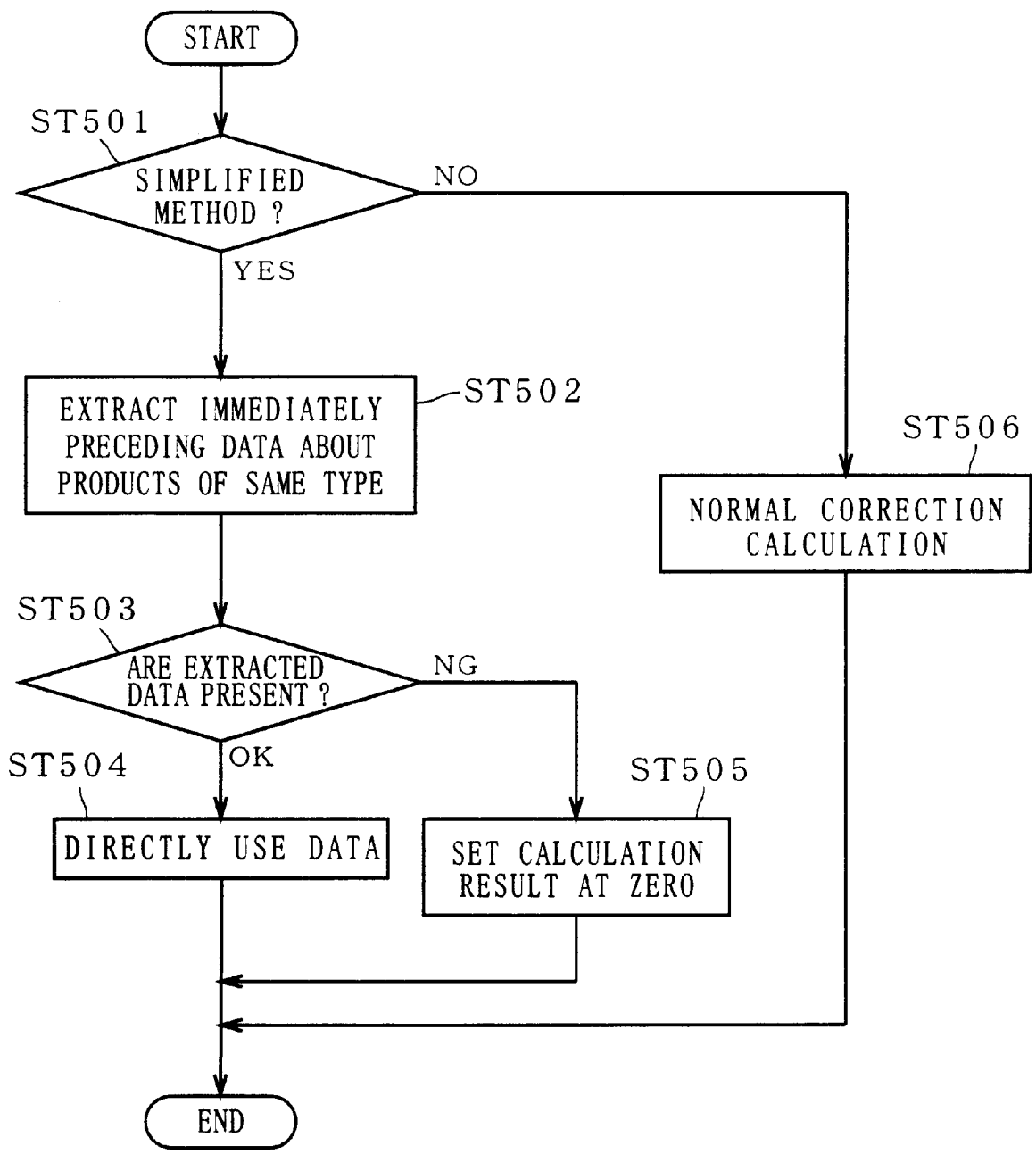
F I G. 5 1

< BACKGROUND ART >

< BACKGROUND ART >

FIG. 65
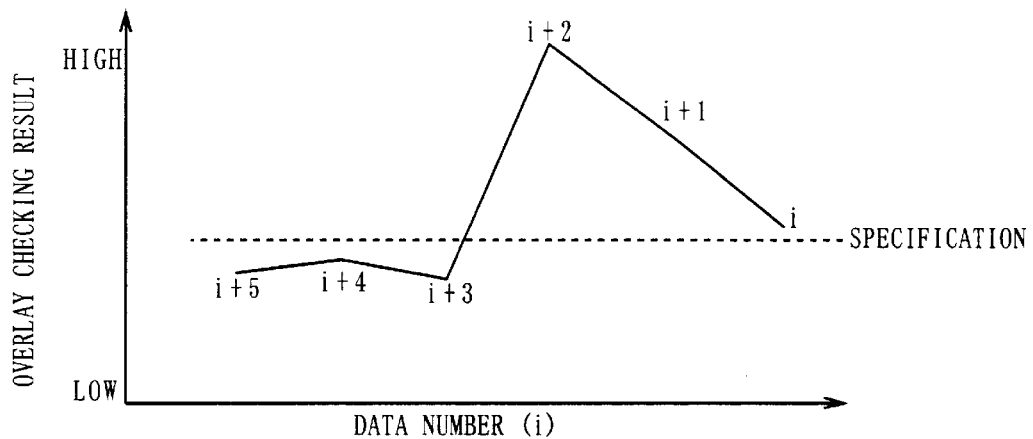
FIG. 66A
<BACKGROUND ART>
FIG. 66B
<BACKGROUND ART>
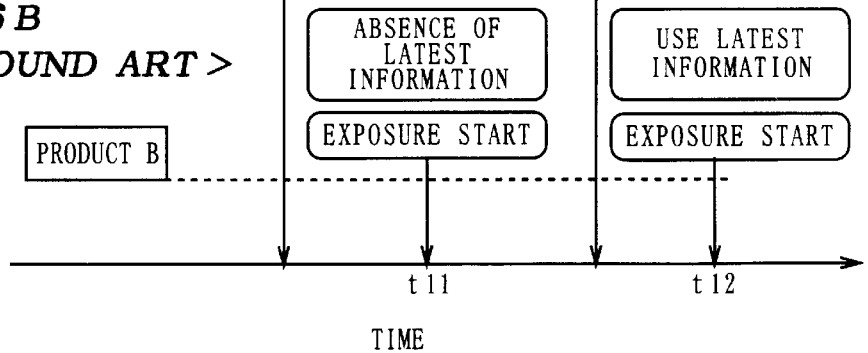

METHOD OF CORRECTING ALIGNMENT

BACKGROUND OF THE INVENTION

1. Field of the Invention

The present invention relates to an alignment correcting method for making a position alignment of patterns relative to each other in a horizontal direction when a plurality of patterns are formed in manufacturing a semiconductor device.

2. Description of the Background Art

Alignment will be discussed with reference to the conceptual view of FIG. 52. A semiconductor device comprises a plane 3a having patterns 1a and alignment marks 2a to 2d, and a plane 3b having patterns 1b and alignment marks 2e to 2h. The patterns 1a and 1b are formed on a wafer and made of a silicon compound, metal or the like. The alignment marks 2a to 2d are formed at the same time as the patterns 1a. The alignment marks 2e to 2h are formed at the same time as the patterns 1b. The term "alignment" is meant to define the operation of relatively aligning the position of the patterns 1a in the plane 3a for use in the next step with the position of the existing patterns 1b in the plane 3b, for example.

In a process for manufacturing a semiconductor device, several major steps are performed to manufacture the semiconductor device. The major step termed herein means a group of steps for forming one pattern (e.g., a film-formation step for forming a film on a wafer, a resist coating step for coating with a resist, an exposure step, a development step, and an etching step for patterning a film).

FIG. 53 is a conceptual sectional view of a semiconductor device. The semiconductor device of FIG. 53 is provided by performing seven major steps. Since one pattern is formed in each major step, the semiconductor device comprises seven patterns 301 to 307 formed finally in a stacked relation through seven major steps, respectively.

One of the steps which require alignment in one major step is an exposure step. In the exposure step, alignment is performed in practice to relatively align the positions of a reticle and a wafer with each other. Apparatuses for exposure and alignment include, for example, a step-type projection aligner (referred to hereinafter as a "stepper").

FIG. 54 is a block diagram of a production system 10 for manufacturing a semiconductor device. The production system 10 comprises a production control system body 6 for controlling the manufacture of a semiconductor device and connected to a stepper 4 as mentioned above, an overlay checking device 5, and other semiconductor manufacturing devices 7 through reference terminals 8. The production control system body 6 may be connected to a plurality of steppers 4 and to a plurality of semiconductor manufacturing devices 7 such as a sputtering device and an etching device.

The production system 10 uses the semiconductor manufacturing devices 7 including the steppers 4 to form, for example, a plurality of semiconductor integrated circuits 21 on a wafer 20. Lead frames, leads and packages are added to the semiconductor integrated circuits 21 in an assembly step for formation of semiconductor devices. The above-mentioned planes 3a and 3b of the semiconductor device correspond to, for example, layers of the semiconductor integrated circuits 21.

The stepper 4 connected to the production control system body 6 has an alignment function for exposing the same wafer to a plurality of shots of light. Unfortunately, there arises a shear between the patterns aligned by the stepper 4 despite of the alignment. The shear is due to various causes such as a mechanical error of the stepper itself and a reticle manufacturing error. The stepper 4 is given a correction value for eliminating the shear (referred to hereinafter as a "stepper correction value"). On the other hand, the overlay checking device 5 detects the shear to calculate a correction value for eliminating the shear (referred to hereinafter as an "overlay checking correction value"). The detection of the shear in the overlay checking device 5 is termed "overlay checking."

The production control system body 6 controls data on alignment (referred to hereinafter as "alignment data") which are provided from the stepper 4 and the overlay checking device 5. The alignment data include the overlay checking correction value, the stepper correction value, the type of a wafer (lot No., product No. and the like), the date and time when alignment was performed, the contents of processing, a production history and the like. The alignment data are stored in a database 6b.

An alignment correction unit 6a is one of the functions of the production control system body 6, and calculates the stepper correction value, for example, using the alignment data stored in the database 6b.

The stepper correction value calculated includes a stepper correction value for a wafer component, and a stepper correction value for a shot component. The stepper correction value is applied to the stepper 4. FIG. 55 conceptually illustrates a structure of the stepper 4. The wafer 20 to be exposed is placed on a wafer stage WST. A reticle 30 formed with a pattern image to be drawn on the wafer 20 is provided on a reticle stage RST. An illumination system ILS directs a light beam for exposure onto the reticle 20 on the reticle stage RST. The light beam for exposure passed through the reticle 30 is refracted by a lens system PL to form an image 34 on the wafer 20. The stepper 4 is adapted to move the wafer stage WST in accordance with a value set by the stepper correction value for the wafer component to move the wafer 20 on the wafer stage WST. The stepper correction value for the wafer component includes information about offsets X and Y (base line), scalings X and Y, X-Y orthogonality, wafer rotation and the like. The stepper 4 is also adapted to change the image 34 directed from the illumination system ILS through the reticle 30 and the lens system PL onto the wafer 20 in accordance with the stepper correction value for the shot component. The stepper correction value for the shot component includes information about shot rotation, magnification and the like. As the reticle stage RST rotates about a central axis 32 in accordance with the setting of the shot rotation, the image 34 is rotated. The degree of magnification of the image 34 is changed depending on the difference in the degree to which the lens system PL and the like refract the light beam for exposure in accordance with the setting of the magnification.

The wafer processing controlled by the production control system body 6 will be discussed below. The alignment of the pattern 304 of FIG. 53 will be taken as an example. The control of the production control system body 6 is performed according to the flowchart of FIG. 56. First, the production control system body 6 transports a wafer 20 to be processed to the stepper 4. When the wafer 20 to be processed reaches the stepper 4, the alignment correction unit 6a calculates the stepper correction value (Step S901 of FIG. 56). The production control system body 6 sets the stepper correction value obtained by calculation for the stepper 4 reached by the wafer 20 to be processed (Step S902). The stepper 4 performs alignment (Step S903). After the completion of the alignment, the production control system body 6 registers the stepper correction value for the wafer to be processed in the database 6b to control the stepper correction value. After the processing in the stepper 4, the production control system body 6 transports the wafer 20 from the stepper 4 to the overlay checking device 5 (Step S904). The overlay checking device 5 detects a shear between the pattern 304 and the pattern 303 immediately therebelow with the positions of the alignment marks (Step S905). Further, the device 5 calculates the overlay checking correction value for elimination of the detected shear (Step S906). Subsequently, the production control system body 6 collects overlay checking correction values from the overlay checking device 5 (Step S907). The system body 6 stores the collected overlay checking correction values in the database 6b to control them (Step S908). The production control system body 6 transports the wafer 20 to be processed to the semiconductor manufacturing device 7, as needed, where sputtering, etching and the like are performed.

Next, a conventional alignment correcting method for calculating the stepper correction value will be discussed with reference to FIGS. 57 and 58. It is assumed that the stepper correction value set in Step S902 is +1 and the overlay checking correction value (which herein corresponds to the shear) detected in Step S906 is −2 in this alignment process performed in a major step. Therefore, as shown in FIG. 58, the setting of the stepper correction value at +3 in the next alignment in the same major step is expected to provide the overlay checking correction value which is zero. The calculated difference between the stepper correction value and the overlay checking correction value is referred to as a "true shear" which is expressed as $$\text{true shear} = \text{stepper correction value} - \text{overlay checking correction value} \quad (1)$$

The shorter a time difference between the present alignment and the next alignment, the smaller a change in the true shear. However, as the time difference increases, the true shear also increases. Then, the production control system body 6 controls a trend of the true shear in the same major step as shown in FIG. 59, and the alignment correction unit 6a calculates a mean value of true shears at P1 to P3 in the same major step as the stepper correction value to be set at tx in the next major step.

As above described, the conventional alignment correcting method corrects the stepper correction value for the wafer component to align a given pattern with its immediately below pattern, like the patterns 304 and 303.

An alignment correcting device for performing the above-mentioned alignment correcting method will be discussed below. FIG. 60 is a graph for illustrating an example of the conventional concept of the calculation for the stepper correction value for the wafer component. The graph of FIG. 60 shows the relationship between a data number and the true shear. Data with each data number of the graph are those for each group (lot). The time having elapsed since the alignment increases in ascending order of the numerical value of the data number i. In other words, the alignment with a higher data number is earlier than the alignment with a lower data number. A mean value of the data with data numbers 1 to 4 shown in FIG. 60 is simply calculated to provide a predicted stepper correction value. The predicted stepper correction value is calculated in accordance with the procedure shown in the flowchart of FIG. 61. The procedure of FIG. 61 is to perform the processing in Step S901 of FIG. 56. In Step 201, information of the past stored in the database 6b is searched for suitable data which are regarded as having been subjected to the stepper processing on the same conditions. Then, in Step 202, the stepper correction value for the wafer component is calculated on the assumption that the true shear equals the predicted stepper correction value. For instance, the calculation in Step S202 determines a mean value of true shears of the past to use the mean value as the stepper correction value for the wafer component. A term which calculates the mean value in an equation is referred to as an "average term." Likewise, the calculation in Step S203 determines a mean value of true shears of the past for each plane of the semiconductor device to use the mean value as the stepper correction value for the shot component for each plane.

FIG. 62 is a block diagram of a conventional alignment correcting device. An alignment data control unit 60 produces alignment data from a result of the overlay checking performed in the overlay checking device 5 to store the alignment data in the database 6b. The alignment correction unit 6a uses the alignment data stored in the database 6b to calculate the predicted stepper correction value. The alignment correction unit 6a outputs the calculated predicted stepper correction value to the stepper 4. The operation of portions of the alignment correction unit 6a for calculation of the predicted stepper correction value will be described below. An alignment data selection portion 61 selects data for use in calculation of the predicted stepper correction value, for example, by using tree information. The alignment data selection portion 61 outputs data associated with the wafer component among the selected data to a wafer component average term calculation portion 62, and outputs data associated with the shot component to a shot component average term calculation portion 65. The wafer component average term calculation portion 62 executes a calculation expressed by Equation (15) to be described later, that is, a calculation for determining a mean value of true shears for the predetermined number of groups (the predetermined number of lots). The wafer component average term calculation portion 62 outputs the calculation result as the predicted stepper correction value to the stepper 4. Likewise, the shot component average term calculation portion 65 executes the calculation expressed by Equation (15), that is, the calculation for determining a mean value of true shears for the predetermined number of lots. The shot component average term calculation portion 65 outputs the calculation result as the predicted stepper correction value to the stepper 4.

With the size reduction of semiconductor devices, the tolerance of the shear between patterns to be subjected to the alignment correction has become closer year after year. Under such situations, the constant satisfaction of design specifications for the tolerance of the shear between the patterns requires the increase in performance for the alignment correction as well as the increase in other performance of the semiconductor manufacturing device, and yet the increase in levels of function of the alignment correcting method. FIGS. 63 through 65 are graphs for illustrating the influences of abnormal data upon the shear between the patterns. For example, data about a plurality of lots processed by the same stepper 4 are shown in FIGS. 63 through 65, with respective data numbers corresponding to the processing sequence assigned thereto. The data about a lot with a data number i=2 are abnormal data resulting from, for example, erroneous measurement during the overlay checking. The abnormal data do not indicate a measurement value of a normal processing result but contain a value different from the measurement result due to misoperation and the like. The presence of the abnormal data with the data number i+2 causes an error in the stepper correction to generate consecutive out-of-specification data (with data numbers i and i+1) in subsequent processing. Specifically, since the true shear of the data with the data number i+2 shown in FIG. 63 is estimated to be greater than the actual true shear, a stepper set value for processing the lot associated with the data with the data number i+1 as shown in FIG. 64 is set at a high value. This causes the overlay checking result with the data number i+1 to be out of specifications (FIG. 65). Thus, the presence of the data with the data number i+2 makes the stepper correction value greater than necessary in the subsequent calculation of the predicted stepper correction value, resulting in a stronger likelihood that consecutive out-of-specification are generated.

In some cases, one of the factors which increase the likelihood of the out-of-specification data is that the overlay checking result immediately preceding the processing is not reflected in the calculation of the predicted stepper correction value. FIGS. 66A and 66B are a timing chart showing one situation of the conventional alignment correction. For instance, when the processing of a product B follows the processing of a product A, the processing of the product B at time t12 presents no problem. However, the product B is sometimes processed at time t11 before the completion of the overlay checking of the product A. In such a case, the overlay checking result of the product A which is the latest information is absent in the calculation of the predicted stepper correction value of the product B. For this reason, the alignment precision of the product B is not sufficiently ameliorated. If the product A provides out-of-specification data, the situation becomes worse, increasing the likelihood that the data about the subsequent product B are also out of specifications.

The background art alignment correcting method, semiconductor device manufacturing method, and alignment correcting device as above described have a drawback in that as the tolerance of the shear between patterns becomes closer, the alignment correction fails to bring the shear between the patterns within tolerance, making it difficult to satisfy the design specifications.

Further, abnormal data, if generated, are also subjected to the alignment correction to cause an error in the alignment correction. Then, the alignment correction increases the shear between patterns to make it difficult to satisfy the design specifications.

Moreover, alignment calibration which influences the calculation for the correction causes an error in the alignment correction to result in the shear between the patterns which is out of the tolerance of the design specifications.

Furthermore, the increases in complexity of semiconductor device structures and in variety of product types developed on the market cause the increases in type and amount of data required for alignment control. Accordingly, the storage of data for alignment control requires excessive handling.

SUMMARY OF THE INVENTION

A first aspect of the present invention is intended for a method of correcting alignment using true shears for a plurality of groups of products regarded as being subjected to stepper processing on the same condition. According to the present invention, the method comprises the steps of: calculating a mean value of the true shears for the plurality of groups of products; calculating a difference in true shear between at least two groups of products which are manufactured consecutively among the plurality of groups of products; and adding a value proportional to the difference in true shear to the mean value to calculate a predicted stepper correction value.

Preferably, according to a second aspect of the present invention, in the method of the first aspect, the step of calculating the stepper correction value uses a proportionality constant which minimizes a variation in true shear to calculate the value proportional to the difference in true shear.

Preferably, according to a third aspect of the present invention, in the method of the second aspect, the step of calculating the stepper correction value comprises the step of detecting the proportionality constant in a range from −1 to 1.

Preferably, according to a fourth aspect of the present invention, in the method of the first aspect, the step of calculating the mean value comprises the step of determining a mean value of true shears for not less than three groups of products.

A fifth aspect of the present invention is intended for a method of correcting alignment using true shears for a plurality of groups of products regarded as being subjected to stepper processing on the same condition. According to the present invention, the method comprises the steps of: detecting whether or not the true shears fall within a predetermined range; and calculating a predicted stepper correction value without using a true shear which is outside the predetermined range.

A sixth aspect of the present invention is intended for a method of correcting alignment using true shears for a plurality of groups of products regarded as being subjected to stepper processing on the same condition. According to the present invention, the method comprises the steps of: extracting a group of products processed immediately previous to a product for which a predicted stepper correction value is to be calculated; judging whether or not a measurement has been made on true shears for the group of products; and providing an instruction for inhibiting exposure using calculation of the predicted stepper correction value when the measurement has not yet been made.

According to a seventh aspect of the present invention, a method of correcting alignment comprises the steps of: judging whether or not stepper processing is performed on products of the same type; extracting a true shear for a product of the same type which is processed immediately previously; and determining a predicted stepper correction value, the predicted stepper correction value being the extracted true shear when the true shear is extracted in the extracting step, the predicted stepper correction value being a predetermined value when the true shear is not extracted in the extracting step.

According to an eight aspect of the present invention, a method of manufacturing a semiconductor device comprises the step of positioning patterns using a method of correcting alignment as recited in any one of the first to seventh aspects.

A ninth aspect of the present invention is intended for a device for correcting alignment using true shears for a plurality of groups of products regarded as being subjected to stepper processing on the same condition. According to the present invention, the device comprises: an average term calculation portion for calculating a mean value of the true shears for the plurality of groups of products; a variable term calculation portion for calculating a difference in true shear between at least two groups of products which are manufactured consecutively among the plurality of groups of products; and an addition portion for adding a value proportional to the difference in true shear to the mean value to calculate a predicted stepper correction value.

A tenth aspect of the present invention is intended for a semiconductor device manufactured using a method of correcting alignment as recited in any one of the first to seventh aspects or a device for correcting alignment as recited in the ninth aspect.

As described hereinabove, the method of correcting alignment in accordance with the first aspect of the present invention, wherein the value proportional to the true shear difference between the at least two groups of products manufactured consecutively is reflected in the predicted stepper correction value, increases an alignment correction precision.

In the method of correcting alignment in accordance with the second aspect of the present invention, the proportionality constant may be conditioned to greatly increase the alignment correction precision.

In the method of correcting alignment in accordance with the third aspect of the present invention, the limitation of the range within which the proportionality constant is detected eliminates the handling of calculation.

In the method of correcting alignment in accordance with the fourth aspect of the present invention, the number of groups for which the mean value is calculated is conditioned to greatly increase the alignment correction precision.

In the method of correcting alignment in accordance with the fifth aspect of the present invention, the elimination of abnormal data increases the alignment correction precision.

The method of correcting alignment in accordance with the sixth aspect of the present invention, wherein the immediately preceding true shear is constantly reflected in the calculation of the predicted stepper correction value, increases the alignment correction precision.

The method of correcting alignment in accordance with the seventh aspect of the present invention directly uses the true shear for the product of the same type, thereby reducing the number of data to be stored.

The method of manufacturing the semiconductor device in accordance with the eighth aspect of the present invention or the semiconductor device in accordance with the tenth aspect thereof may increase a pattern positioning precision with the increase in the alignment correction precision.

The device for correcting alignment in accordance with the ninth aspect of the present invention, wherein the value proportional to the true shear difference between the at least two groups of products manufactured consecutively is reflected in the predicted stepper correction value, increases the alignment correction precision.

It is therefore an object of the present invention to improve an alignment precision over a conventional alignment precision in an alignment correcting method, a semiconductor device manufacturing method, and an alignment correcting device.

It is another object of the present invention to eliminate the influence of abnormal data, if generated, upon alignment correction to prevent a shear between patterns from increasing due to the abnormal data and being out of tolerance.

It is still another object of the present invention to simplify the storage of alignment conditions to reduce the time required to store data in an alignment correcting method, a semiconductor device manufacturing method, and an alignment correcting device.

These and other objects, features, aspects and advantages of the present invention will become more apparent from the following detailed description of the present invention when taken in conjunction with the accompanying drawings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 10 and 11 show examples of contents of a database displayed on a reference terminal for illustrating the background of the present invention;

FIGS. 17 and 18 show examples of contents of the database displayed on the reference terminal for illustrating the background of the present invention;

FIG. 51 is a flowchart showing the procedure of the simplified method of correcting alignment;

FIG. 65 is a graph illustrating a relationship between the abnormal data and the overlay checking result; and FIGS. 66A and 66B are a timing chart showing a situation of conventional alignment correction.

DESCRIPTION OF THE PREFERRED EMBODIMENTS

Figure 1:
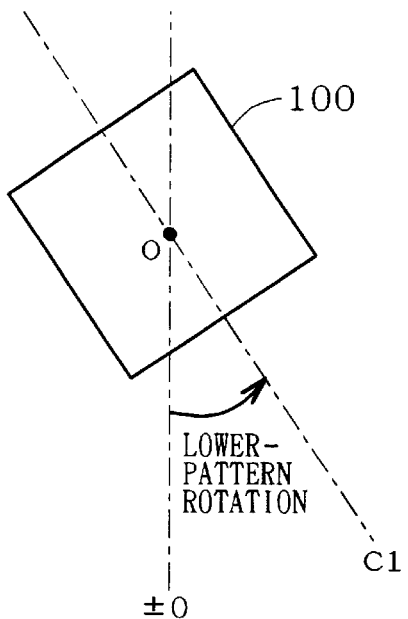
FIG. 1 shows an example of a lower pattern.

Referring now to the drawings, wherein like reference numerals designate identical or corresponding parts throughout the several views, and more particularly to FIGS. 1–51 thereof, there are illustrated exemplary embodiments of the present invention.

(Background of the Invention)

The present invention may be combined with two inventions to be described later to further increase the precision of alignment correction or to further enhancing the general versatility of the alignment correction. Description will be given on sections of methods of correcting alignment disclosed in Japanese Patent Application No. 9-261580 (1997) and in Japanese Patent Application No. 9-151 (1997) which are closely relevant to the present invention.

(Japanese Patent Application No. 9-261580)

A method of correcting alignment disclosed in Japanese Patent Application No. 9-261580 will be discussed with reference to a production system 10 shown in FIG. 54. The production system 10 shown in FIG. 54 includes a stepper 4 for setting a stepper correction value for determining the position of a pattern. The stepper 4 for use in this method of correcting alignment is similar in construction to the conventional stepper, for example, shown in FIG. 55. However, the method of correcting alignment performed by a production control system body 6 which is disclosed in Japanese Patent Application No. 9-261580 differs from the conventional method.

The alignment of an upper pattern with a lower pattern will be discussed below. FIG. 1 shows a lower pattern 100. An axis of ±0 is the central axis of the lower pattern at the time when a stepper correction value for shot rotation is zero, and is hereafter referred to as a reference axis. A lower-pattern rotation is the amount of movement of the lower pattern from the position of the reference axis ±0 to the position of the central axis of the lower pattern, and also indicates the position of the central axis C1 of the lower pattern.

For alignment of the upper pattern with the pattern 100, the stepper correction value may be set at the lower-pattern rotation in the stepper 4 if an error is neglected. This is expressed as $$\text{stepper correction value} = \text{lower-pattern rotation} \quad (2)$$

Figure 2:
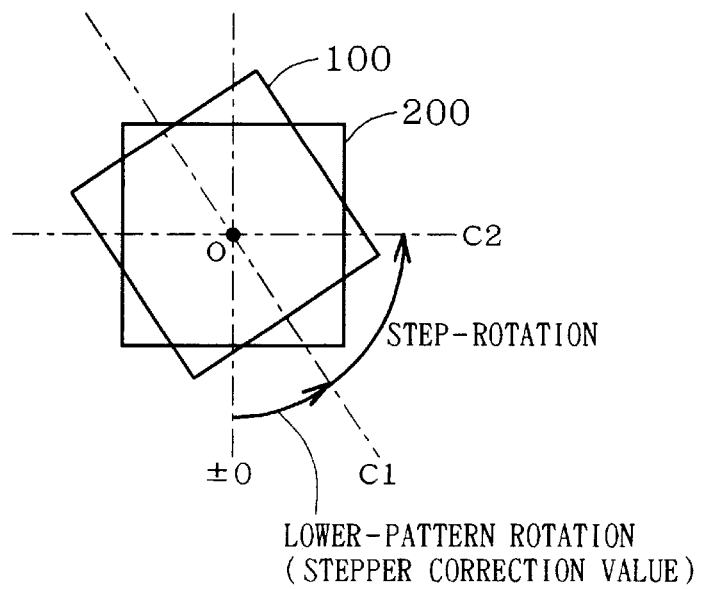
FIG. 2 shows upper and lower patterns after the alignment of an upper pattern.
Figure 3:
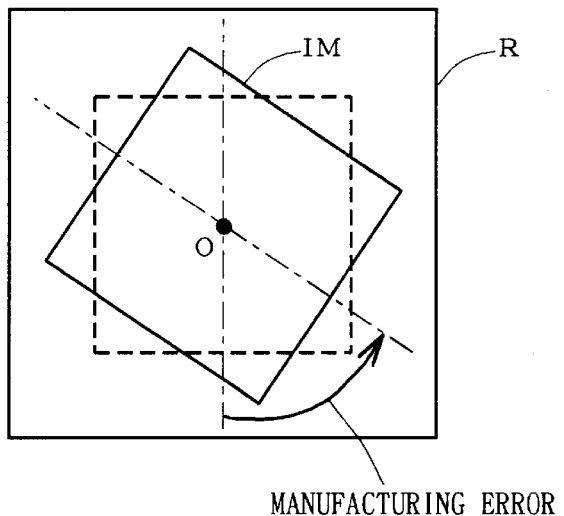
FIG. 3 illustrates a step-rotation.

After the alignment of an upper pattern 200 by setting the stepper correction value given by Equation (2) in the stepper 4, there arises a shear between the central axis C1 of the lower pattern 100 and a central axis C2 of the upper pattern 200 as shown in FIG. 2. In other words, the pattern 200 travels from the position of the central axis C1 which is set using the stepper correction value. The amount of rotation from the position set using a stepper set value is referred to as a step-rotation. The step-rotation results from various errors such as a reticle manufacturing error, a mechanical error and a measurement error. These errors, which are connected relative to one another, may be grouped together into one as the step-rotation. A main cause of the step-rotation is the reticle manufacturing error. FIG. 3 shows the reticle manufacturing error. The manufacturing error of a reticle R is a difference between the normal position of a pattern image indicated by the broken lines and the actual position of the pattern image IM.

In order to prevent the shear between the patterns 100 and 200, it is necessary to set the stepper correction value at a value obtained by subtracting the step-rotation from the lower-pattern rotation. In consideration for the step-rotation, Equation (2) is changed into $$\text{stepper correction value} = \text{lower-pattern rotation} - \text{step-rotation} \quad (3)$$

Figure 4:
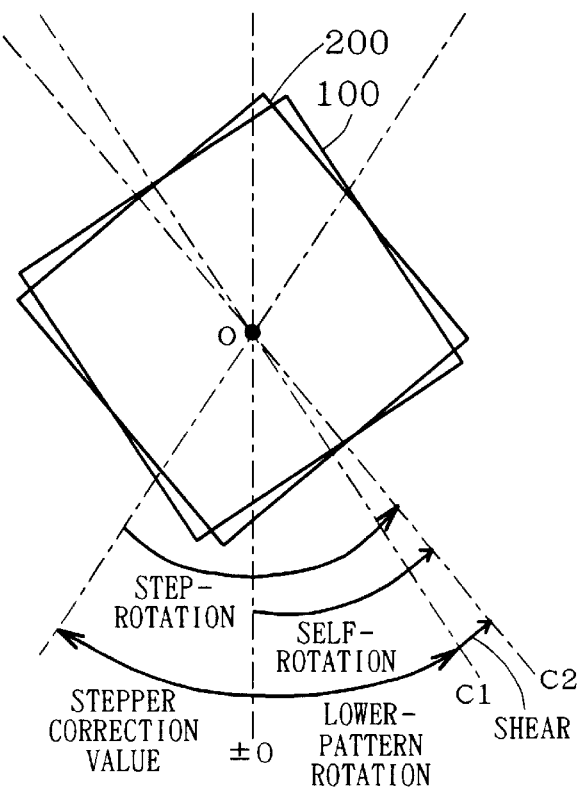
FIG. 4 illustrates a self-rotation.

After the alignment of the upper pattern 200 by setting the stepper correction value given by Equation (3) in the stepper 4, there still arises a shear between the central axis C1 of the lower pattern 100 and the central axis C2 of the upper pattern 200, as shown in FIG. 4. It will be, however, understood from a comparison between FIGS. 2 and 4 that the shear between the patterns 100 and 200 is reduced by the addition of the step-rotation.

Since the mechanical and measurement errors tend to vary at every moment, the step-rotation also varies at every moment. Therefore, in consideration of a trend of the step-rotation as a function of time, Equation (3) is changed into $$\text{stepper correction value} = \text{lower-pattern rotation} - f(\text{step-rotation}) \quad (4)$$

where f is a trend function, such as an arithmetic average (e.g., f=(immediately preceding step-rotation+two-cycle previous step-rotation)/2), a weighted average (e.g., f=immediately preceding step-rotation×2/3+two-cycle previous step-rotation/3), exponential smoothing (e.g., f=immediately preceding step-rotation×0.97+two-cycle previous step-rotation×0.03).

An alignment correction unit 6a calculates the stepper correction value on the basis of the foregoing factors. The lower-pattern rotation and the step-rotation are obtained in a manner described below. The lower-pattern rotation, which cannot be directly measured in some cases, is obtained by calculation using Equation (6) to be described later. First, a self-rotation is defined. For example, referring to FIG. 4, the self-rotation of the upper pattern 200 is the sum of the lower-pattern rotation of the lower pattern 100 and the shear (or an overlay checking correction value) between the patterns 100 and 200 detected by an overlay checking device 5, i.e., the amount of rotation (movement) from the position of the reference axis ±0 obtained by calculation. This is expressed as $$\text{self-rotation} = \text{lower-pattern rotation} + \text{overlay checking correction value} \quad (5)$$

Figure 5:
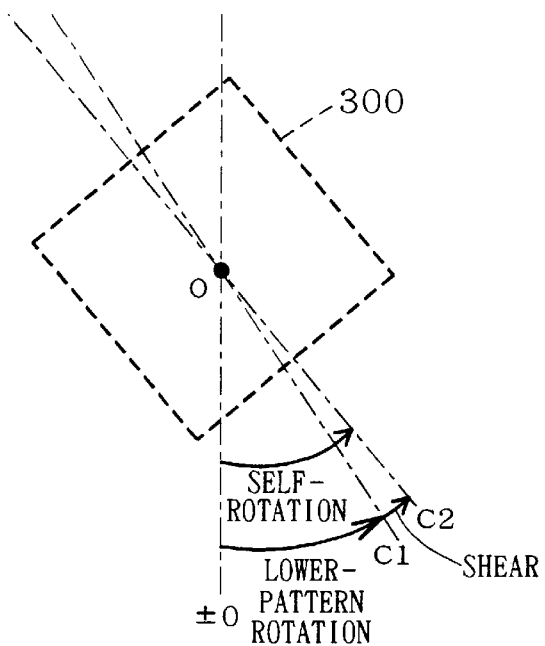
FIG. 5 illustrates a lower-pattern rotation.

Further, for the alignment of a pattern 300 of FIG. 5, which serves as an upper pattern, with the pattern 200 serving as a lower pattern, the self-rotation of the pattern 200 is the lower-pattern rotation of the pattern 300 itself. In other words, the self-rotation of the pattern 200 below the pattern 300 is the sum of the self-rotation of the pattern 100 below the pattern 200 and the shear (overlay checking correction value) between the patterns 100 and 200.

Referring to FIG. 4, the step-rotation of the pattern 200 is obtained by vector calculation using the lower-pattern rotation, the overlay checking correction value and the stepper correction value. This is expressed as $$\text{step-rotation} = \text{lower-pattern rotation} - \text{stepper correction value} + \text{overlay checking correction value} \quad (6)$$

Figure 6:
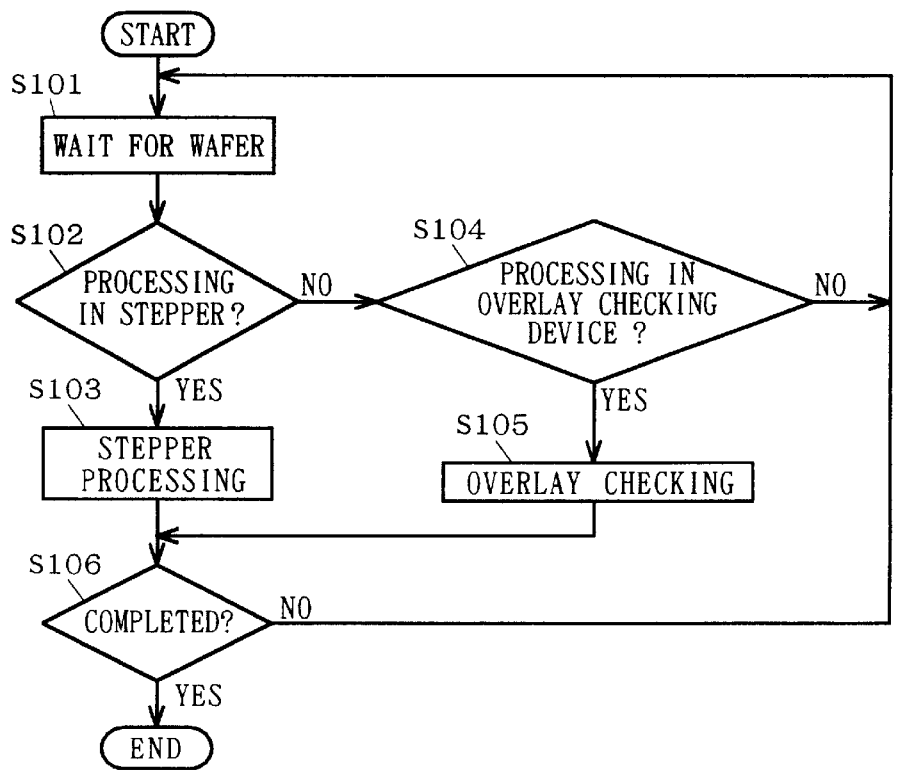
FIGS. 6 through 9 are flowcharts showing a method of correcting alignment in accordance with one form of the background of the present invention.
Figure 7:
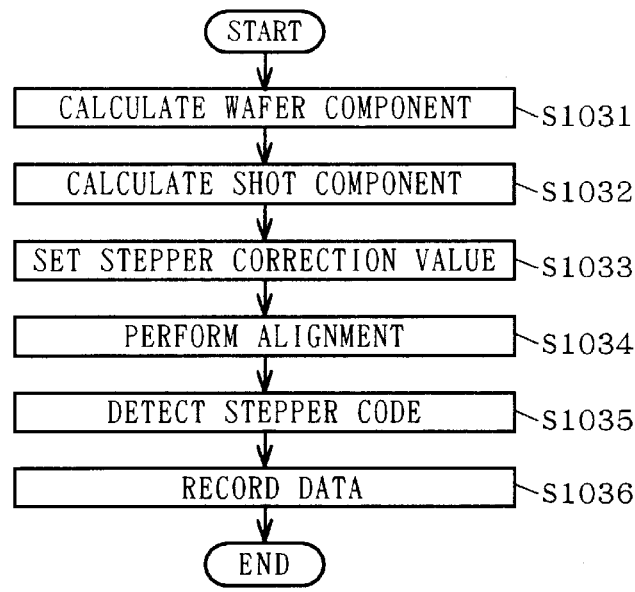
Figure 8:
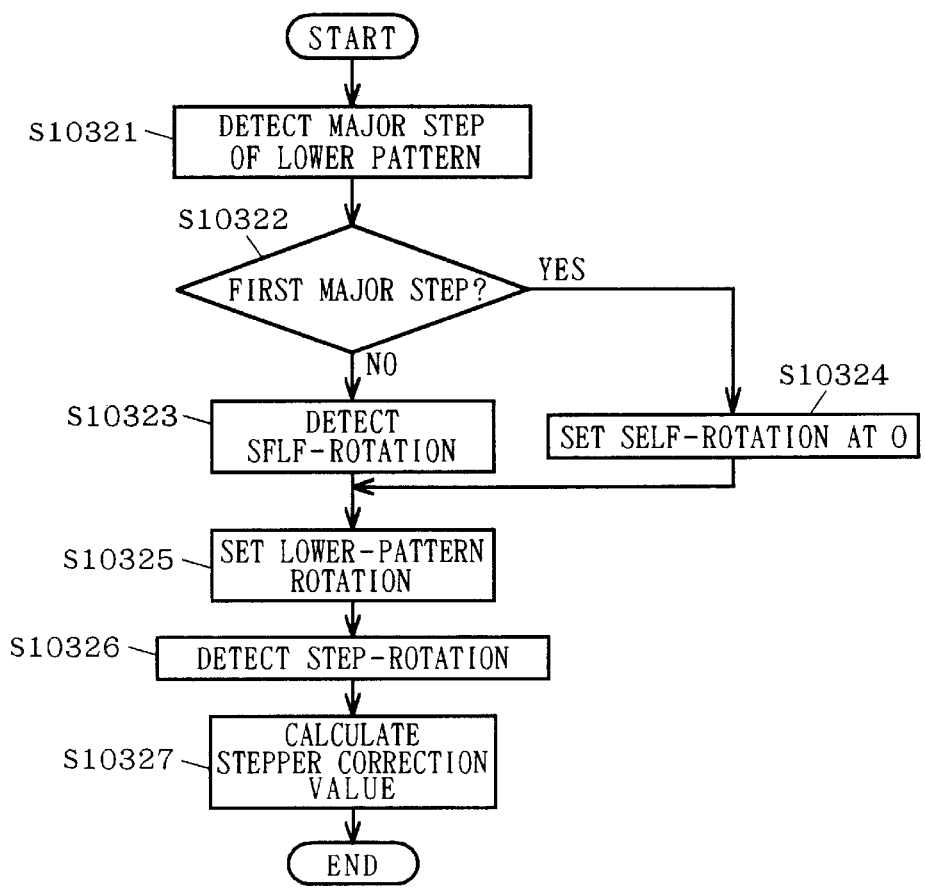
Figure 9:
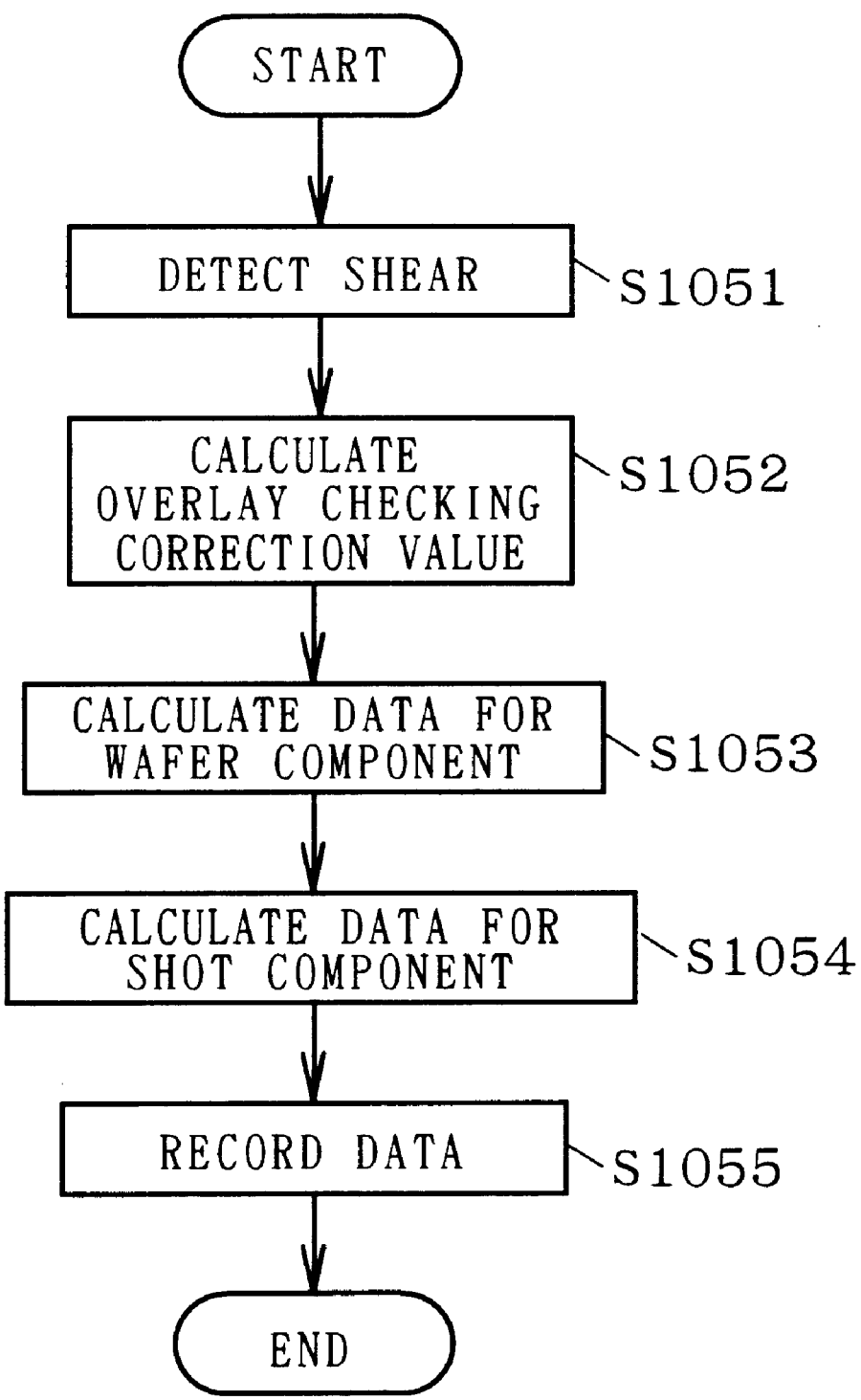
Figure 11:
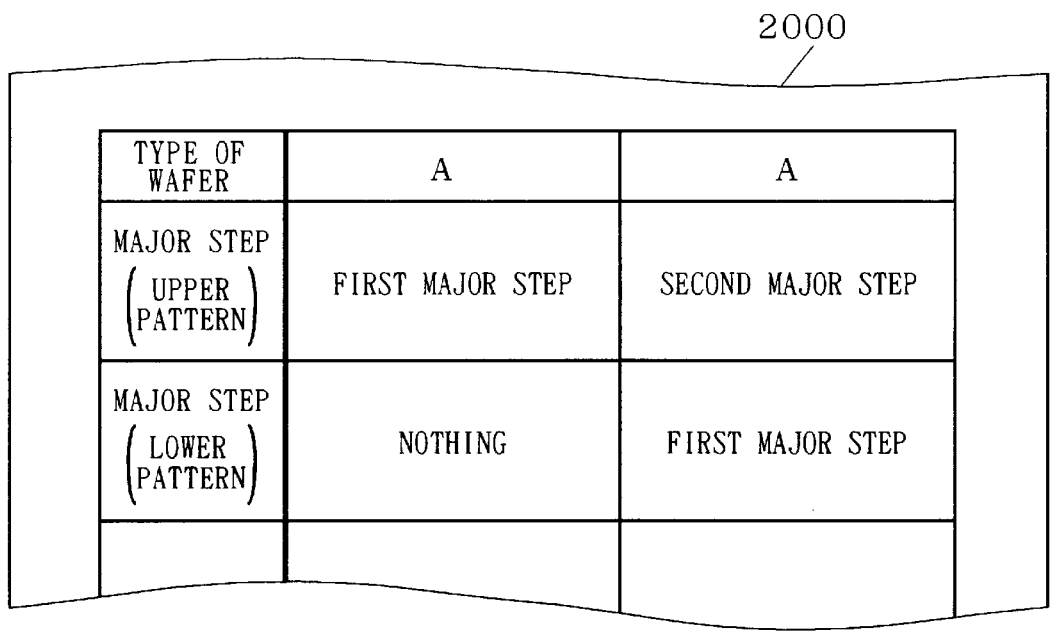

With reference to FIGS. 6 through 11, description is given on how the stepper correction value is calculated in the process of wafer processing. FIG. 6 is a flowchart showing a main operation of the production system 10 according to the method of correcting alignment disclosed in Japanese Patent Application No. 9-261580. FIGS. 7 through 9 are flowcharts for detailed description of Step S103 of FIG. 6, Step S1032 of FIG. 7, and Step S105 of FIG. 6, respectively. The contents of a database 6b may be referred to with a reference terminal 8. FIGS. 10 and 11 show examples of the contents of the database 6b displayed on the reference terminal 8. History data associated with alignment and data about major steps of the lower pattern are displayed on screens 1000 and 2000 of the reference terminal 8. The production control system body 6 stores the history data associated with alignment shown in FIG. 10 in the database 6b to control the history data. Further, the production control system body 6 stores data about major steps of the lower pattern corresponding to major steps of the upper pattern of FIG. 11 in the database 6b to control the data. This corresponding relationship is predetermined by an operator and the like.

The procedure of wafer processing will be described below, where the production control system body 6 processes a wafer. The stepper 4 and the overlay checking device 5 are waiting for the arrival of the wafer to be processed (Step S101 of FIG. 6). The production control system body 6 transports the wafer to an available stepper 4. When the wafer reaches the stepper 4 (Step S102), the wafer is processed by the stepper 4 (Step S103). The processing of Step S103 is shown in FIG. 7. The production control system body 6 calculates the stepper correction value for a wafer component among the stepper correction values. The calculation is carried out in the same manner as the background art method, so the description thereof will be omitted (Step S1031).

Next, the production control system body 6 calculates the stepper correction value for a shot component among the stepper correction values (Step S1032). The processing of Step S1032 is shown in FIG. 8. The production control system body 6 initially detects a major step of the lower pattern (Step S10321). The production control system body 6 may search the corresponding relationships shown in FIG. 11 for the major step of the lower pattern based on the type of wafer and the major step of the upper pattern. Since the major step of the upper pattern is herein a first major step, no major step of the lower pattern is found as the result of the search.

Next, the production control system body 6 judges whether or not the major step of the upper pattern is the first major step (Step S10322). The production control system body 6 detects the self-rotation in the major step of the lower pattern when the major step of the upper pattern is not the first major step (Step S10323). On the other hand, when the major step of the upper pattern is the first major step, the production control system body 6 determines that the self-rotation is zero (Step S10324). Subsequently, the production control system body 6 sets the lower-pattern rotation at the self-rotation (Step S10325). The production control system body 6 detects the step-rotation of the past. Specifically, the production control system body 6 searches the history data shown in FIG. 10 for the step-rotation of the past based on the type of wafer, the major step of the upper pattern, the major step of the lower pattern, a specific code of the stepper device used for the alignment of the upper pattern (referred to hereinafter as a "stepper code"), a stepper code used for the alignment of the lower pattern, a predetermined number of latest exposure dates and times which fall within a predetermined range from the present time (Step S10326).

Subsequently, the production control system body 6 calculates the stepper correction value (herein, for shot rotation: S) from Equation (4). When the calculation is impossible because of the absence of the history data, the production control system body 6 calculates the stepper correction value of zero (Step S10327). The production control system body 6 sets the stepper correction values for the wafer component and for the shot component (Step S1033 of FIG. 7). Next, the stepper 4 performs alignment (Step S1034). The production control system body 6 detects the stepper code used in the major step of the lower pattern. The stepper code for the lower pattern is obtained by searching the history data of FIG. 10 (Step S1035). The data related to the above steps S1031 to S1035, i.e., the lot No., the type of wafer, the major steps of the upper and lower patterns, the stepper codes for the upper and lower patterns, the exposure date and time, the stepper correction value and the lower-pattern rotation are recorded in the database 6b and controlled (Step S1036).

After the processing in Step S103, the production control system body 6 shifts to Step S105 through Steps S101, S102 and S104. Specifically, after the processing in Step S103, the production control system body 6 transports the wafer to an available overlay checking device 5. When the wafer reaches the overlay checking device 5 (Step S104), the wafer is processed by the overlay checking device 5 (Step S105). The processing in Step S105 is shown in FIG. 9. The overlay checking device 5 detects a shear between the upper and lower patterns (Step S1051). The device 5 uses the shear to calculate the overlay checking correction values for the wafer component such as offset and for the shot component such as shot rotation (Step S1052). The overlay checking correction value for the shot rotation is designated by the reference character K. The production control system body 6 receives the overlay checking correction value for the wafer component and then calculates data required for calculating the stepper correction value for the wafer component to be set in the next alignment from the overlay checking correction value. This calculation is performed in the conventional manner, so the description thereof will be herein omitted (Step S1053).

Further, the production control system body 6 receives the overlay checking correction value for the shot component and then calculates data required for calculating the stepper correction value for the shot component (S herein) to be set in the next alignment, i.e., the overlay checking correction value, a true shear, the step-rotation and the self-rotation, from the overlay checking correction value. The true shear, the step-rotation and the self-rotation are obtained using Equations (1), (6) and (5), respectively (Step S1054).

The data related to the above steps S1051 to S1055, i.e., the overlay checking correction value, the true shear, the step-rotation and the self-rotation are recorded in the database 6b in addition to those recorded in Step S1036 and are controlled (Step S1055).

Steps S103 and S105 are performed also in the second and subsequent major steps to be performed on the wafer. The execution of all of the major steps for the wafer (Step S106) completes the processing for the wafer.

Thus, the production control system body 6 controls the lower patterns corresponding to a plurality of patterns (the upper patterns of FIG. 11) in a semiconductor device. The production control system body 6 also controls the self-rotation in Step S105. Further, the production control system body 6 generates a value including the self-rotation of the lower pattern corresponding to the upper pattern as the stepper correction value for determining the position of the upper pattern in Step S103.

The production control system body 6 controls upper and lower patterns which must to be within specifications and the self-rotation of the lower pattern, thereby to generate the value including the self-rotation of the lower pattern (lower-pattern rotation) as the stepper correction value for determining the position of the upper pattern. This prevents any out-of-specification shear between the lower and upper patterns. Assuming that the reference position of the lower-pattern rotation is the position of the pattern at the time when the stepper correction value is zero, the stepper correction value may be calculated from the simple equation such as Equation (2) if the step-rotation is neglected. The use of the shear detected by the overlay checking device allows the determination of the self-rotation by calculation. When a pattern has no lower pattern, for example, in the first major step, it is necessary to set the self-rotation of the pattern having no lower pattern at a predetermined value (e.g., zero).

The description on the shot rotation among the shot components has been given hereinabove. Next, a magnification will be discussed below among the shot components. The setting of the stepper correction value for the magnification among the shot components is similar to the setting of the stepper correction value for the shot rotation among the shot components. Specifically, the setting of the stepper correction value for the magnification among the shot components uses a reference frame, a lower-pattern magnification, a step-magnification and a self-magnification which are to be defined below in place of the reference axis, the lower-pattern rotation, the step-rotation and the self-rotation in the setting of the stepper correction value for the shot rotation, respectively.

Figure 12:
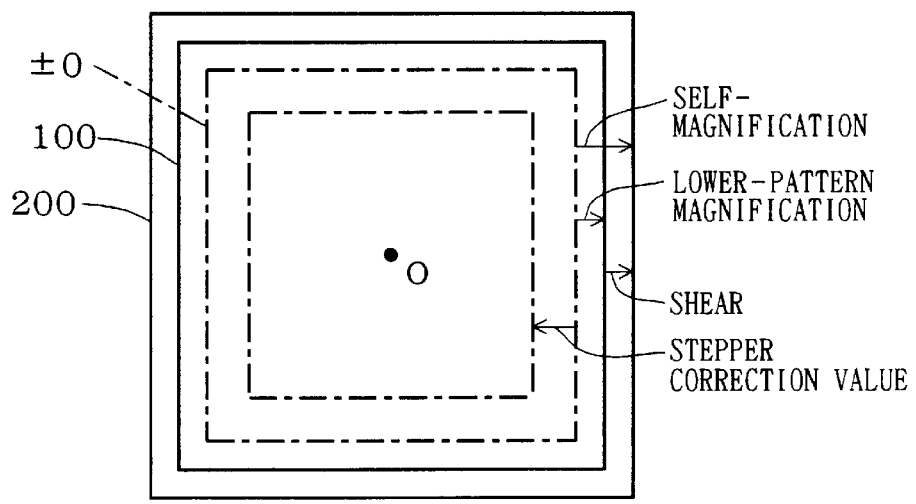
FIG. 12 illustrates a self-magnification.
Figure 13:
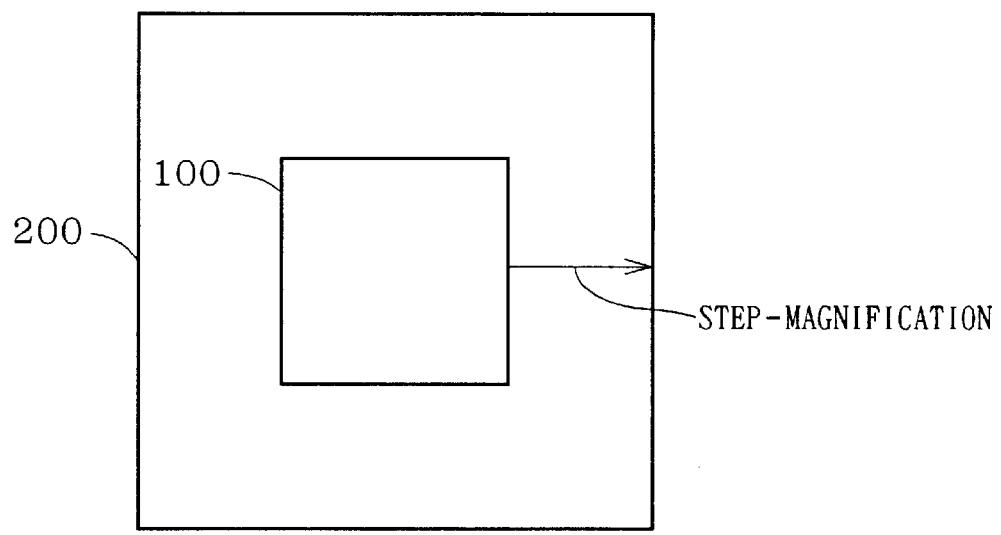
FIG. 13 illustrates a step-magnification.

The reference frame is a frame indicated as ±0 of FIG. 12 and corresponds to the position of an outer edge of the lower pattern at the time when the stepper correction value for the magnification is zero. The lower-pattern magnification is the amount of movement of the lower pattern from the position of the reference frame ±0 to the position of the outer edge of the lower pattern and also indicates the position of the outer edge of the lower pattern, as shown in FIG. 12. The self-magnification is the sum of the lower-pattern magnification of the lower pattern 100 and the shear (or the overlay checking correction value) between the patterns 100 and 200 detected by the overlay checking device 5 with reference to FIG. 12, i.e., the amount of movement from the position of the reference frame ±0 obtained by calculation. The step-magnification is the amount of movement from the position set using the stepper set value. For example, after the alignment of the upper pattern 200 by setting the self-magnification of the lower pattern 100 in the stepper, there arises a shear between the lower pattern 100 and the upper pattern 200 as shown in FIG. 13. In other words, the pattern 200 travels from the position set using the stepper correction value. The amount of movement from the position set using the stepper set value is referred to as the step-magnification.

In the method of correcting alignment disclosed in Japanese Patent Application No. 9-261580, when an upper pattern is aligned with a lower pattern, the stepper correction value is calculated based on the self-rotation of the lower pattern (the lower-pattern rotation) for the setting of the stepper correction value for the shot-rotation among the shot components. The self-rotation of the lower pattern is obtained by calculation based on the detection result from the overlay checking device 5. However, the overlay checking device 5 sometimes is not capable of detecting the shear of the lower pattern. In this case, since the self-rotation of the lower pattern is not obtained, it is impossible to calculate the stepper correction value.

Figure 14:
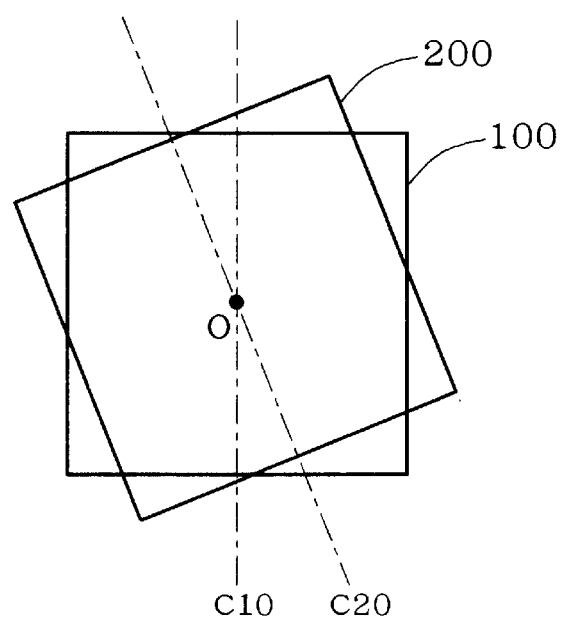
FIG. 14 shows a relationship between the positions of the lower and upper patterns relative to each other in an initial state.
Figure 15:
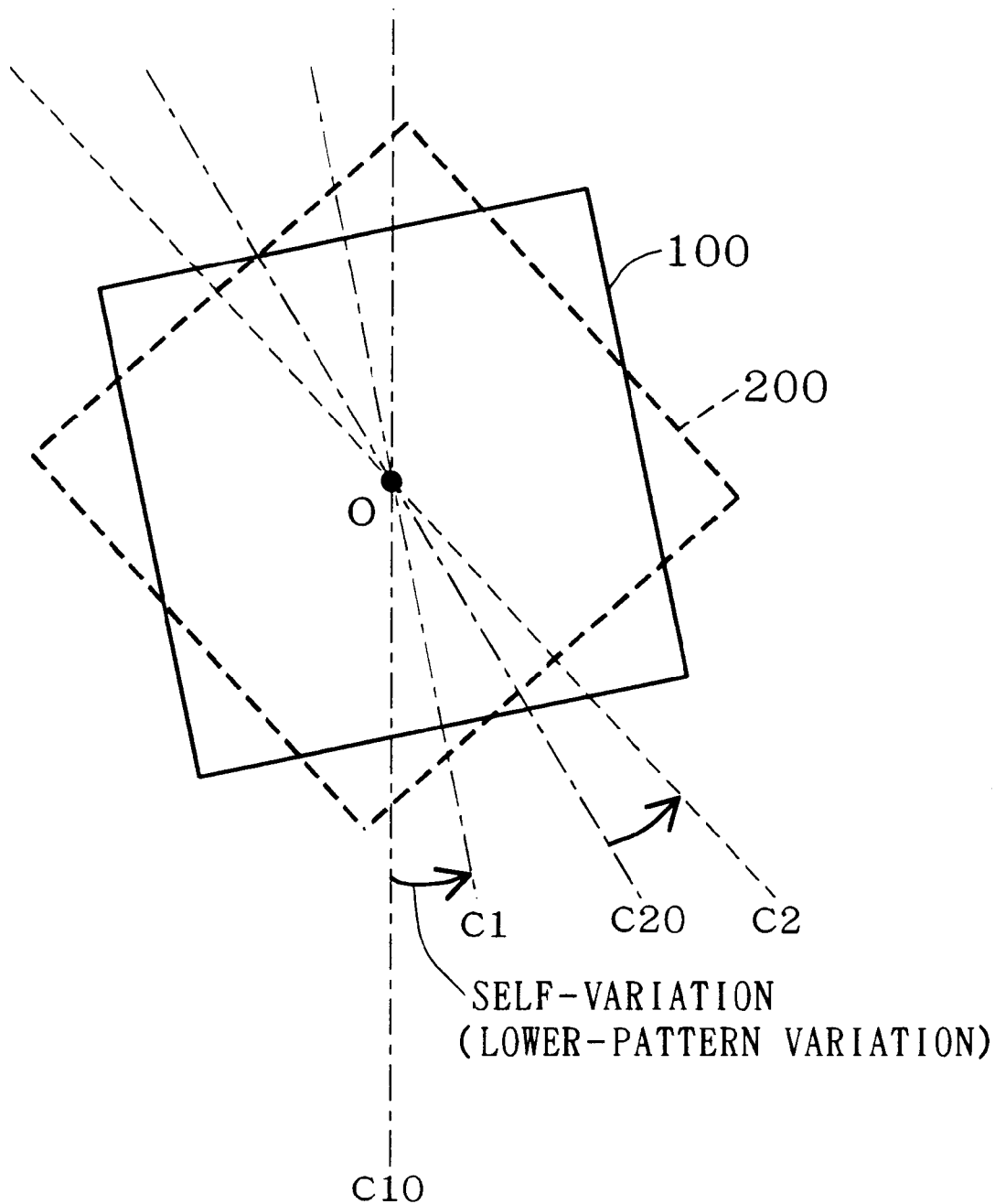
FIG. 15 illustrates a self-variation.

Then, description will be given on a method of calculating the stepper correction value when the self-rotation of the lower pattern is not obtained. FIG. 14 illustrates a relationship between the positions of the lower pattern 100 and the upper pattern 200 relative to each other in an initially manufactured semiconductor device, that is, in an initial state. As some semiconductor device lots are manufactured thereafter in the production system 10, the stepper correction value varies. FIG. 15 illustrates the positions of the lower and upper patterns in an intermediate stage of the manufacturing of a somethingth semiconductor device where the alignment of the pattern 200 is about to start. In FIG. 14, the reference character C10 designates a central axis of the pattern 100 in the initial state, and C20 designates a central axis of the pattern 200 in the initial state. The central axes C10 and C20 of FIG. 15 correspond to those of FIG. 14. The self-variation for the pattern 100 is the amount of movement from the position of the central axis C10 serving as a reference axis to the central axis C1 thereof as shown in FIG. 15. The self-variation of the lower pattern is referred to as a lower-pattern variation. When the upper pattern is aligned with the lower pattern in a state shown in FIG. 15, the upper pattern is rotated according to the lower-pattern variation.

The self-variation is obtained by calculation expressed as $$\text{self-variation} = \text{stepper correction value} - \text{initial value of stepper correction value} \quad (7)$$

For example, the self-variation of the pattern 100 (the lower-pattern variation) is a value obtained by subtracting the stepper correction value of the pattern 100 set in the stepper in the state shown of FIG. 15 from the stepper correction value of the pattern 100 set in the stepper in the state shown in FIG. 14.

In the state shown in FIG. 15, the stepper correction value to be set in the stepper for alignment of the upper pattern 200 is obtained by adding the lower-pattern variation to the background art stepper correction value (stepper correction value=f(true shear)). This is expressed as $$\text{stepper correction value} = f(\text{true shear}) + \text{lower-pattern variation} \quad (8)$$

The true shear of the pattern 200 is obtained by subtracting the lower-pattern variation from Equation (1).

$$\text{true shear} = \text{stepper correction value} - \text{overlay checking correction value} - \text{lower-pattern variation} \quad (9)$$

Figure 16:
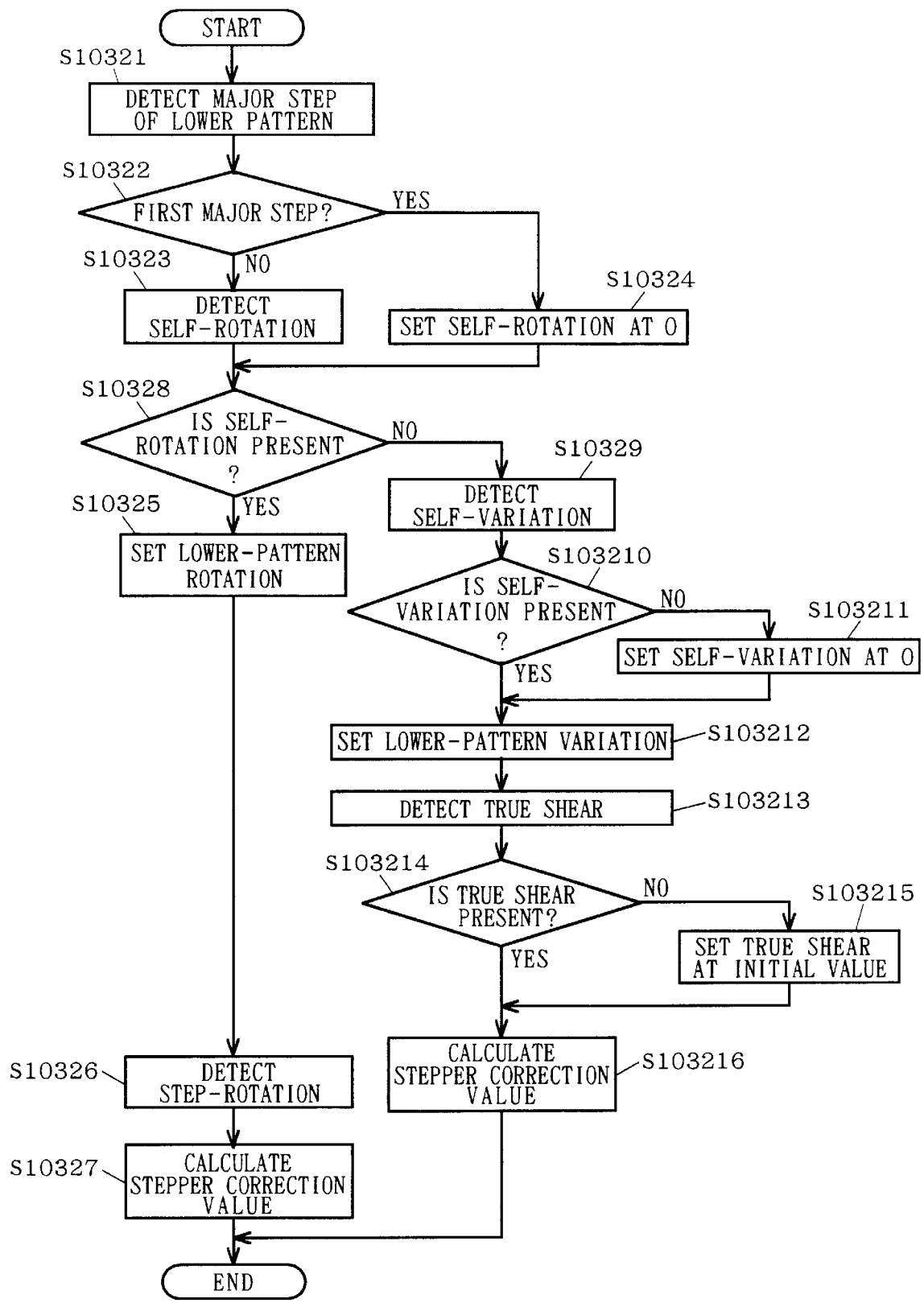
FIG. 16 is a flowchart showing the method of correcting alignment in accordance with another form of the background of the present invention.
Figure 18:
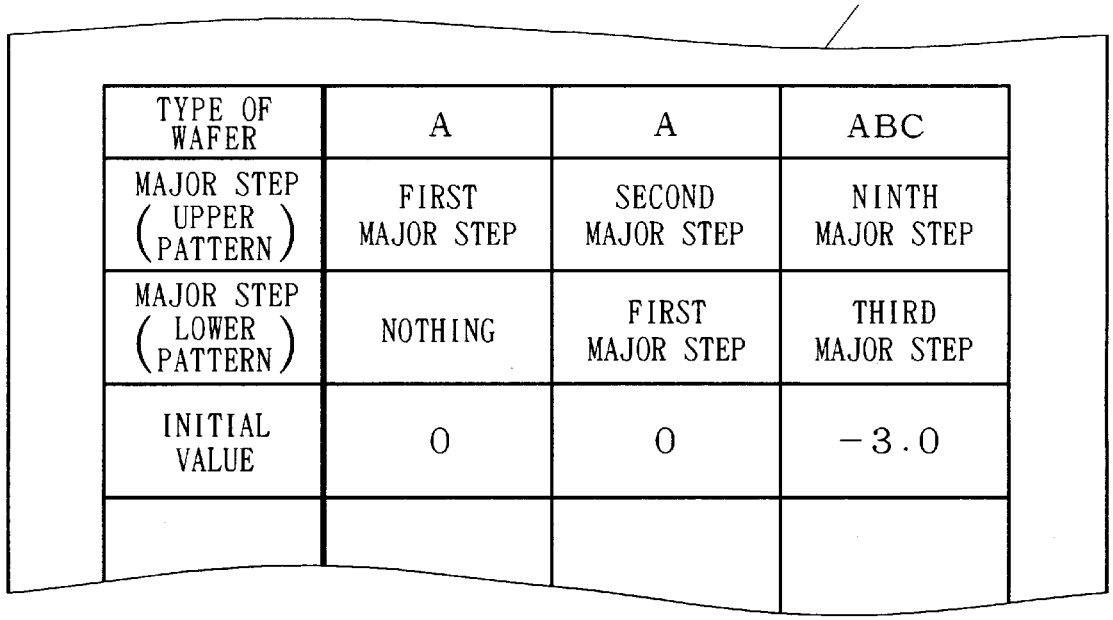

The main operation of the production control system when the self-rotation of the lower pattern is not obtained is similar to that when the self-rotation of the lower pattern is obtained except that Steps S10328 to S103216 of FIG. 16 are added to the flowchart of FIG. 8. FIGS. 17 and 18 show examples of the contents of the database 6b displayed on the reference terminal 8. The history data associated with alignment as shown in FIG. 17 and the initial value data as shown in FIG. 18, for example, are displayed on display screens 3000 and 4000 of the reference terminal 8. The production control system body 6 stores the history data associated with alignment as shown in FIG. 17 in the database 6b to control the history data. Further, the production control system body 6 stores in the database 6b the major steps for the lower pattern corresponding to major steps for the upper pattern and the initial value data indicating the position of the lower pattern in the initial state as shown in FIG. 18 to control the major steps and the initial value data. The initial value is the stepper correction value set in the stepper 4 in the initial state when the positions of the patterns are determined.

With reference to FIG. 16, the production control system body 6 judges the presence or absence of the self-rotation. When the detected self-rotation is represented by a predetermined sign (e.g., "nothing"), the production control system body 6 judges that the self-rotation is absent; otherwise judges that the self-rotation is present (Step S10328). Upon judgement that the self-rotation is absent, the production control system body 6 detects the self-variation of the lower pattern (Step S10329). The production control system body 6 searches the history data of FIG. 17 for the self-variation of the lower pattern, based on the type of wafer and the major step of the lower pattern detected in Step S10321 and set to the major step of the upper pattern.

Next, the production control system body 6 judges the presence or absence of the self-variation. When the detected self-variation is represented by a predetermined sign (e.g., "nothing"), the production control system body 6 judges that the self-variation is absent; otherwise judges that the self-variation is present (Step S103210). Upon judgement that the self-variation is absent, the production control system body 6 assumes the self-variation to be zero (Step S103211). Subsequently, the production control system body 6 sets the lower-pattern variation at the self-variation (Step S103212). Next, the production control system body 6 detects the true shear of the lower pattern in the past. The production control system body 6 searches the history data of FIG. 17 for the past true shear of the lower pattern, based on the type of wafer, the major step of the upper pattern, the major step of the lower pattern, the stepper code for the upper pattern, the stepper code for the lower pattern and a predetermined number of latest exposure dates and times which fall within a predetermined range from the present time (Step S103213).

Next, the production control system body 6 judges the presence or absence of the true shear. When the detected true shear is represented by a predetermined sign (e.g., "nothing"), the production control system body 6 judges that the true shear is absent; otherwise judges that the true shear is present (Step S103214). Upon judgement that the true shear is absent, the production control system body 6 assumes the true shear to be the initial value thereof (Step S103215). Subsequently, the production control system body 6 calculates the stepper correction value (herein, for shot rotation: S) from Equation (8) (Step S103216).

In Step S1036, the production control system body 6 stores the data related to Steps S1031 to S1036, i.e., the lot No., the type of wafer, the major step of the upper pattern, the stepper codes for the upper and lower patterns, the exposure date and time when the alignment was performed, the stepper correction value, the lower-pattern rotation and the lower-pattern variation in the database 6b for control. In Step S1054 of FIG. 9, the production control system body 6 receives the overlay checking correction value for the shot component to calculate data required to calculate the stepper correction value for the shot component (herein, S) to be set in the next alignment, i.e., the overlay checking correction value, the true shear and the self-variation when the self-rotation is absent. In the absence of the self-rotation, the production control system body 6 determines the true shear and the self-variation by using Equations (9) and (7), respectively. Further, in Step S1036, the production control system body 6 records the data related to Steps S1051 to S1055, i.e., the overlay checking correction value, the true shear, the step-rotation, the self-rotation and the self-variation in the database 6b in addition to those recorded in Step S1036 for control.

As described hereinabove, the production control system body 6 controls upper and lower patterns the shear of which must be within specifications and also the self-variation of the lower pattern, thereby to generate a value including the self-variation of the lower pattern (the lower-pattern variation) as the stepper correction value for determining the position of the upper pattern. This prevents any out-of-specification shear between the lower and upper patterns. Since the reference position is the position of the pattern in the initial state, the self-variation is the amount of variation from the position in the initial state. Therefore, the positions of the pattern 100 and 200 relative to each other (in the state shown in FIG. 15) may be made equivalent to those of the patterns 100 and 200 relative to each other in the initial state (in the state shown in FIG. 14). A difference between the stepper correction value set for determining the position of the lower pattern and the stepper correction value of the lower pattern in the initial state, i.e., the self-variation may be obtained by calculation from Equation (7).

The above description pertains to the calculation of the stepper correction value for the shot rotation among the shot components when the self-rotation for the lower pattern is not obtained. Description will be given on the calculation of the stepper correction value for the magnification when the self-rotation of the lower pattern is not obtained. The setting of the stepper correction value for the magnification among the shot components may be similar to the setting of the stepper correction value for the shot rotation. Specifically, the setting of the stepper correction value for the magnification among the shot components uses the self-variation in magnification and the lower-pattern variation in magnification which are to be defined below in place of the self-variation in shot rotation and the lower-pattern variation in shot rotation in the setting of the stepper correction value for the shot rotation, respectively.

Figure 19:
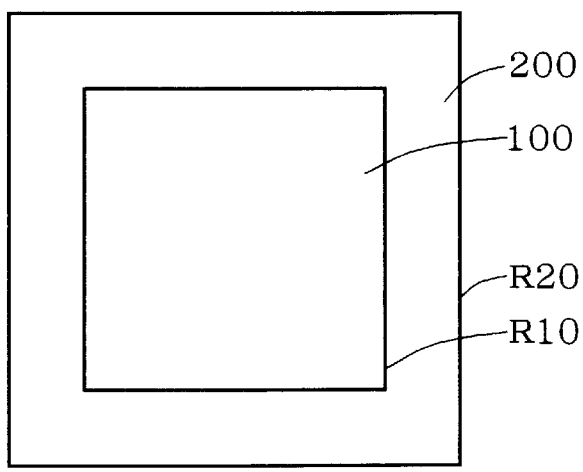
FIG. 19 shows a relationship between the positions of the lower and upper patterns relative to each other in the initial state.
Figure 20:
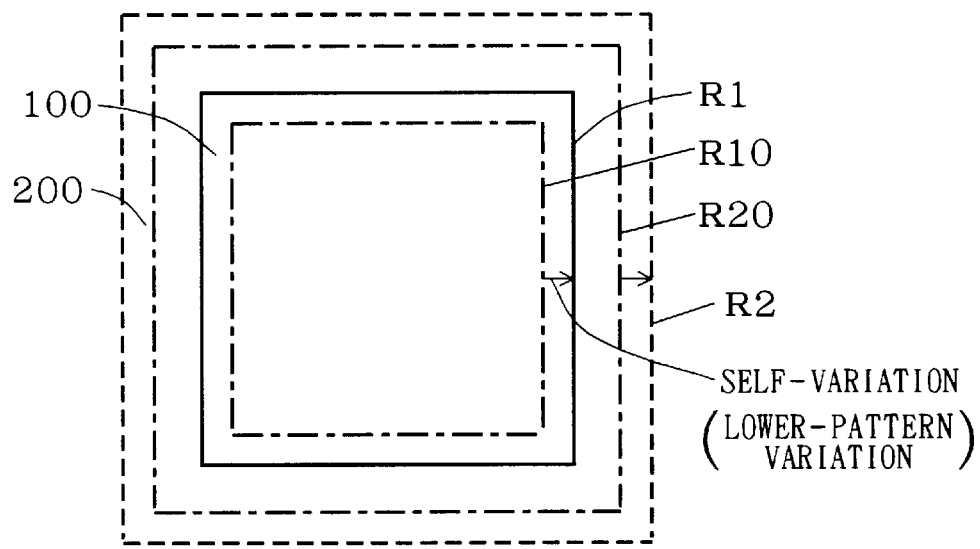
FIG. 20 illustrates the self-variation.

FIG. 19 illustrates a relationship between the positions of the lower pattern 100 and the upper pattern 200 relative to each other in an initially manufactured semiconductor device lot, that is, in the initial state. As some semiconductor device lots are manufactured thereafter, the stepper correction value varies. FIG. 20 illustrates the lower and upper patterns 100 and 200 in an intermediate stage of the manufacturing of any semiconductor device where the alignment of the pattern 200 is about to start. In FIG. 19, the reference character R10 designates an outer edge of the pattern 100 in the initial state, and R20 designates an outer edge of the pattern 200 in the initial state. The outer edges R10 and R20 of FIG. 20 correspond to those of FIG. 19. The self-variation in magnification for the pattern 100 is the amount of movement from the position of the outer edge R10 serving as a reference outer edge to the position of the outer edge R1 of the pattern 100, as shown in FIG. 20. The self-variation of the lower pattern is referred to as the lower-pattern variation.

Figure 21:
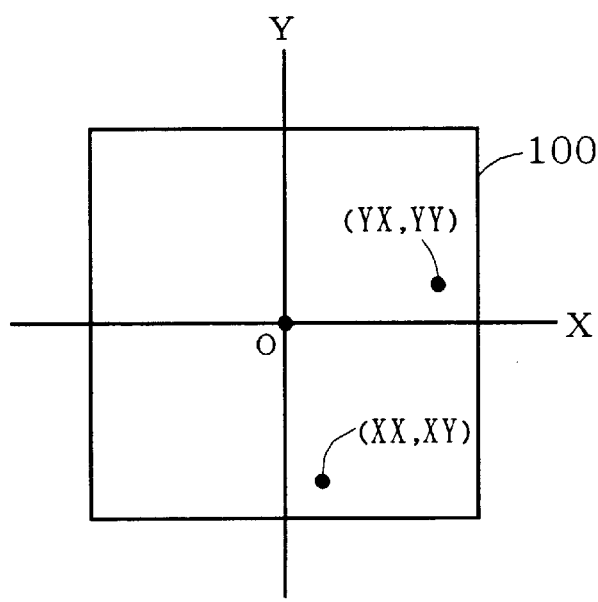
FIG. 21 shows the lower pattern before rotation.
Figure 22:
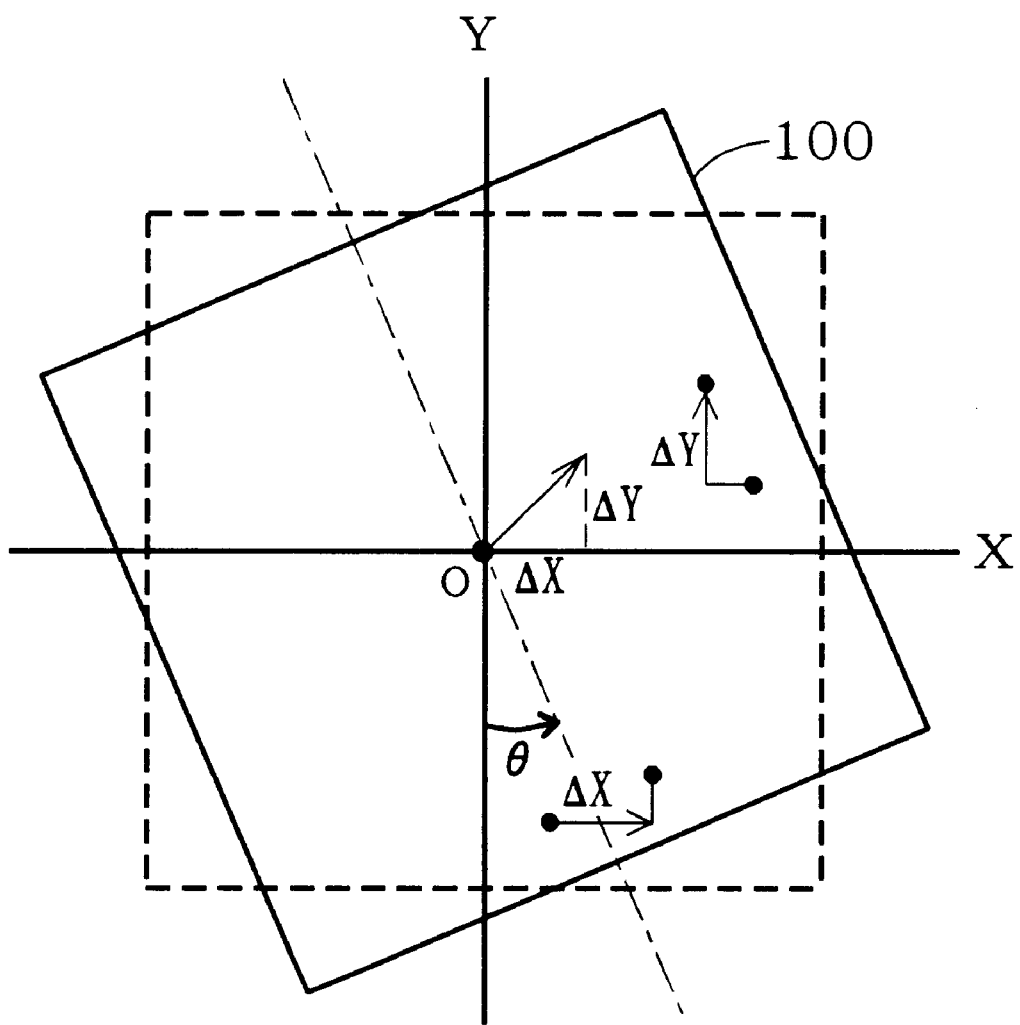
FIG. 22 shows the lower pattern after rotation.

Description will be given on the calculation of offsets X and Y among the stepper correction values for the wafer component carried out in Step S1031 of FIG. 7 in the stepper correction value for the shot rotation among the shot components. FIG. 21 shows the pattern 100 before rotating, and FIG. 22 shows the pattern 100 after rotating through an angle θ which is the self-rotation or the self-variation of the pattern 100. In FIG. 21, the coordinates of an alignment mark for an X-coordinate are denoted as (XX, XY) and the coordinates of an alignment mark for a Y-coordinate are denoted as (YX, YY). As the lower pattern of FIG. 21 rotates through the angle θ, the alignment mark for the X-coordinate moves by ΔX in a direction of the X-coordinate and the alignment mark for the Y-coordinate moves by ΔY in a direction of the Y-coordinate, as shown in FIG. 22. In other words, the rotation through the angle θ is equivalent to the movement of a center point o by ΔX and ΔY on the whole. Therefore, the rotation through the angle θ increases the likelihood that the offsets are out of specifications in the subsequent major steps. In particular, although ΔX and ΔY are negligible when the alignment mark is located in a central part of the reticle, ΔX and ΔY are appreciably large when the alignment mark is located in a peripheral part of the reticle.

When the lower pattern is rotated through the angle θ in a major step so that the offsets are not out of specifications, the offsets X and Y including the variations ΔX(θ) and ΔY(θ), respectively, are set in an alignment of a subsequent major step. Specifically, the offsets X and Y to be set in the alignment of the subsequent major step are $$\text{offset } X = f(\text{true shear}) + \Delta X(\theta) \tag{10}$$

$$\text{offset } Y = f(\text{true shear}) + \Delta Y(\theta) \tag{11}$$

The variations ΔX(θ) and ΔY(θ) are expressed respectively as $$\Delta X(\theta) = XX \cdot \cos\theta - XY \cdot \sin\theta - XX \tag{12}$$

$$\Delta Y(\theta) = YX \cdot \sin\theta - YY \cdot \cos\theta - YY \tag{13}$$

Thus, in Step S1031, the angle θ is transformed into the variations ΔX and ΔY in the stepper correction values for the offsets X and Y by using Equations (12) and (13), and then the stepper correction values for the offsets X and Y including the variations ΔX and ΔY are generated from Equations (10) and (11).

In the method of correcting alignment described with reference to FIGS. 6 through 9 and the method of correcting alignment described with reference to FIG. 16, for example, when the stepper correction value for the shot component set in the stepper in the present alignment is +2 and the overlay checking correction value is –5, the stepper correction value for the shot component to be set in the stepper for the next alignment is +7=(+2–(–5)). Setting the stepper correction value as great as +7 for the next alignment increases the likelihood that the offsets are out of specifications since the shot rotation has an effect on the offsets. Then, a great stepper correction value is not set for the next alignment.

Figure 23:
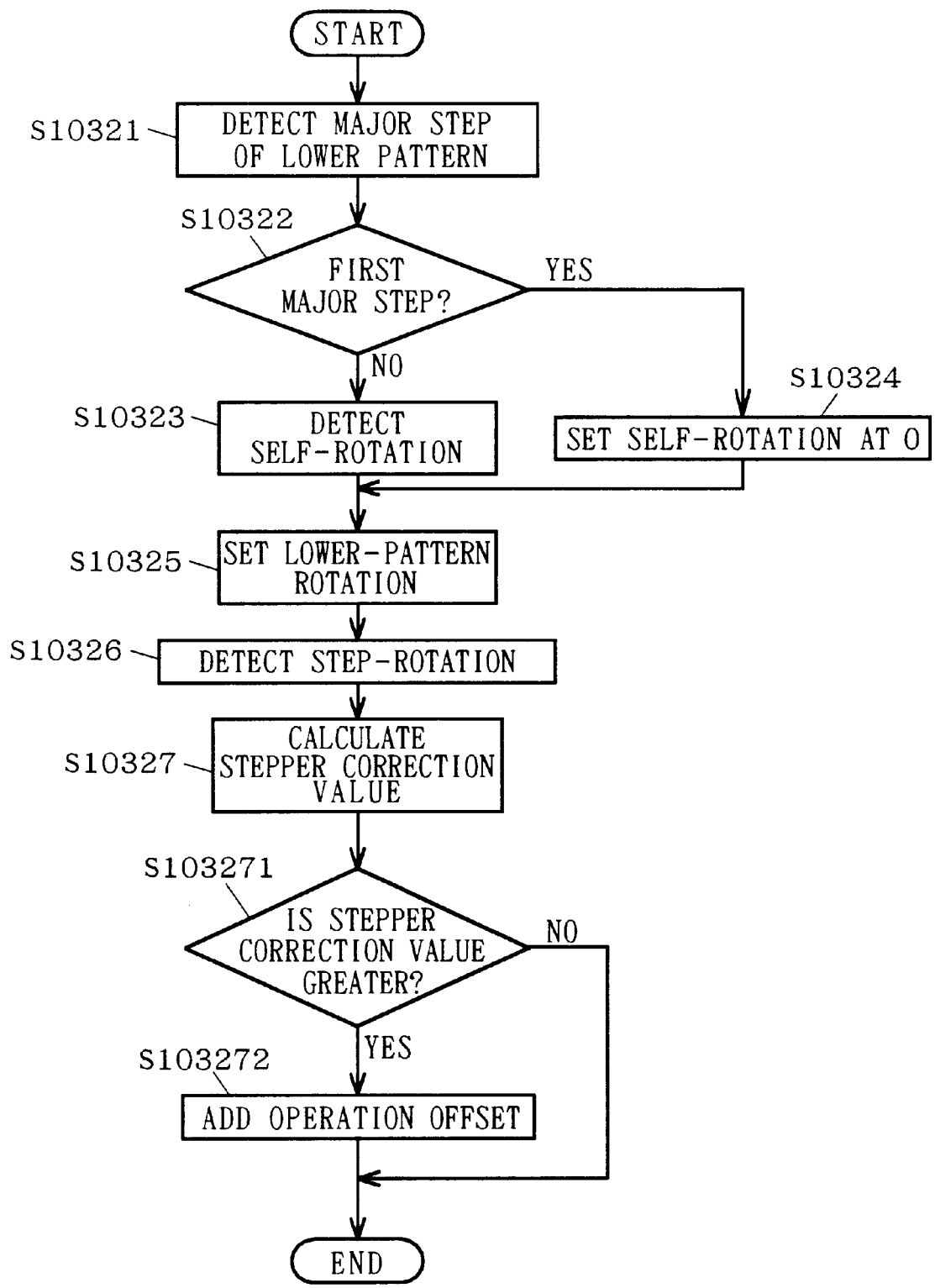
FIGS. 23 and 24 are flowcharts showing the method of correcting alignment in accordance with another form of the background of the present invention.

The main operation of the production control system body 6 in this case is similar to that in the method of correcting alignment described with reference to FIGS. 6 through 9 or FIG. 16 except that Steps S103271 and S103272 of FIG. 23 are added to the flowchart of FIG. 8.

It is assumed herein that the above stepper correction value of +7 is calculated in Step S10327. When it is judged that the stepper correction value of +7 is not less than a predetermined threshold value (Step S103271), a value of –3 for reducing the stepper correction value (referred to hereinafter as an "operation offset") is added to the stepper correction value of +7, to obtain a stepper correction value of +4. Therefore, there is a strong likelihood that the stepper correction value is reduced by almost half as compared with +7, and the overlay checking correction value becomes –2.

In the next step S103271, the operation offset is set at –2 to obtain a stepper correction value of +5. Thus, the operation offset is repeatedly incremented by +1 to cause the overlay checking correction value to gradually approach zero.

When the stepper correction value is great, the stepper correction value is gradually changed using the operation offset to cause the overlay checking correction value to gradually approach zero, thereby preventing any out-of-specification offset.

Further, when the conventional method of correcting alignment is shifted to the method of correcting alignment described with reference to FIG. 6, great stepper correction values are often obtained by calculation, causing out-of-specification offsets with frequency. The use of the method described with reference to FIG. 23 reduces the stepper correction value to prevent frequent occurrence of out-of-specification offsets.

As to the magnification, it is not always the best resolution to change the overlay checking correction value directly to zero. When a stepper correction value for the magnification great enough to change the overlay checking correction value directly to zero is set in the stepper, the lens system PL of FIG. 27 sometimes has lower precision because of residual magnification. Then, the stepper correction value for the magnification is gradually changed using the operation offset, to prevent the degradation of precision of the lens system PL and the resultant out-of-specification values.

(Japanese Patent Application No. 9-151)

Description will be given on a method of correcting alignment disclosed in Japanese Patent Application No. 9-151 which is performed by the production system 10 shown in FIG. 54 with reference to the flowchart of FIG. 24. Step SS101 is described first. The production control system uses a plurality of steppers 4 and a plurality of semiconductor manufacturing devices 7 to perform various steps for manufacturing a semiconductor device. Each time the alignment is performed using any one of the steppers 4, the production control system body 6 stores alignment data in the database 6b for control. The alignment data contains the true shear which is the difference between the stepper correction value and the overlay checking correction value. The various steps include a step performed on wafers having different lot numbers, and steps differing in processing contents. The processing contents indicate which process forms which one of the stacked patterns. Thus, the steps differing in processing contents are treated as different steps.

Figure 24:
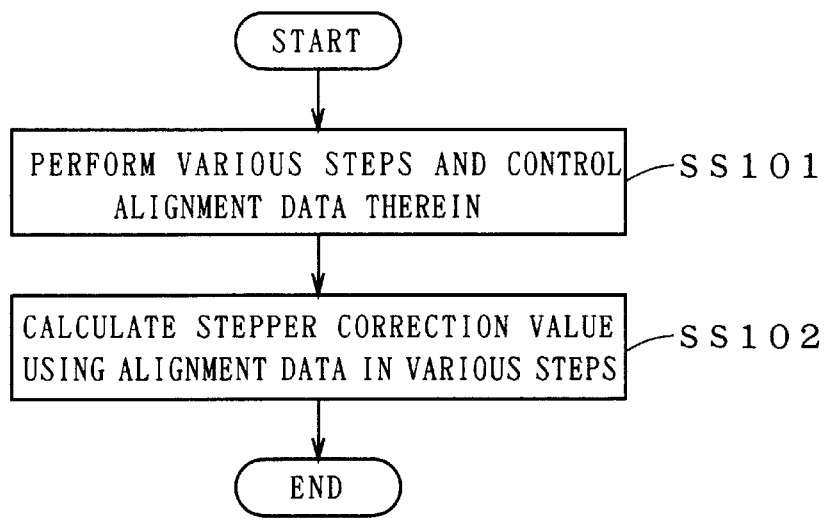

Step SS102 of FIG. 24 is described below. True shears which satisfy alignment conditions for the next alignment are extracted among the true shears stored in the database 6b. The alignment conditions used herein, unlike conventional ones, preferably include only the same conditions as the alignment conditions for the stepper 4 for use in the next alignment. Thus, a greater number of true shears than conventional ones are extracted herein. The alignment conditions the same as those for the stepper 4 for use in the next alignment may additionally include the condition that the same wafer type is used.

Figure 25:
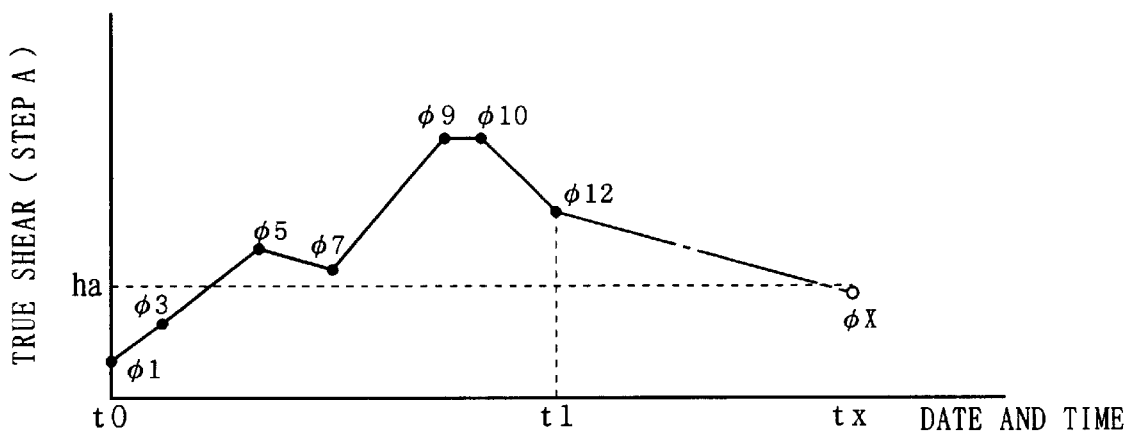
FIG. 25 is a graph showing a trend of a true shear versus the date and time when a shear was detected in Step A.
Figure 26:
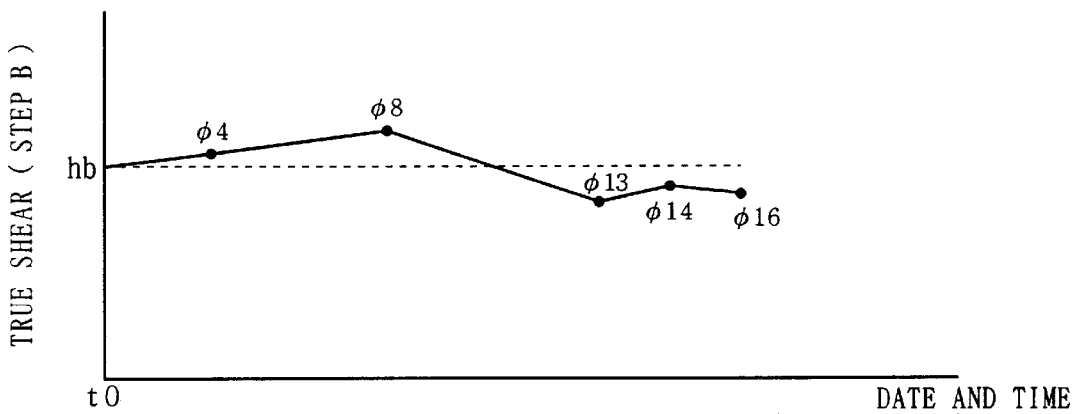
FIG. 26 is a graph showing a trend of the true shear versus the date and time when the shear was detected in Step B.
Figure 27:
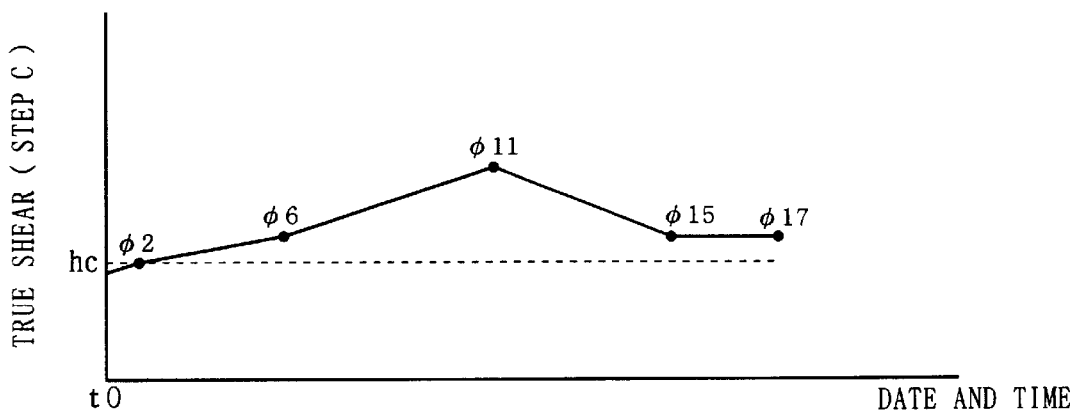
FIG. 27 is a graph showing a trend of the true shear versus the date and time when the shear was detected in Step C.

The extracted true shears are classified for each step the true shears in a conventional manner, and respective trends thereof are determined. FIGS. 25 through 27 are graphs showing examples of the trends of the true shears associated with the same step. FIGS. 25, 26 and 27 show Steps A, B and C, respectively, which are all exposure steps but differ in processing contents from each other. The horizontal axes of the graphs of FIGS. 25 though 27 represent the date and time when the alignment was performed, where the points recorded prior to the date and time t0 are dispensed with. Although actual steps are not limited to Steps A, B and C but include hundreds of steps, only these three steps are illustrated for purposes of simplification.

The alignment correction unit 6a uses the mean value of the trends in one of Steps A, B and C which is identical with that for the next alignment to predict the true shear for the next alignment. For example, when the next alignment is performed in Step A, the alignment correction unit 6a uses the mean value ha of the true shears as shown in FIG. 25 to predict the true shear for the next alignment.

A longer time interval between the dates and times t1 and tx shown in FIG. 25 increases the influence of the variations in trend. Therefore, the predicted true shear (predicted value) is preferably corrected in the case of the longer time interval between the dates and times t1 and tx. Preferably, the alignment correction unit 6a judges whether or not the time interval between the dates and times t1 and tx is long, depending on whether or not the time interval is longer than a value previously set by an operator. If particularly required, the operator may judges whether or not the time interval between the dates and times t1 and tx is long. If the time interval between the dates and times t1 and tx is judged as being short, the predicted true shear is not corrected. The conventional method of correcting alignment is used when the true shear is not corrected.

Figure 28:
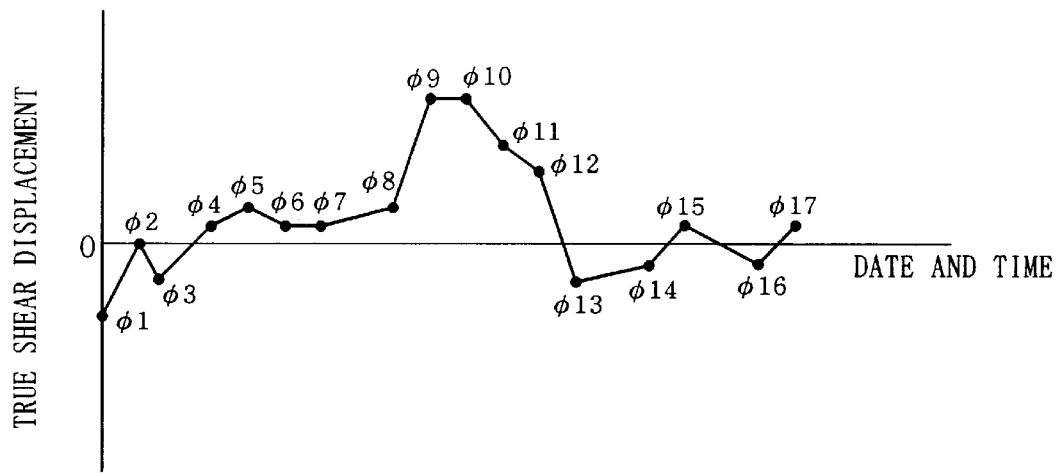
FIG. 28 is a graph showing a trend of a displacement of the true shear versus the date and time when the shear was detected.

The correction of the predicted true shear is made in a manner to be described below. FIG. 28 is a graph showing a trend of the displacement of the true shear versus the date and time when the alignment was performed, with the reference characters of FIG. 28 corresponding to those of FIGS. 25 through 27. The displacement of the true shear is the mean value of true shears subtracted from the true shear. For instance, the displacement of the true shear at the record point $\phi 1$ of FIG. 28 is a value obtained by subtracting the mean value ha from the true shear at the record point $\phi 1$ of FIG. 25. The true shear displacements at other record points $\phi 2$ to $\phi 17$ are similarly obtained. The alignment correction unit 6a calculates the mean value of the latest displacements among the true shear displacements. The correction unit 6a adds the mean value to the predicted true shear to correct the true shear, and then uses the corrected true shear as the stepper correction value to be set in the stepper in the next alignment.

Thus, the stepper correction value to be set in the stepper in the next alignment is stepper correction value=mean value of true shears+mean value of displacements (14)

For example, when the next alignment is performed in Step A, the mean value of true shears on the right-hand side of Expression (14) is the mean value ha shown in FIG. 25, and the mean value of displacements on the right-hand side thereof is the mean value of the true shears at the record points $\phi 15$, $\phi 16$ and $\phi 17$ shown in FIG. 28. The mean value of true shears and the mean value of displacements are the average of a plurality of latest record points, the number of which is previously set by the operator. Since the alignment conditions used herein are only the same conditions as those for the next stepper and a greater number of true shears are extracted than conventional ones, a proper stepper correction value is provided if a time interval between the dates and times t1 and tx is long. The prediction of the next true shear and the correction of the predicted true shear using the true shears in other steps in the case of a long time interval between the dates and times t1 and tx may provide a proper stepper correction value for each step. The predicted true shear is readily corrected by adding the displacement mean value to the predicted true shear (true shear mean value).

Figure 29:
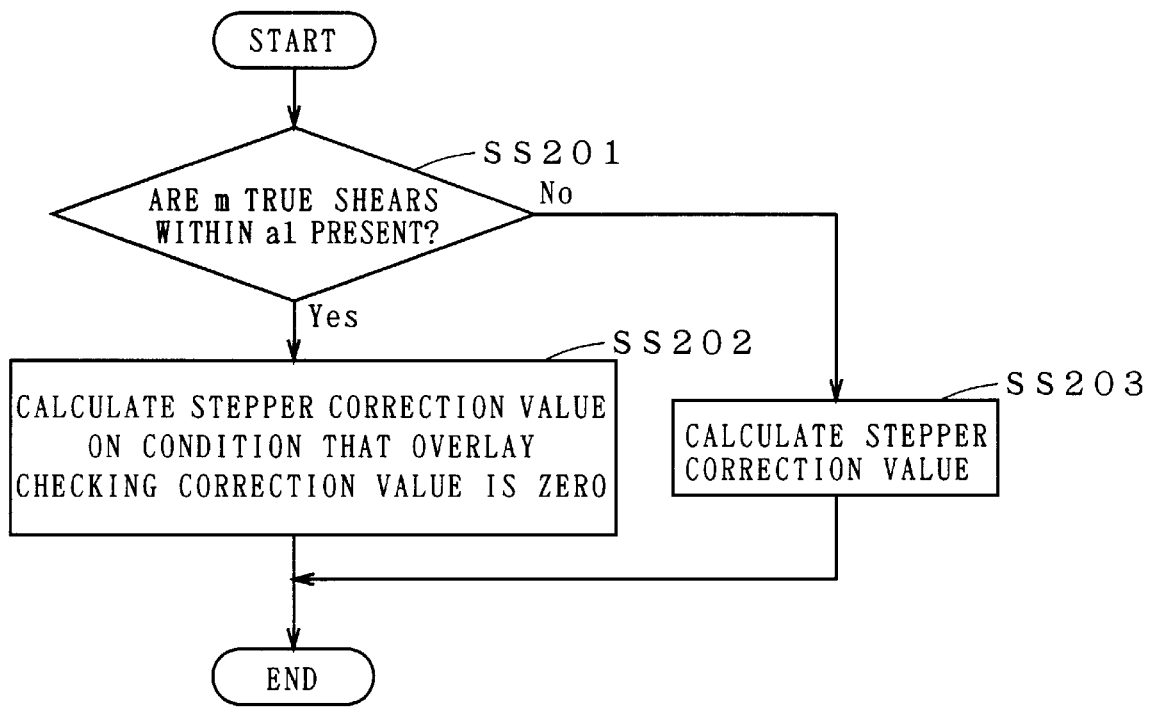
FIG. 29 is a flowchart showing the method of correcting alignment in accordance with another form of the background of the present invention.
Figure 30:
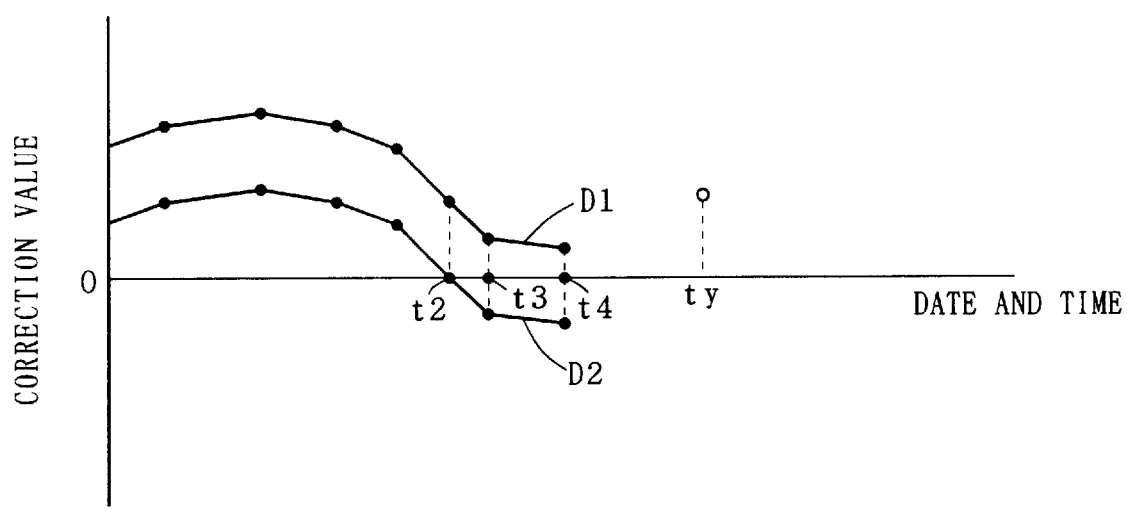
FIG. 30 is a graph showing a trend of a correction value versus the date and time.
Figure 54:
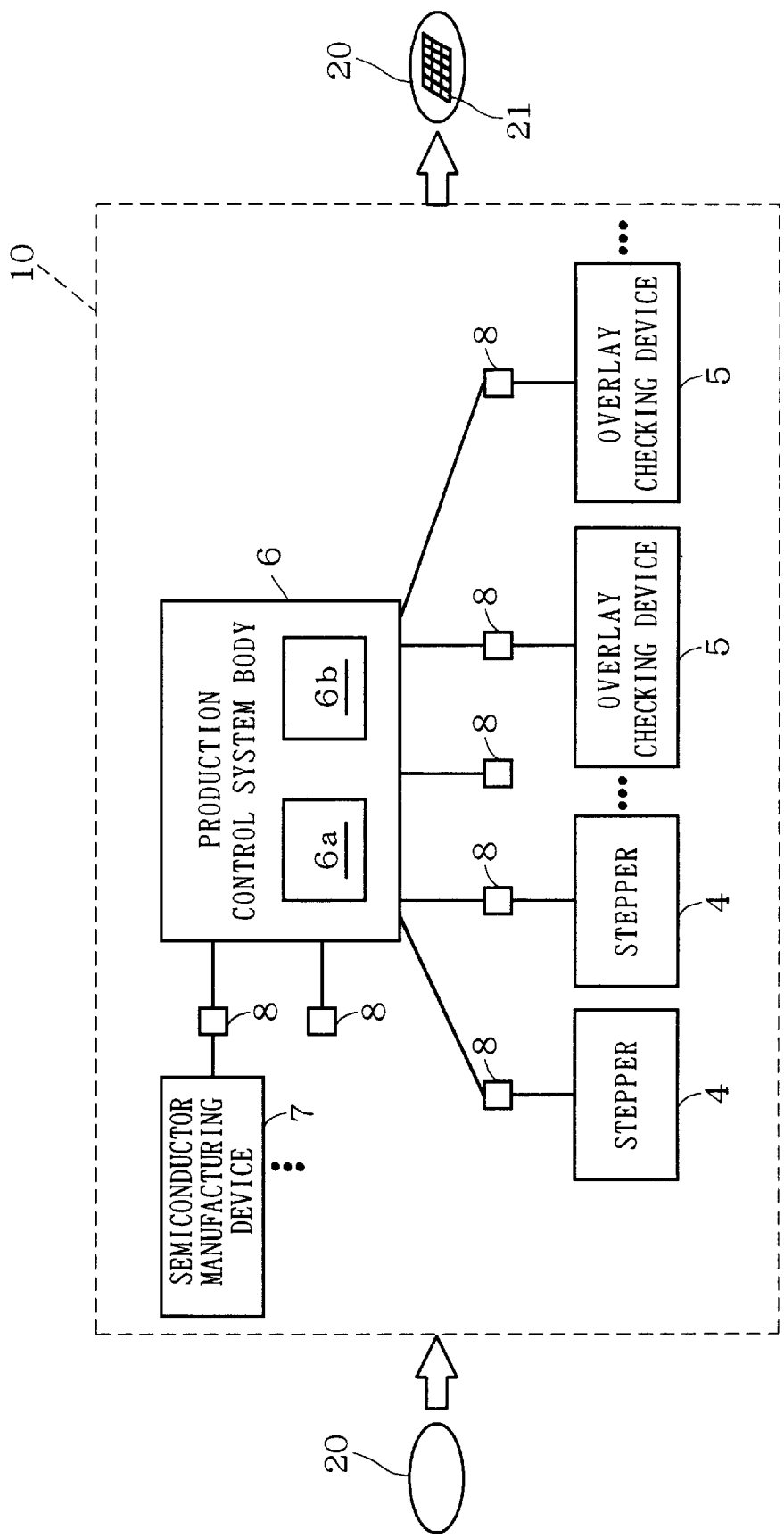
FIG. 54 is a block diagram showing a production system for controlling the manufacture of a semiconductor device.
Figure 55:
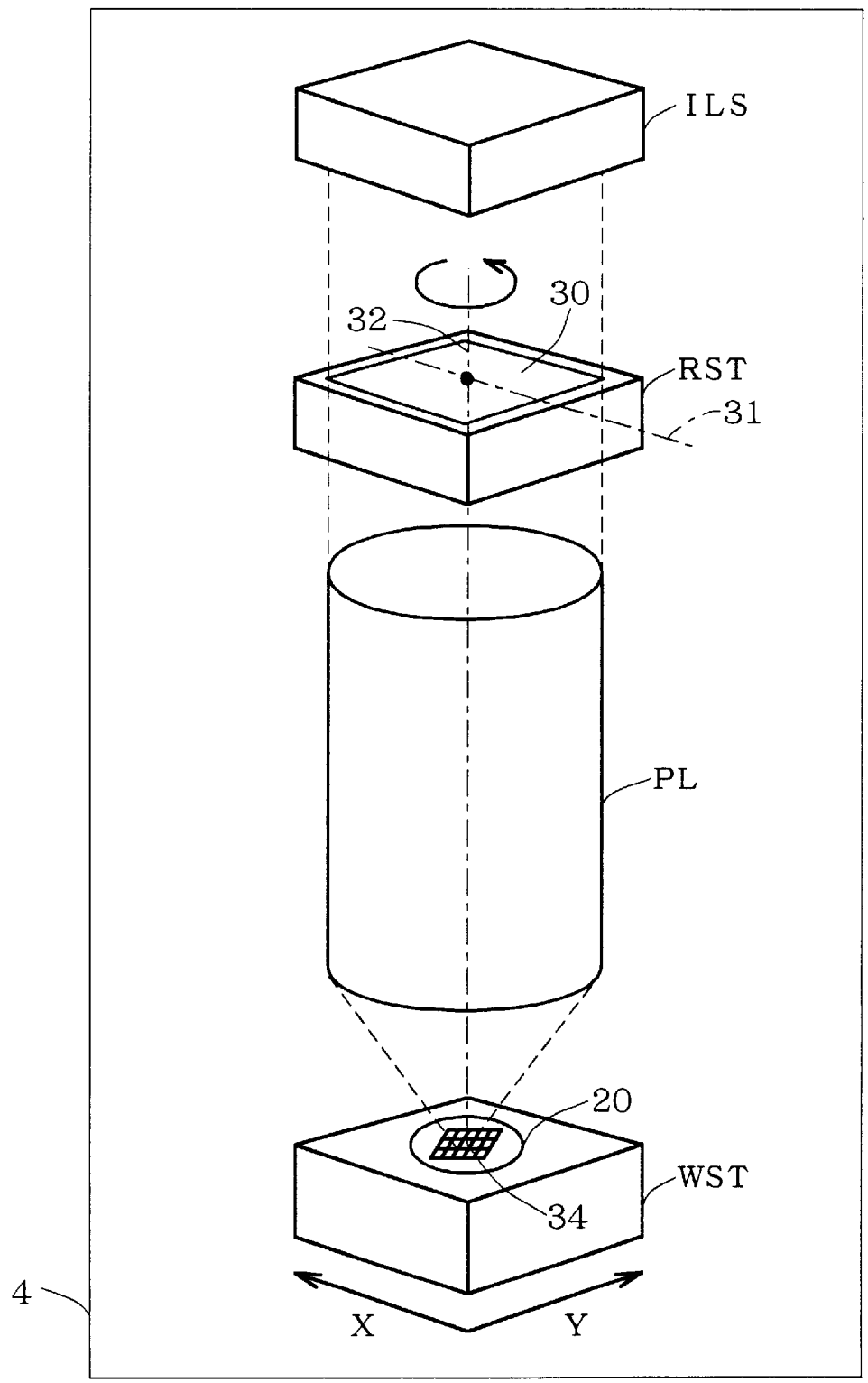
FIG. 55 is an exploded view of a stepper.

Another method of correcting alignment disclosed in Japanese Patent Application No. 9-151 which is performed by the production control system shown in FIG. 54 is described below with reference to the flowchart of FIG. 29. In Step SS201, the alignment correction unit 6a judges whether or not the true shears which are the difference between the stepper correction value and the overlay checking correction value are substantially constant and the trend of the stepper correction value (or the overlay checking correction value) varies. If the true shears are substantially constant, the flow proceeds to Step SS202; otherwise the flow proceeds to Step SS203. In Step SS203, the alignment correction unit 6a calculates the stepper correction value in the manner performed in the alignment correcting method described with reference to FIG. 24.

In Step SS202, upon judgement that no shear is detected, the alignment correction unit 6a calculates the stepper correction value to be set in the stepper in the next alignment. The reason therefor is specifically described below.

Since the true shears are actually not always constant, it is necessary to predict the true shear to be produced after the next alignment. Unfortunately, the prediction of the true shear in the case where the true shears are substantially constant fails to provide a proper stepper correction value. When the true shear is predicted in the case where the true shears are substantially constant, the stepper correction value varies depending on the overlay checking correction value, causing the shear also to vary. Hence, a prediction is made that no shear is detected when the true shears are substantially constant. The stepper correction value to be set in the stepper in the next alignment based on the prediction is, for example, the stepper correction value set in the stepper in the preceding alignment or the mean value of true shears which are substantially constant. The latter is preferably adopted.

It is assumed, for example, that the next alignment is performed in one of the steps including Steps A, B and C. The latest trends of the stepper correction value D1 and the overlay checking correction value D2 in this step is supposed to be those shown in FIG. 30. The flow proceeds to Step SS202 if a difference between a maximum true shear and a minimum true shear among the true shears (differences between the stepper correction values D1 and the overlay checking correction values D2) at a fixed number m (three herein) of latest record points (at times t2, t3 and t4) shown in FIG. 30 falls within a fixed margin a1 and the stepper correction values D1 at the three time points differ from each other in Step SS201. The fixed number m and the fixed margin a1 are previously set by the operator. In Step SS202, the alignment correction unit 6a uses the mean value of the true shears at the three time points as the stepped correction value to set the stepper correction value in the stepper for use in the next alignment (at the date and time ty of FIG. 30). In this manner, when the trends of the true shears are substantially constant, another stepper correction value, that is, the stepper correction value on the assumption that no shear is produced is calculated and set in the stepper. When the latest true shears are substantially constant, the calculation of the stepper correction value on the assumption that no shear is produced may provide a proper stepper correction value.

A third method of correcting alignment to be described hereinafter has the function of judging the cause of an out-of-specification shear, if generated, in addition to the above-described two alignment correcting methods disclosed in Japanese Patent Application No. 9-151. Table 1 shows some of the alignment data about the alignment which caused an out-of-specification shear among the alignment data stored in the database 6b of FIG. 54. The date of Table 1 is the date when the out-of-specification shear was generated, and sometimes includes a time. Whether or not the out-of-specification shear is generated is judged by the alignment correction unit 6a based on the overlay checking correction value and inherent specifications set in the stepper. The specifications are previously stored in the database 6b.

TABLE 1

| date | July 30 | Oct. 3 | Oct. 7 | Oct. 8 | Oct. 10 |
|---|---|---|---|---|---|
| lot No. | L4 | L1 | L1 | L2 | L3 |
| step code | C | A | A | A | B |
| stepper code | 4b | 4a | 4a | 4a | 4a |

The third method of correcting alignment disclosed in Japanese Patent Application No. 9-151 which is performed by the production control system shown in FIG. 54 is described below with reference to the flowchart of FIG. 31.

In Step SS301, the alignment correction unit 6a reads the alignment data stored in the database 6b in chronological order. In Step SS302, the alignment correction unit 6a judges the presence or absence of alignment data within a fixed time period of the past before the next alignment. If the alignment data are present, the flow proceeds to Step SS303; otherwise the processing is terminated. The fixed time period is previously set by the operator. The alignment data within the fixed time period of the past are used since too old alignment data are not helpful.

In Step SS303, the alignment correction unit 6a judges whether or not the items (including date, lot number, step code and stepper code) of the alignment data read in Step SS301 in the current processing cycle except the date are the same as those of the alignment data read in Step SS301 in its preceding processing cycle. If the items are the same, the flow proceeds to Step SS304; otherwise the flow proceeds to Step SS305. In Step SS304, the alignment correction unit 6a judges that the wafer itself is abnormal (lot anomaly) and detects the number of times the same lot number appears in succession and that lot number. In Step SS305, the alignment correction unit 6a judges whether or not the step code of the alignment data read in Step SS301 in the current processing cycle is the same as that of the alignment data read in Step SS301 in its preceding processing cycle. If the same step code is detected, the flow proceeds to Step SS306; otherwise the flow proceeds to Step SS307. In Step SS306, the alignment correction unit 6a judges that the step is abnormal (step anomaly) and detects the number of times the same step code appears in succession and that step code. In Step SS307, the alignment correction unit 6a judges whether or not the stepper code of the alignment data read in Step SS301 in the current processing cycle is the same as that of the alignment data read in Step SS301 in its preceding processing cycle. If the same stepper code is detected, the flow proceeds to Step SS308; otherwise the flow proceeds to Step SS309. In Step SS308, the alignment correction unit 6a judges that a mechanical mechanism of the stepper associated with the alignment is abnormal (stepper anomaly) and detects the number of times the same stepper code appears in succession and that stepper code. In Step SS309, the alignment correction unit 6a judges that the anomaly results from an unknown cause to count up an unaccountable anomaly counter.

Figure 31:
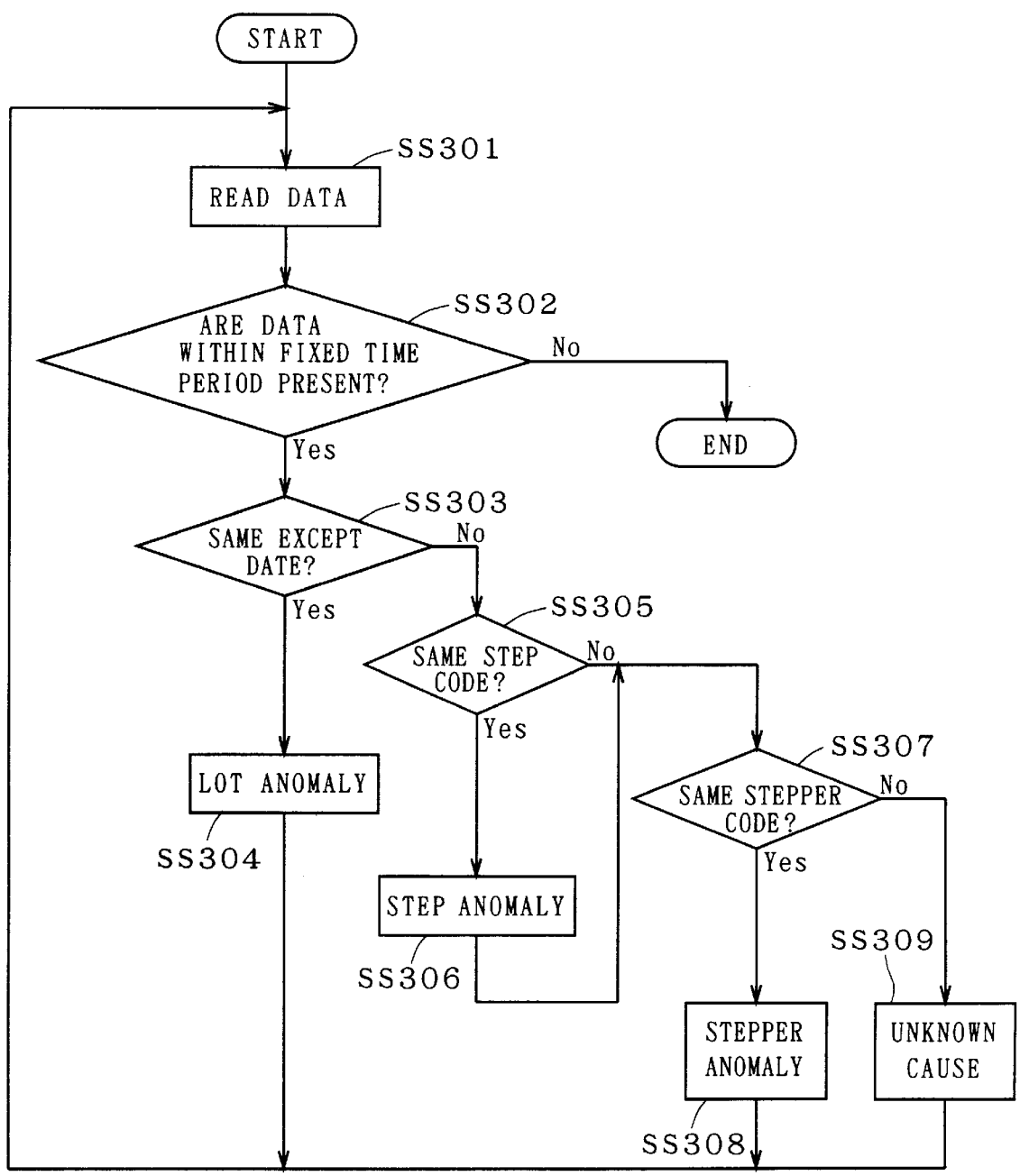
FIGS. 31 through 33 are flowcharts showing the method of correcting alignment in accordance with another form of the background of the present invention.

Table 2 shows the result detected by the alignment correction unit 6a which has performed the processing shown in the flowchart of FIG. 31 upon the alignment data shown in Table 1. This table is displayed, for example, on a display screen (not shown) of the reference terminal 8 shown in FIG. 54. The operator may check the table for the above described causes in descending order of the count on the table.

TABLE 2

| cause | code | count |
|---|---|---|
| lot anomaly | L1 | 2 |
| step anomaly | A | 3 |
| stepper anomaly | 4a | 4 |

As above described, the alignment conditions including the lot number, the step code, and the stepper code are stored as shown in Table 2, and the cause of the out-of-specification shear is judged using the stored alignment conditions. The alignment conditions to be stored may be other items than those described above. An attempt of the operator to detect the cause of the out-of-specification shear involves the need to check a multiplicity of alignment data stored in the database 6b and requires much handling. The third method is adapted such that the alignment correction unit 6a automatically detects the cause of the out-of-specification shear to allow earlier detection than operator's detection of the cause of the out-of-specification shear.

If the step anomaly or the stepper anomaly occurs, the third alignment correcting method disclosed in Japanese Patent Application No. 9-151 is adapted to check the device used in the step and the stepper to deal with the anomalies so that the shear is reduced or the alignment precision increases. In the case of the lot anomaly, the third method is adapted to set the stepper correction value at a proper value to deal with the anomaly so that the alignment precision increases. In one form of the third method, for example, the operator in place of the alignment correction unit 6a calculates the stepper correction value to increase the alignment precision if the lot anomaly occurs. However, operator's calculation of the stepper correction value involves the need to check the multiplicity of alignment data stored in the database 6b and to actually calculate numerical values, requiring much handling. Thus, the alignment correction unit 6a deals with the anomalies.

Figure 32:
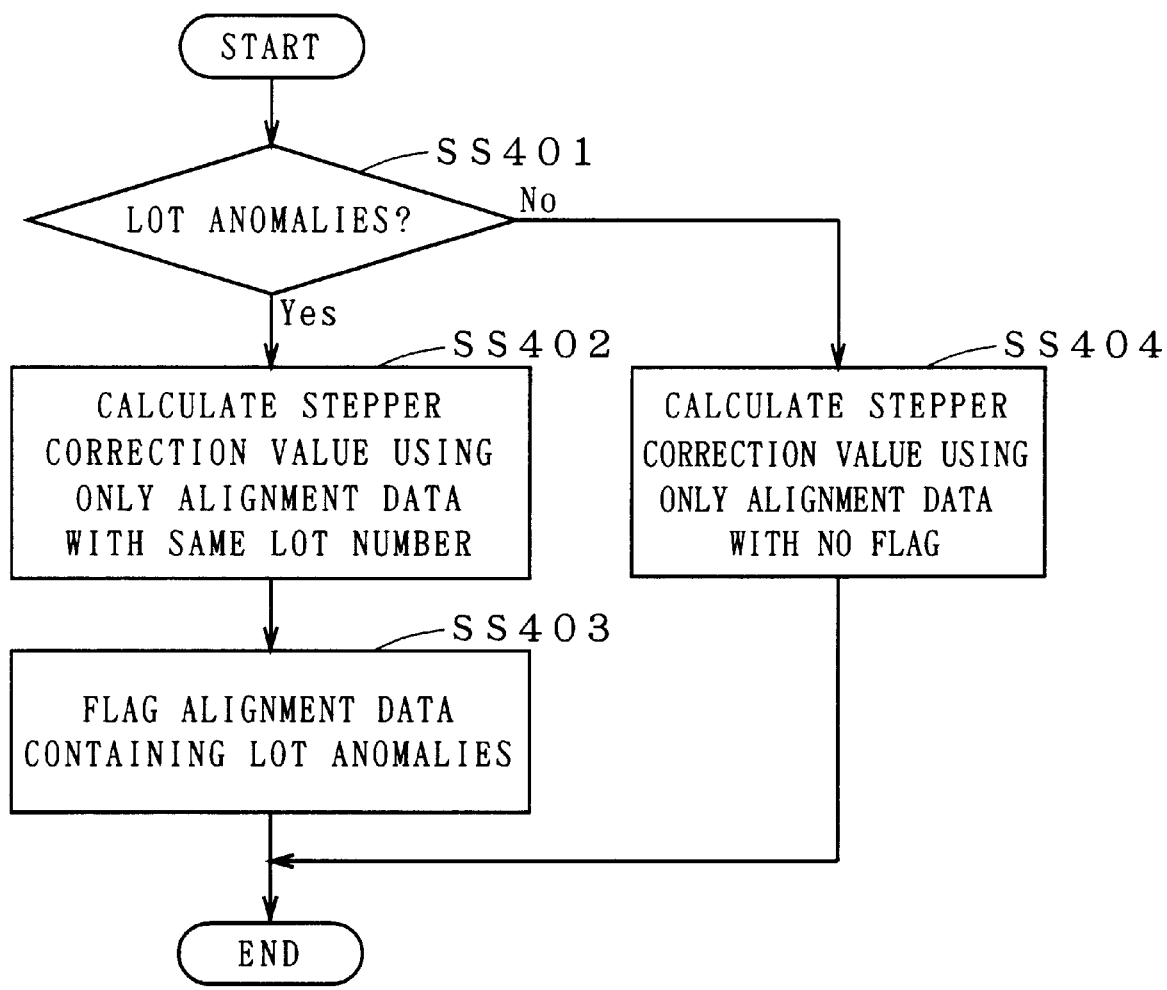

A fourth method of correcting alignment disclosed in Japanese Patent Application No. 9-151 which is performed by the production control system shown in FIG. 54 is described below with reference to the flowchart of FIG. 32. In Step SS401, the alignment correction unit 6a judges whether or not lot anomalies occur. If the lot anomalies occurs, the flow proceeds to Step SS402; otherwise the flow proceeds to Step S404. The third alignment correcting method described with reference to FIG. 31 is applied to the judgement in Step SS401. For instance, when the count of the lot anomalies is greater than a fixed value previously set by the operator, the alignment correction unit 6a judges that the lot anomalies occur in Step SS401. In Step SS402, the alignment correction unit 6a calculates the stepper correction value by using only the alignment data with the same lot number as the lot number of the wafer judged in Step SS401 as containing the lot anomalies. In Step SS403, the alignment correction unit 6a flags the alignment data with the same lot number as the lot number of the wafer judged in Step SS401 as containing the lot anomalies among the alignment data stored in the database 6b. In Step SS404, the alignment correction unit 6a calculates the stepper correction value by using only the alignment data with no flags. The stepper correction value is calculated in Steps SS402 and SS404 in the manner described with reference to FIG. 24. Another judgement is made in Step SS401 in addition to the above described judgement. More specifically, the operator previously stores the lot number of the wafer containing the lot anomalies in the database 6b. Then, the alignment correction unit 6a refers to the lot number stored by the operator to judge whether or not the lot anomalies occur.

If the cause of the out-of-specification shear is the lot anomalies, the alignment correction unit 6a calculates the stepper correction value to deal with the lot anomalies more speedily than the operator. Further, in the case of the judgement as the lot anomalies, the use of only the alignment data with the same lot number as the lot number of the wafer judged as containing the lot anomalies for calculation of the stepper correction value provides the proper correction value with increased alignment precision. On the other hand, in the case of the judgement that the cause is not lot anomalies, the use of only the alignment data with no flags for calculation of the stepper correction value provides the proper correction value.

Figure 33:
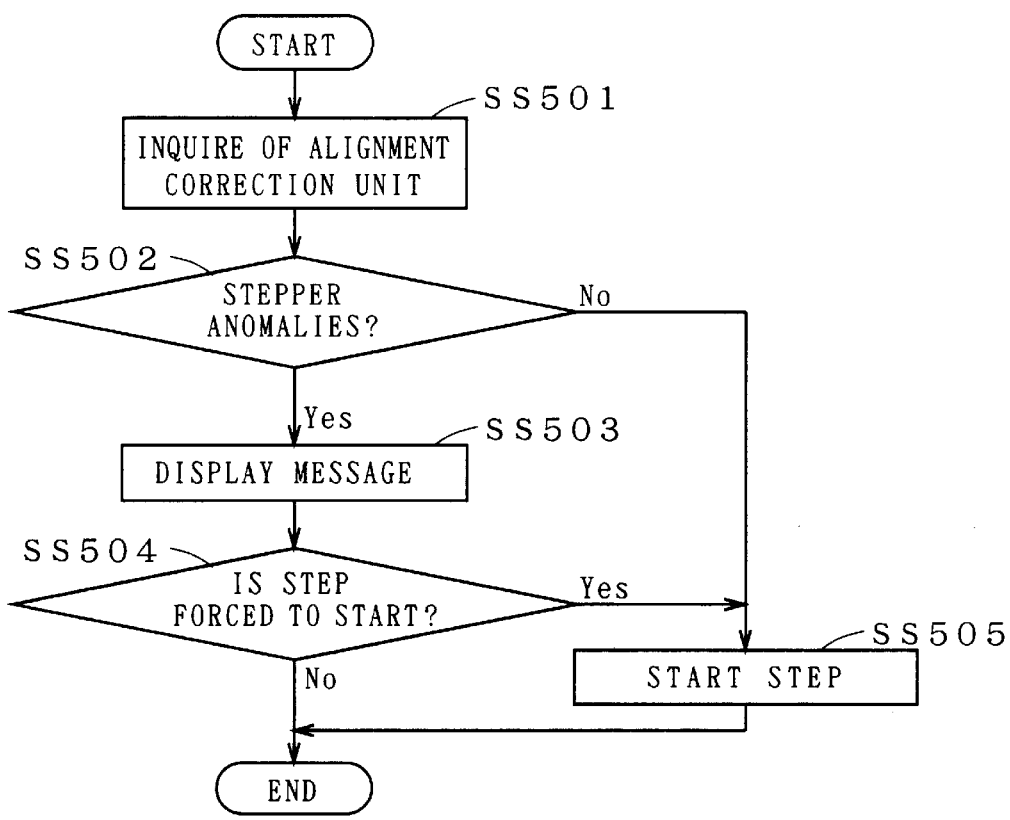

A fifth method of correcting alignment disclosed in Japanese Patent Application No. 9-151 which is performed by the production control system shown in FIG. 54 is described below with reference to the flowchart of FIG. 33. Mutual communications may be established between the alignment correction unit 6a and the plurality of steppers 4. In Step SS501, a stepper to be used in the next alignment inquires of the alignment correction unit 6a about whether or not the stepper itself contains or has contained the stepper anomalies before starting the step including the alignment. In Step SS502, the alignment correction unit 6a judges whether or not the stepper which inquired has contained stepper anomalies. The third alignment correcting method is applied to the judgement in step SS502. For instance, when the count of stepper anomalies listed in Table 2 is greater than a fixed value previously set by the operator, the alignment correction unit 6a judges in Step SS502 that the stepper anomalies are detected. If the stepper anomalies are detected, the flow proceeds to Step SS503; otherwise the alignment correction unit 6a gives permission to start the next step to the stepper.

In Step SS503, the alignment correction unit 6a outputs information about the stepper anomalies. For example, the alignment correction unit 6a displays a message stating that "starting the step is inhibited because of a stepper anomaly in the stepper" on the display screen of the reference terminal 8. In Step SS504, the operator selects whether to force the next step to start using the reference terminal 8. The message is erased when the operator selects to force the next step to start. Upon receipt of the operator's selection to force the next step to start, the alignment correction unit 6a gives permission to start the next step to the stepper, and the flow proceeds to Step SS505. When the operator does not select to force the next step to start, the processing is terminated without starting the next step. In Step SS505, the stepper does not start the next step until the stepper receives the permission to start the next step.

Another judgement is made in Step SS502 in addition to the above described judgement. More specifically, the operator previously stores the stepper code containing the stepper anomalies in the database 6b. Then, the alignment correction unit 6a refers to the stepper code stored by the operator to judge whether or not the stepper anomalies occur. The next step is not initiated if the stepper anomalies occur. This prevents a large number of out-of-specification semiconductor devices from being manufactured.

Figure 52:
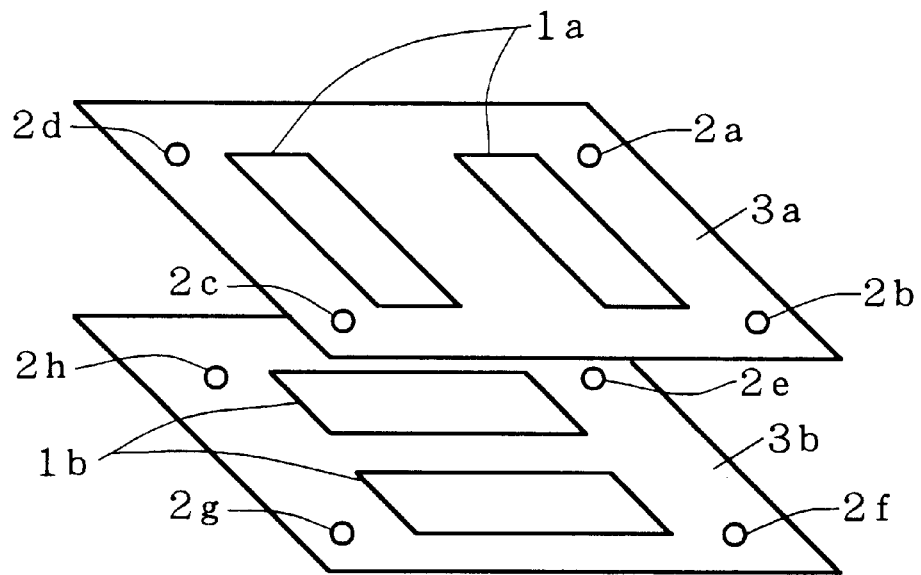
FIG. 52 illustrates alignment.

Semiconductor devices manufactured by the manufacturing line 10 of FIG. 54 are described below. The manufacturing line 10 of FIG. 54 forms semiconductor devices 21 having multilayer patterns (e.g., the patterns 1a and 1b shown in FIG. 52) on a wafer 20. The stepper correction value generated by any one of the first to fifth alignment correcting methods disclosed in Japanese Patent Application No. 9-151 is set in the stepper in the manufacturing line 10. The multilayer patterns of the semiconductor devices 21 are subjected to the alignment by the stepper in the manufacturing line 10 to provide higher alignment precision than those of the background art. The semiconductor devices 21 manufactured by the manufacturing line 10 are accordingly higher in reliability than those of the background art.

Although the alignment correction unit 6a is illustrated in FIG. 54 as one function of the production control system body 6, the alignment correction unit 6a may be provided exteriorly of the production control system body 6. For example, the alignment correction unit 6a may be an independent device which is capable of communicating with the production control system body 6. The correction values (the stepper correction value and the overlay checking correction value) may include X-Y orthogonality, offsets X and Y, scalings X and Y, wafer rotation, shot magnification, shot rotation, and the like in addition to the alignment offsets X and Y.

Figure 34:
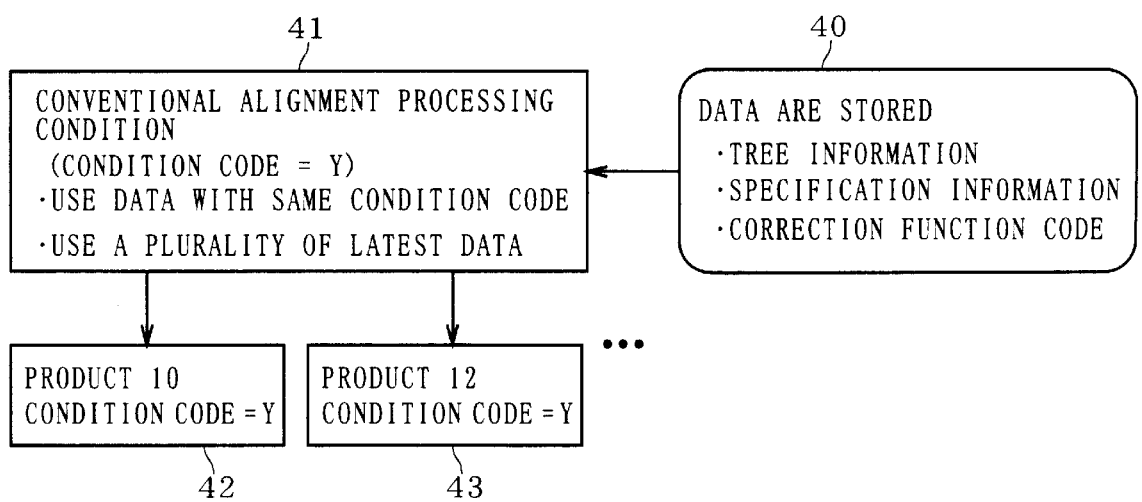
FIG. 34 conceptually shows a relationship between data in alignment control and alignment correction processing conditions for illustrating the background of the present invention.
Figure 53:
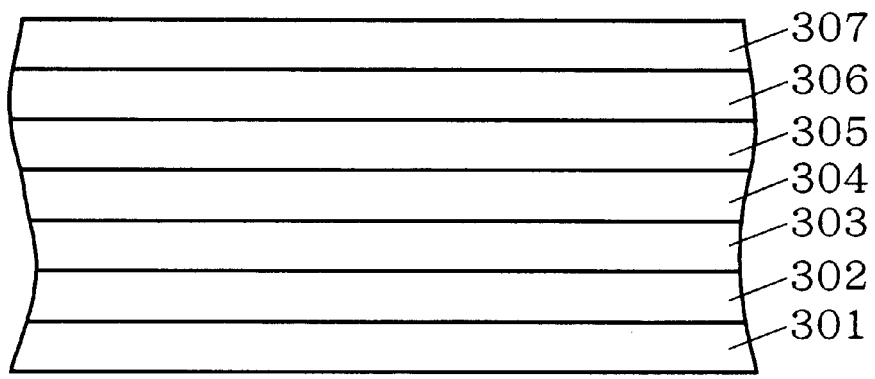
FIG. 53 is a conceptual sectional view of a semiconductor device.
Figure 61:
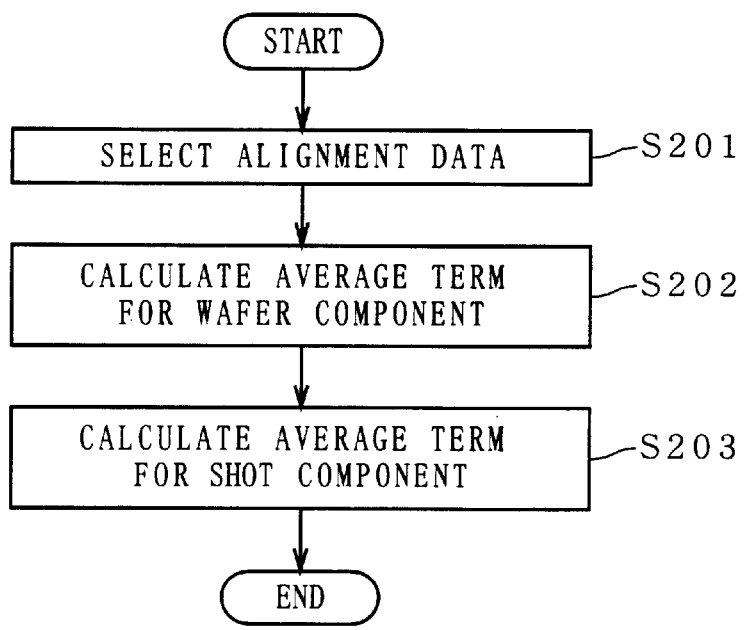
FIG. 61 is a flowchart showing a conventional procedure of the calculation of a predicted stepper correction value.
Figure 62:
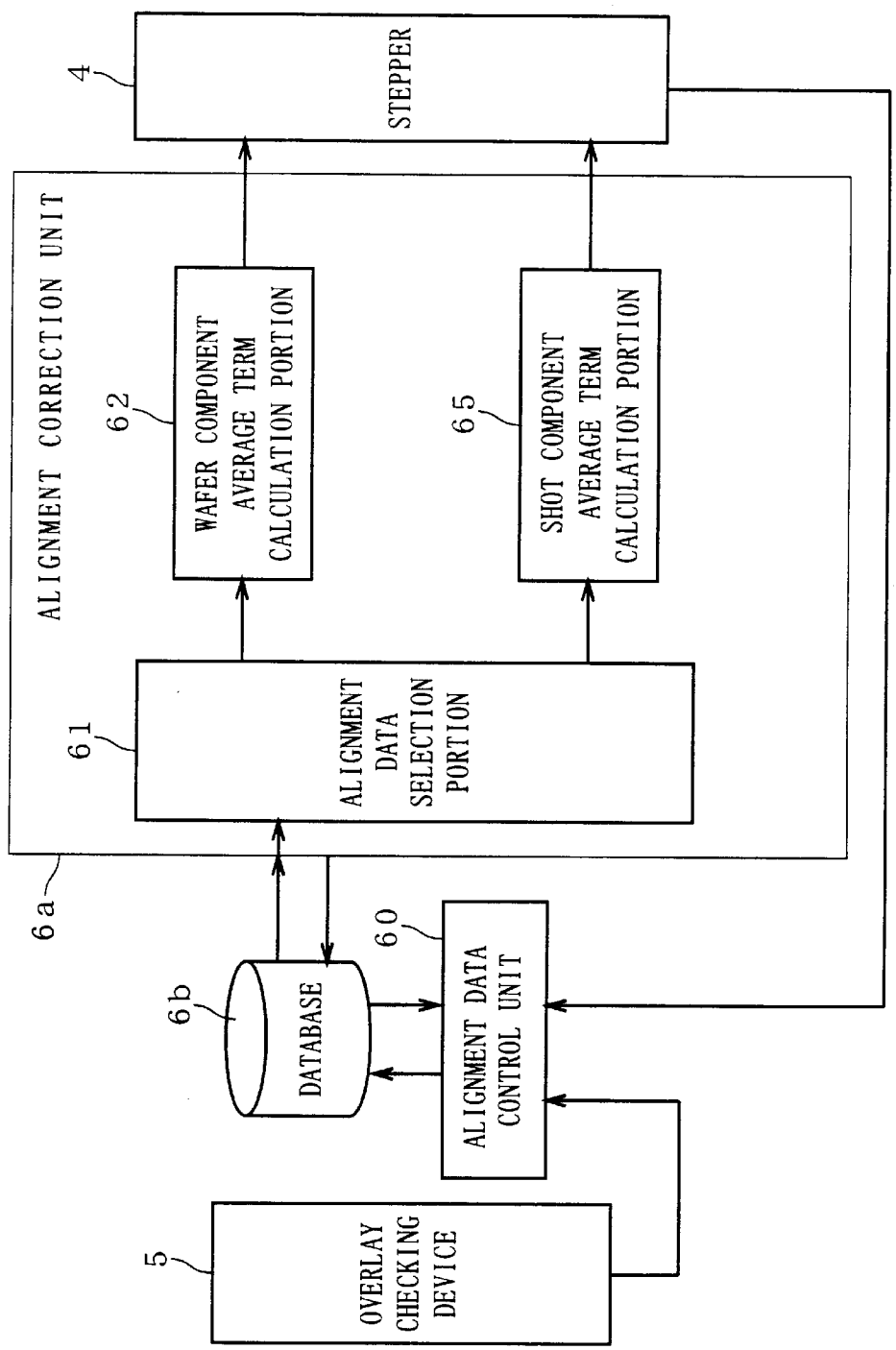
FIG. 62 is a block diagram of a conventional device for correcting alignment.

The above described semiconductor devices to be subjected to the alignment correction have been more complicated in construction and of more various types year after year. Accordingly, the production control system body 6 must control a year-after-year increasing number of data pertaining to alignment in the development and mass-production stages of the semiconductor devices. FIG. 34 conceptually illustrates the relationship between the data for alignment control and alignment correction processing conditions. For alignment control, it is necessary to previously store information indicative of the relationship between data to be processed by different steppers 4 and information indicative of the relationship between data about different products as data. To this end, data are initially stored in Step 40. The stored data include, for example, tree information, specification information, a correction function code and other information. The tree information specifies which two patterns are aligned with each other among the patterns 301 to 307 of FIG. 53. The presence of the tree information allows the alignment data about different products to be used for obtaining the predicted stepper correction value. The specification information is to define specifications and stepper types, and specifies the stepper types to be used, depending on the rank of alignment precision when designed. The correction function code is to set the term of availability and the maximum number of data. The correction function code is used to set the term of availability of data for use in calculating the predicted stepper correction value and the maximum number of the data. In Step 41, the alignment processing conditions are set in the form of a condition code Y. In Steps 42 and 43, products 10 and 12 which conform to the condition code Y are extracted. These processes are performed, for example, in Step S201 of FIG. 61 in which the alignment data are selected.

First Preferred Embodiment

Figure 35:
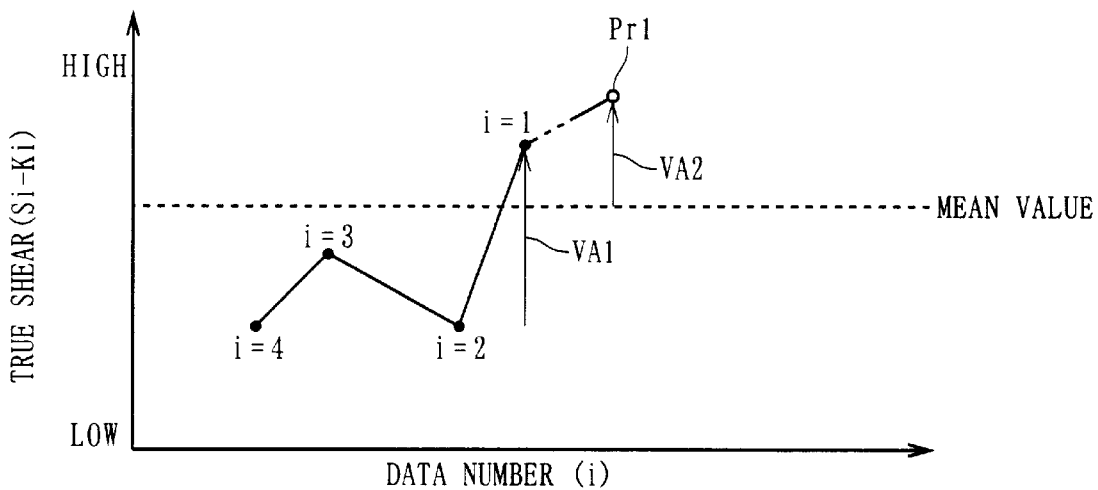
FIG. 35 is a graph illustrating the concept of the calculation of a predicted stepper correction value in a method of correcting alignment in accordance with a first preferred embodiment of the present invention.
Figure 60:
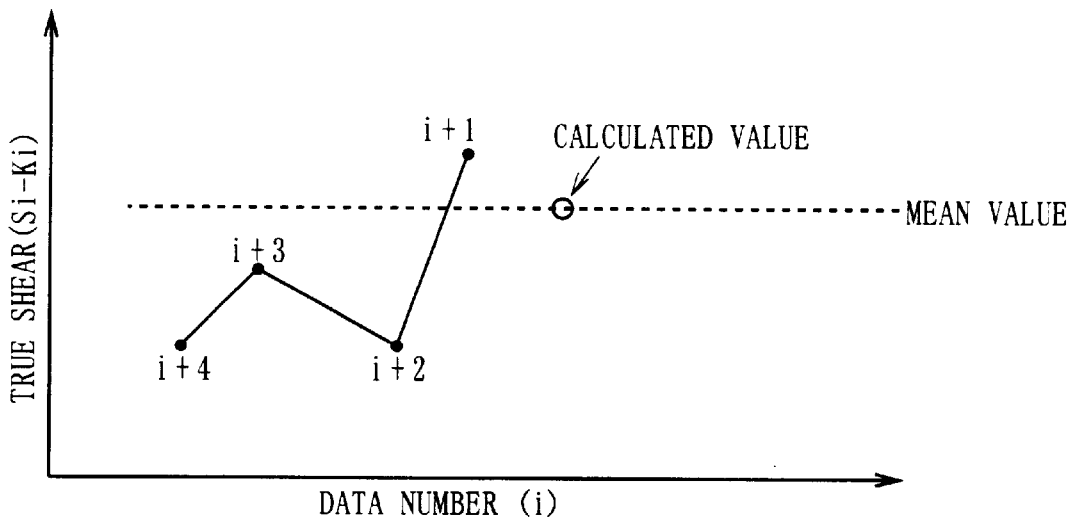
FIG. 60 is a graph showing an example of the conventional concept of the calculation for a stepper correction value for a wafer component.
Figure 63:
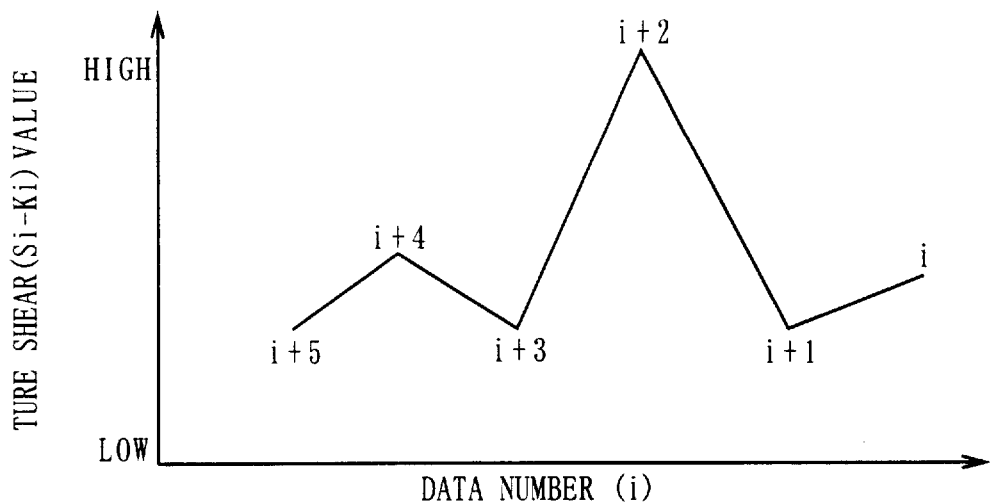
FIG. 63 is a graph illustrating the relationship between abnormal data and a true shear.
Figure 64:
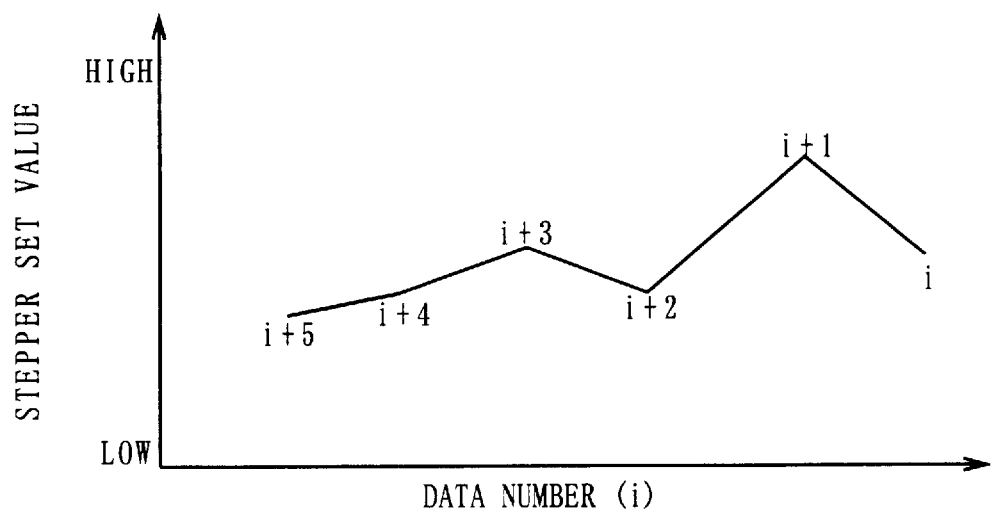
FIG. 64 is a graph illustrating a relationship between the abnormal data and the stepper set value.

A method of correcting alignment according to a first preferred embodiment of the present invention will now be described with reference to FIG. 35. FIG. 35 is a graph for illustrating the concept of the calculation of the predicted stepper correction value in the method of the first preferred embodiment. The record points of FIG. 35 corresponding to data numbers i=1 to 4 are stored in the database 6b of the production control system body 6, for example, in a manner similar to the data of FIGS. 60 and 63 with the data numbers i=1 to 4 and the record points φ1 to φX of FIGS. 25 through 28. The conventional predicted stepper correction value is the mean value of the true shears of the data with the data numbers i=1 to 4. The predicted stepper correction value of the first preferred embodiment is obtained by adding a variation multiplied by q to the mean value. That is, the predicted stepper correction value is represented by the point Pr1 of FIG. 35. The variation for determining the predicted stepper correction value of FIG. 35 is a difference in true shear between the data number i=1 and the data number i=2.

The above description is expressed using an equation. The conventional predicted stepper correction value is $$Sok=\Sigma\{(Sik-Kik)/n\} \quad (15)$$

where Sok is the predicted stepper correction value, Sik is the stepper correction value and Kik is the overlay checking correction value. The sum (Σ) is the value obtained by adding together the values enclosed in the braces { } where i equals one to n. The data number i is incremented by one from zero, where i=0 is assigned to the latest data. The character k which follows each of the variables represents the type of the stepper correction values including the offset X which is the correction value of the offset in the direction of the X-axis, the offset Y which is the correction value of the offset in the direction of the Y-axis, the scaling X which is the correction value of a ruler in the direction of the X-axis, the scaling Y which is the correction value of the ruler in the direction of the Y-axis, the orthogonality which is the correction value of the angles of the X- and Y-axes, the rotation which is the correction value of the rotation of an object to be processed, the shot rotation which is the correction value of the rotation of the reticle, and the magnification which is the correction value of a ratio between the reticle and an image.

Unlike the conventional predicted stepper correction value, the predicted stepper correction value Sok of the first preferred embodiment is $$Sok=\Sigma[(Sik-Kik)/n]+q\times[(S1k-K1k)-(S2k-K2k)] \quad (16)$$

The term (Sik−Kik)/n of Equation (16) is referred to as an average term, and the term q×[(S1k−K1k)−(S2k−K2k)] is referred to as a variable term.

Thus, the calculation of the predicted stepper correction value with the variable term reflected therein improves the alignment precision over the conventional alignment precision. The variable term is in general expressed in the form of Σqj×{(Sjk−Kjk)−[S(j+1)k−K(j+1)k]}, and the calculation may reflects not only the immediately preceding processing and the two-cycle previous processing but also processing prior to the two-cycle previous processing. In such a case, the value of the constant value qj may be individually set. The true shear difference used herein is preferably the immediately preceding true shear difference, but is not limited thereto.

Figure 36:
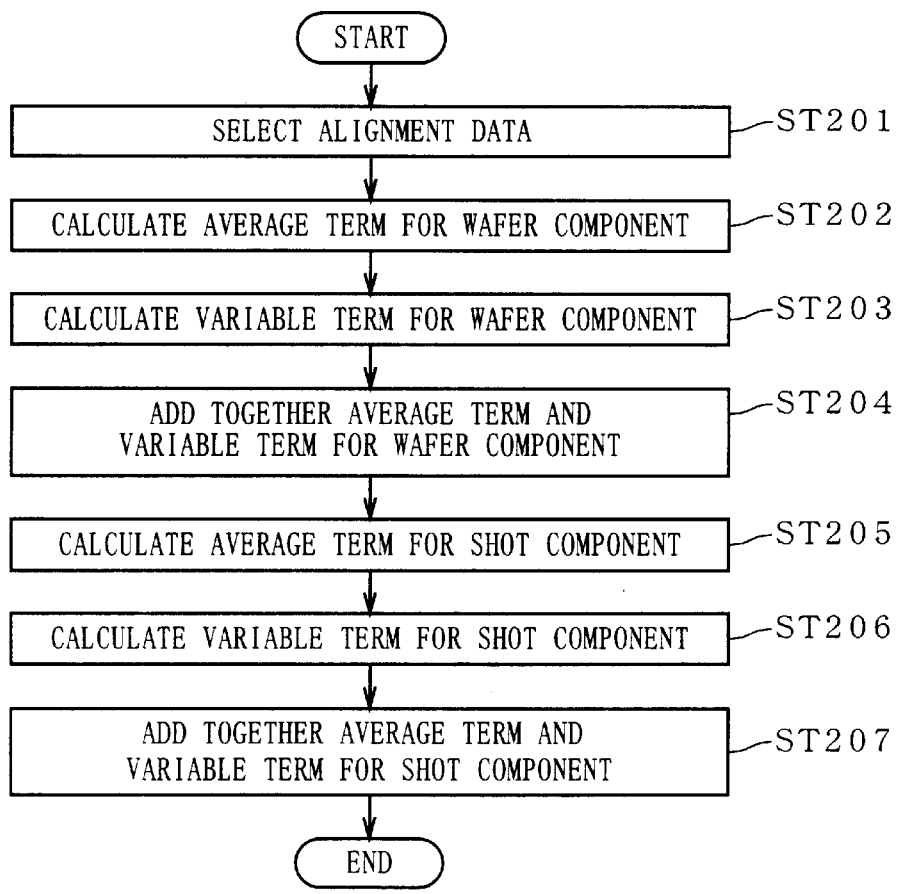
FIG. 36 is a flowchart showing the method of correcting alignment in accordance with the first preferred embodiment of the present invention.
Figure 37:
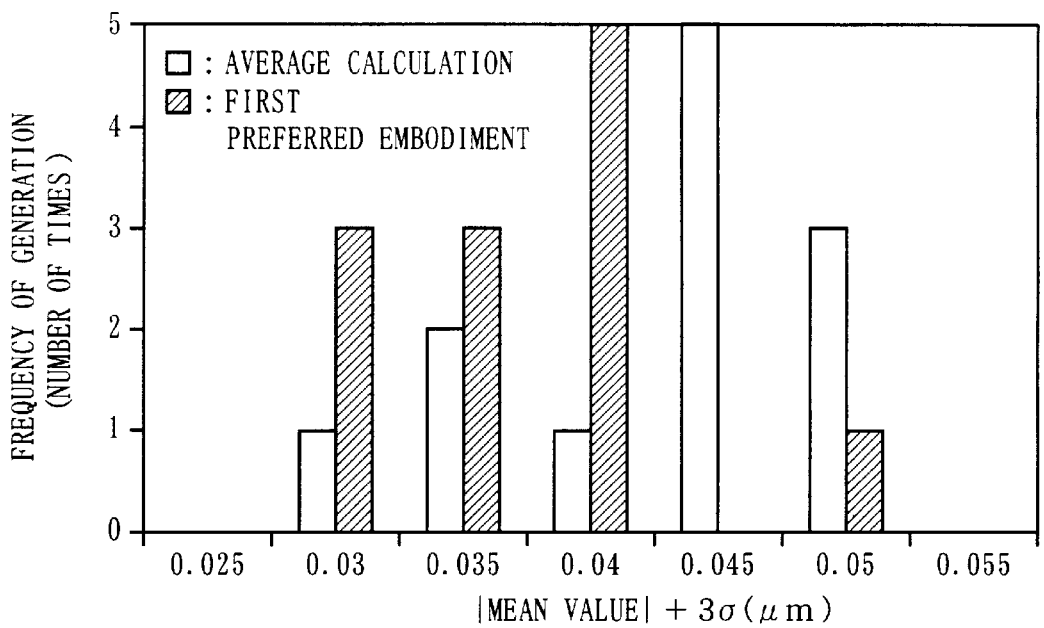
FIGS. 37 through 39 are graphs illustrating the method of correcting alignment in accordance with the first preferred embodiment of the present invention.

The procedure of the calculation of the predicted stepper correction value is described with reference to the flowchart of FIG. 36. Initially, suitable alignment data of the past are extracted from the database 6b in the conventional manner (Step ST201). In Step ST202, the average terms for the wafer components are calculated. Specifically, calculated in Step ST202 are the respective average terms for the stepper correction values for the wafer components, that is, the offsets X and Y (baseline), the scalings X and Y, the X-Y orthogonality, and the wafer rotation. In Step ST203, the variable terms for the wafer components are calculated. Specifically, calculated in Step ST203 are the respective average terms for the above-mentioned stepper correction values for the wafer components. Next, the variable terms are added to the average terms for the wafer components to calculate the predicted stepper correction values for the respective wafer components (Step ST204). Then, the value Sok of Equation (16), which is each of the stepper correction values for the wafer components, is determined.

The average terms for the shot components are calculated in the same manner as the calculation of the predicted stepper correction values for the wafer components (Step ST205). Specifically, calculated in Step ST205 are the respective average terms for the stepper correction values for the shot components, that is, the shot rotation and the magnification. In Step ST206, the variable terms for the shot components are calculated. Specifically, calculated in Step ST206 are the respective average terms for the above-mentioned stepper correction values for the shot components. Next, the variable terms are added to the average terms for the shot components to calculate the predicted stepper correction values for the respective shot components (Step ST207). Then, the value Sok of Equation (16), which is each of the stepper correction values for the shot components, is determined.

The calculation of the average terms for the shot components (Step ST205) and the calculation of the variable terms therefor (Step ST207) may be made in the separate cases where the overlay checking result of a leading pattern is present and where the same is absent. The leading pattern is, for example, a lower pattern used for description about the shot rotation, and means a pattern which has already been processed prior to a pattern being calculated and which serves as a reference for calculation of the correction value. For instance, for the calculation of the predicted stepper correction value for a lowermost one of a plurality of layers, there is no leading pattern, and thus the overlay checking result is absent. For example, for the calculation of the predicted correction value for the shot component for a second layer based on the pattern of the first layer, the overlay checking result of the first layer is used as the overlay checking result of the leading pattern.

When the overlay checking result of the leading pattern is present, Equation (16) may be transformed into $$Sok = UV - \{\Sigma(PVi)/n + q \times (PV1 - PV2)\} \quad (17)$$

where UV is a lower-pattern correction, and PVi is an i-th step-variation. The lower-pattern correction is the concept corresponding to the above-mentioned lower-pattern rotation, and the step-variation is the concept corresponding to the above-mentioned step-rotation. The lower-pattern correction and the step-variation are wide concepts used for the stepper correction values for other than shot rotation.

When the overlay checking result of the leading pattern is absent, Equation (16) may be transformed into $$Sok = UA - \{\Sigma(PAi)/n + q \times (PA1 - PA2)\} \quad (18)$$

where UA is a lower-pattern variation, and PAi is the true shear of an i-th shot component.

The average terms are $\Sigma(PVi)/n$ of Equation (17) and $\Sigma(PAi)/n$ of Equation (18). The variable terms are $q \times (PV1-PV2)$ of Equation (17) and $q \times (PA1-PA2)$ of Equation (18). The result of calculation of Equation (17) or (18) is finally obtained in Step ST207. It will be understood from comparison between FIGS. 36 and 61 that the calculation of the variable terms is added to the conventional calculation of the predicted stepper correction value. The improvement of the alignment precision by the addition of the variable terms will be readily shown by producing the graph of FIG. 37, for example. The horizontal axis of the graph of FIG. 37 indicates the value (|mean value|+3σ) as an index of the alignment precision where σ is a standard deviation. When there is no shear, (|mean value|+3σ) equals zero. For example, the frequency of generation at 0.04 on the horizontal axis is the frequency of generation of the lots having measurements which fall within the range 0.035<(|mean value|+3σ)≦0.04. These lots may differ in the stepper 4 to be processed thereby and in the product types, but are regarded as being subjected to the stepper processing on the same conditions. Constructing such a graph allows the recognition of the improvement in alignment precision by the addition of the variable terms since the adoption of the method of correcting alignment of the first preferred embodiment provides high frequency of generation shifted leftwardly on the graph.

Figure 38:
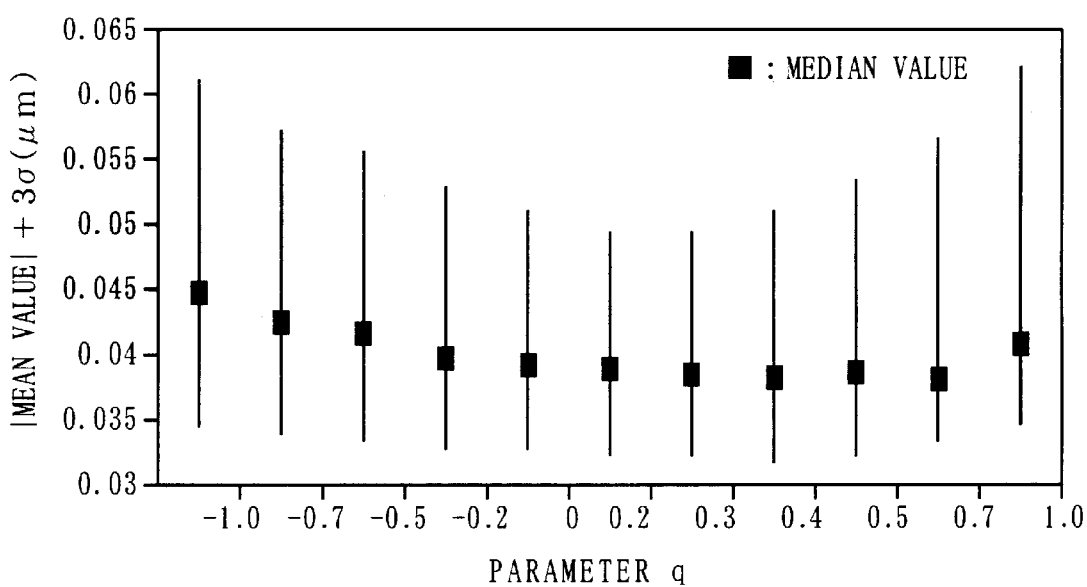

A process for setting the value of the parameter q in Equations (16) to (18) will be discussed below. FIG. 38 is a graph showing the relationship between the value of the parameter q in Equations (16) to (18) and the alignment precision. The median value of (|mean value|+3σ) and its distribution are measured, with the value of the parameter q varied within a range from −1.0 to 1.0, to derive the value of the parameter q which minimizes the variations in the true shear. In the case shown in FIG. 38, the median values are substantially constant in the ranges q=−0.2 to 0, q=0 to 0.2 and q=0.2 to 0.3, and the variation in the true shear is minimized when q=0 to 0.2. It is hence derived that the use of a value which satisfies q=0 to 0.2 is proper in Equations (16) and (17).

Figure 39:
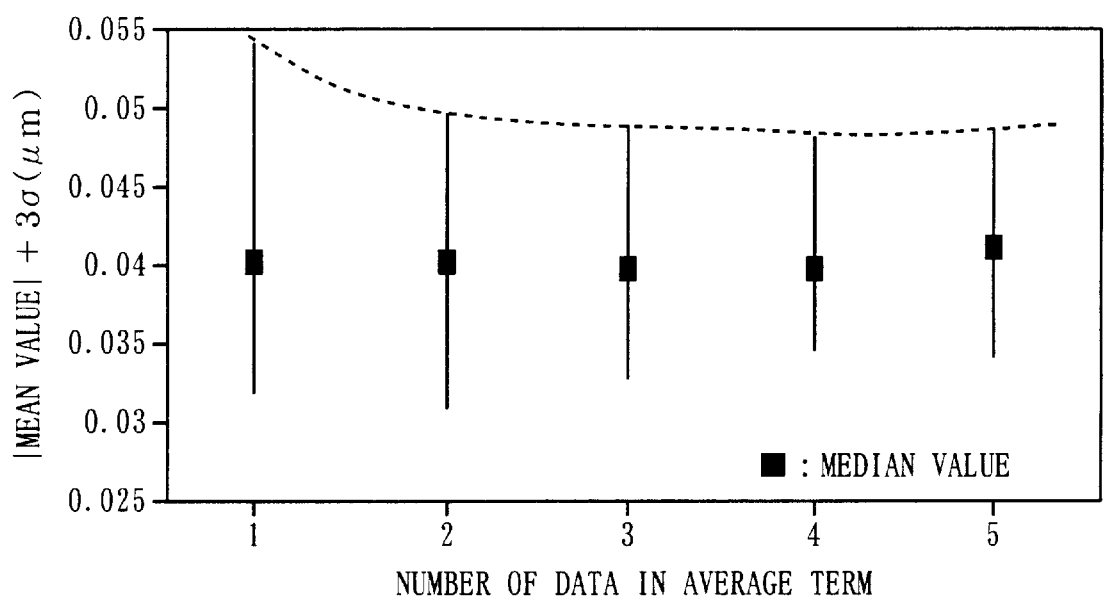

The number n of data for use in the calculation of the average term is discussed below with reference to FIG. 39. FIG. 39 is a graph showing the relationship between the number n of data in the average term and the alignment precision (|mean value|+3σ). It will be found from the graph that as the number n of data increases, the effect of improvement in the alignment precision increases and the degree of the improvement is saturated in the course of time. In the graph of FIG. 39, n=1 means that one sample datum is used as it is. As also shown in the graph of FIG. 39, it is experimentally known that a tendency to the saturation appears when the number n of data is not less than three. Thus, the number n of data is preferably less than three. The number n of data is preferably smaller in consideration for the speed of calculation, and is determined based on the relationship between the time required for calculation and the alignment precision.

Figure 40:
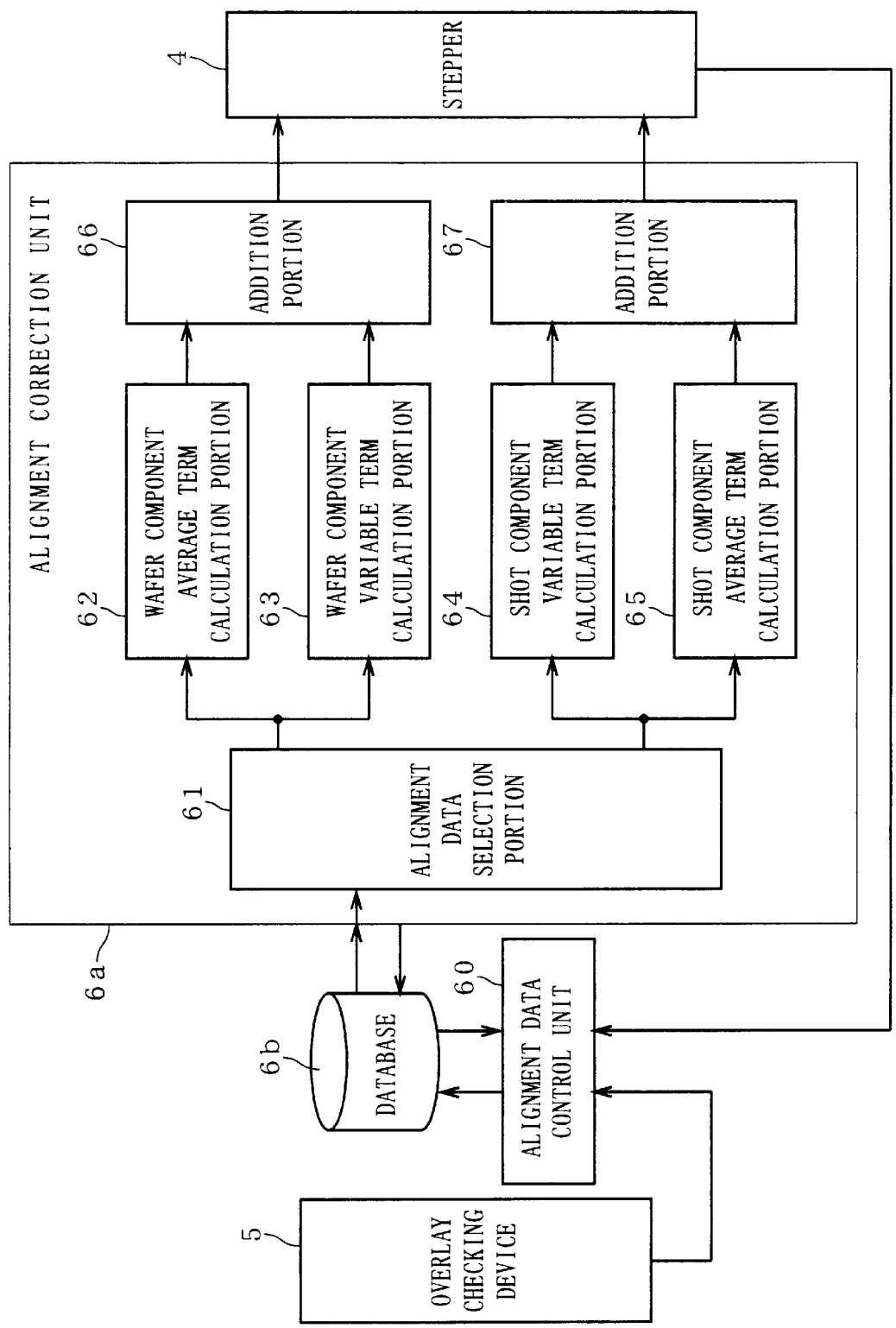
FIG. 40 is a block diagram of a device for correcting alignment in accordance with the first preferred embodiment of the present invention.

FIG. 40 is a block diagram of a device for correcting alignment according to the first preferred embodiment of the present invention. An alignment data control unit 60 produces the alignment data from the result of the overlay checking performed in the overlay checking device 5 to store the alignment data in the database 6b. The alignment correction unit 6a uses the alignment data stored in the database 6b to calculate the predicted stepper correction value. The alignment correction unit 6a outputs the calculated predicted stepper correction value to the stepper 4.

The operation of portions of the alignment correction unit 6a for calculation of the predicted stepper correction value will be discussed below. An alignment data selection portion 61 selects data for use in the calculation of the predicted stepper correction value by using, for example, tree information. The alignment data selection portion 61 outputs data associated with the wafer component among the selected data to a wafer component average term calculation portion 62 and a wafer component variable term calculation portion 63, and outputs data associated with the shot component to a shot component average term calculation portion 65 and a shot component variable term calculation portion 64. The wafer component average term calculation portion 62 calculates the average term of Equation (16), that is, the mean value of true shears for a predetermined number of lots. The wafer component variable term calculation portion 63 calculates the variable term of Equation (16), that is, the product of a predetermined proportionality constant and the difference in true shear, for example, between the lot processed immediately previous to the current lot and the lot processed two-cycle previous to the current lot. An addition portion 66 adds together the output from the wafer component average term calculation portion 62 and the output from the wafer component variable term calculation portion 63 to output the result of the addition as the predicted stepper correction value to the stepper 4.

Likewise, the shot component average term calculation portion 65 calculates the average term of Equation (16), that is, the mean value of true shears for a predetermined number of lots. The shot component variable term calculation portion 64 calculates the variable term of Equation (16), that is, the product of a predetermined proportionality constant and the difference in true shear, for example, between the lot processed immediately previous to the current lot and the lot processed two-cycle previous to the current lot. An addition portion 67 adds together the output from the shot component average term calculation portion 65 and the output from the shot component variable term calculation portion 64 to output the result of the addition as the predicted stepper correction value to the stepper 4.

Figure 41:
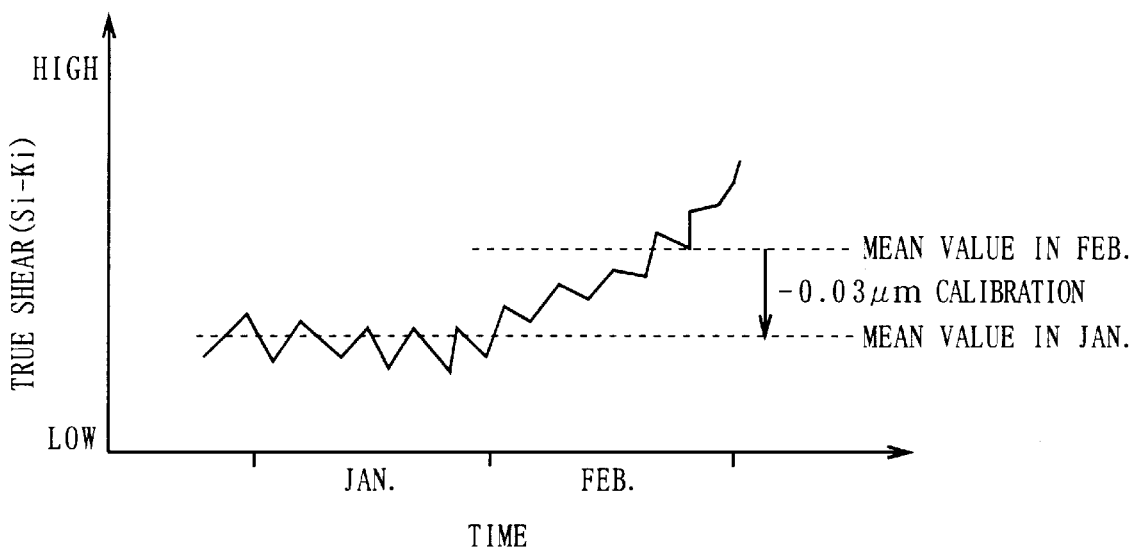
FIG. 41 is a graph showing a conventional tendency of variations in a true shear.
Figure 42:
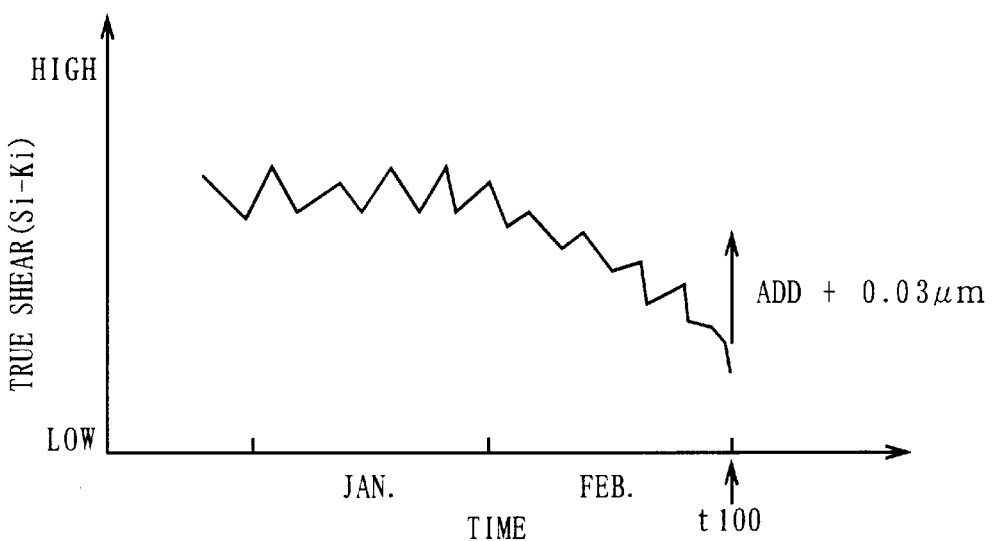
FIG. 42 is a graph showing a tendency of variations in a true shear in accordance with the present invention.

The control of the stepper 4 according to the first preferred embodiment of the present invention is described below. For control of the stepper 4, the same product serving as a reference is subjected to the stepper processing and the processed product is subjected to the overlay checking measurement at predetermined regular time intervals, e.g., every day, every week and/or every month. The same product which has been subjected to the stepper processing and the overlay checking measurement is resist-removed for exposure again. Such an operation is repeated at regular time intervals to store data for controlling the stepper 4. FIG. 41 shows an example of true shears obtained through such repetitive operations. As shown in FIG. 41, the mean value in February is deviated by +0.03 μm from the mean value in January. Then, bringing the stepper 4 at the end of February back into the same state as in January involves the need to set a calibrating function for the stepper 4 at −0.03 μm. Such setting allows the stepper 4 at the beginning of March to be in the same state as in January. However, when the alignment correcting function of the first preferred embodiment is in normal operation, a feedback function should operate on the −0.03 μm variation of the stepper 4 to follow the variation substantially automatically. The sole use of the calibrating function of the stepper 4, however, causes a +0.03 μm gap at the beginning of March (time t100) as shown in FIG. 42, resulting in some true shears which are out of specifications of the overlay checking. In other cases, such calibration might deteriorate the alignment precision. To prevent these disadvantages, the calculation for correction is reset at the beginning of March (time t100) as shown in FIG. 42. Further, the sum of a stepper calibration value and the stepper correction value at the end of February is set as a new initial value in the stepper 4.

Figure 43:
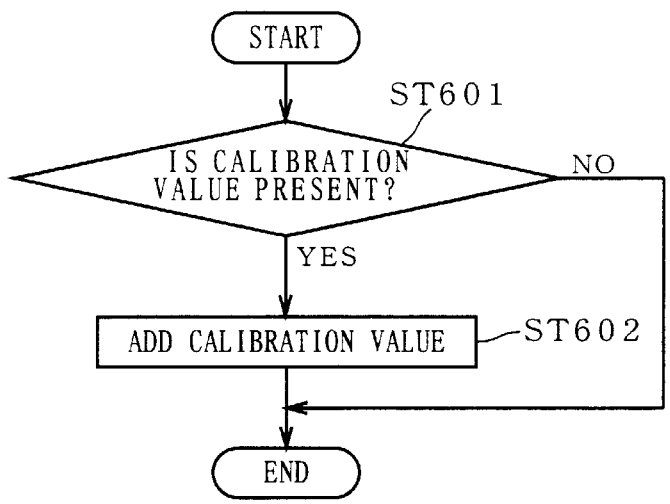
FIG. 43 is a flowchart showing the procedure of a method of calibration in accordance with the first preferred embodiment.
Figure 56:
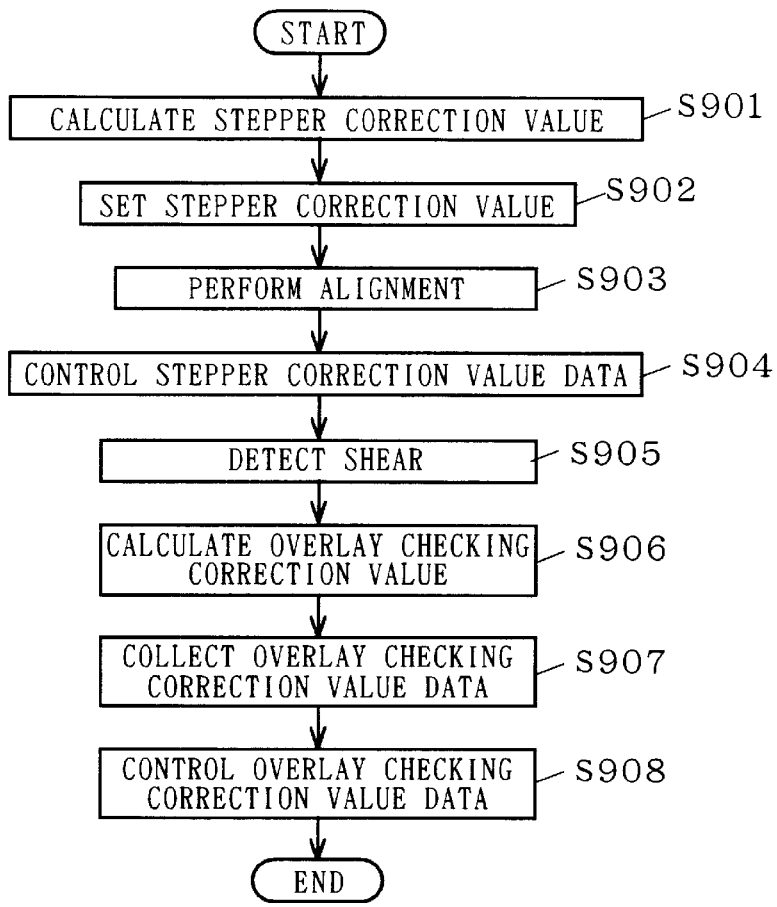
FIG. 56 is a flowchart showing a conventional method of correcting alignment.
Figure 57:
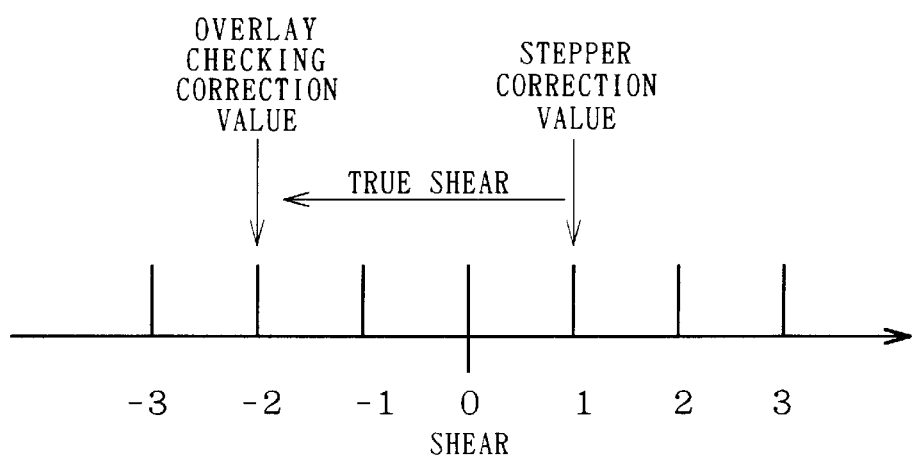
FIGS. 57 through 59 illustrate the conventional method of correcting alignment.
Figure 58:
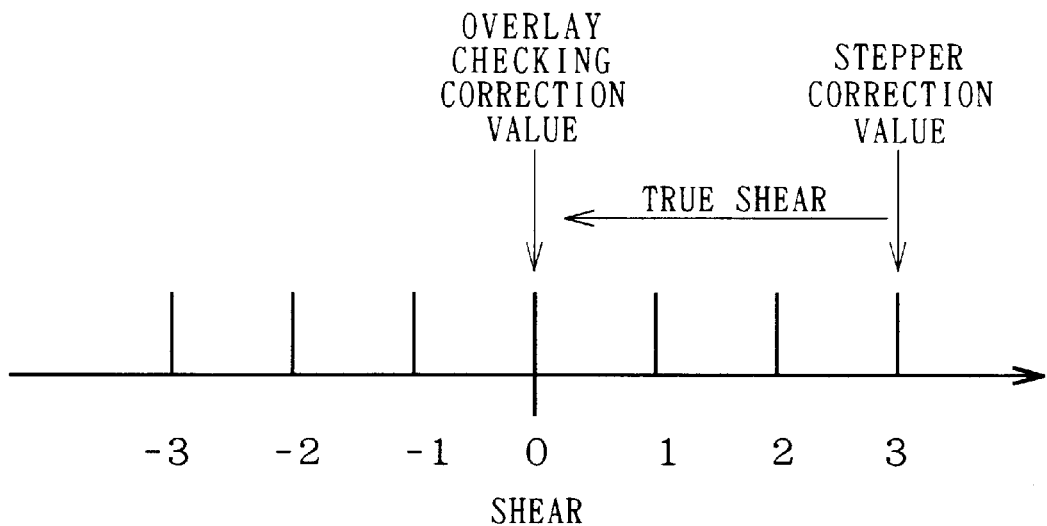
Figure 59:
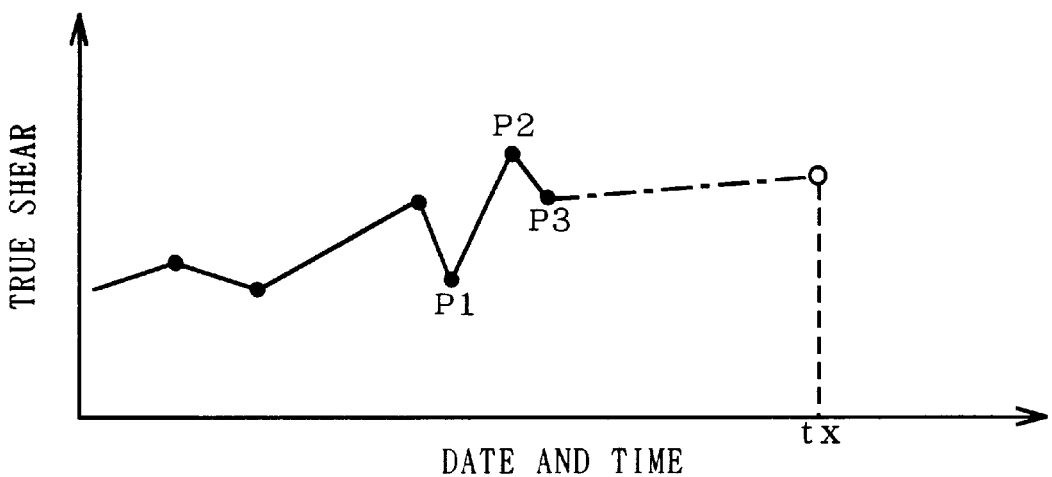

FIG. 43 is a flowchart showing the procedure of this calibration method. This method is carried out at the end of Step S901 of FIG. 56. In Step ST601 of FIG. 43, the presence or absence of the stepper calibration value in the database 6b is judged. If the stepper calibration value is present in the database 6b, the flow proceeds to Step ST602; otherwise the processing is terminated without executing Step ST602. In Step ST602, using the stepper calibration value in the database 6b, the calculation expressed as $$\text{predicted stepper correction value} = \text{stepper calibration value} + \text{predicted stepper correction value} \quad (19)$$

is performed. The predicted stepper correction value for use in Equation (19) is that determined before the calibrating calculation.

The stepper calibration value also contains a wafer component and a shot component. A calibrating calculation completion flag is inputted in the same list as the alignment data. Specifically, the flagged alignment data indicate data subjected to the calibrating calculation. A calibration value and the date and time when the calibration value was inputted are recorded in the flag. This information is used in selecting alignment data in Step S201 of FIG. 61 and in Step ST201 of FIG. 36. The flag is used to prevent data subjected to different calibrating calculations from being present in the calculation of the predicted stepper correction value. The data with the same calibrating calculation completion flag are selected in the calculation of the predicted stepper correction value.

The addition of the processing shown in FIG. 43 achieves sufficient alignment control independently of whether or not the alignment correcting function is used. In other words, the function shown in FIG. 43 may eliminate the process of taking into consideration the stepper calibration value to change the predicted stepper correction value for the products manufactured by the stepper 4 which does not use the alignment correcting function.

Second Preferred Embodiment

Figure 44:
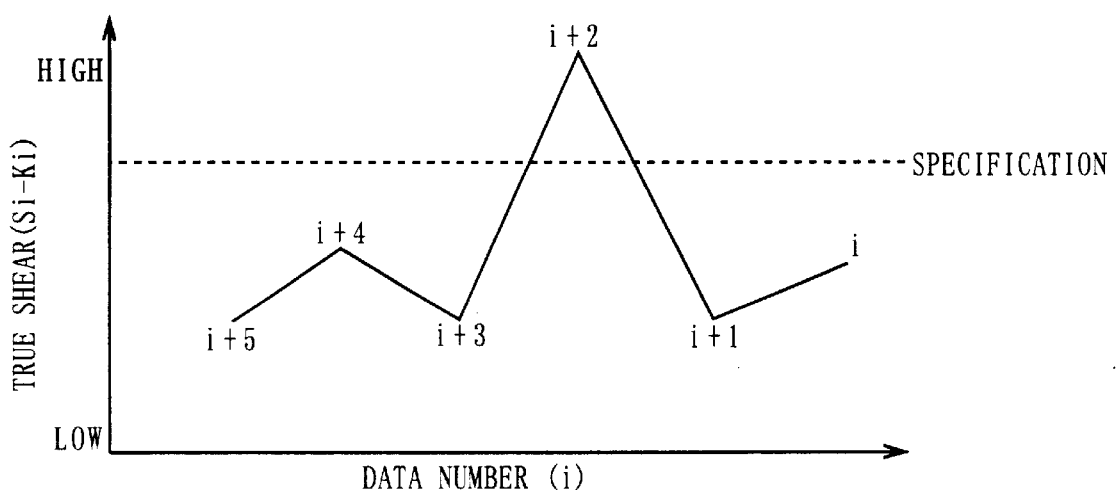
FIG. 44 is a graph showing a relationship between the sequence of processed lots and the true shear thereof.

The method of correcting alignment according to a second preferred embodiment of the present invention will now be described. FIG. 44 is a graph showing the relationship between the sequence of processed lots and the true shear of the lots. The data shown in the graph of FIG. 44 are, for example, those selected through the same step as Step ST201 of FIG. 36 and the like. The true shear for the data number i+2 shown in FIG. 44 is much greater than the true shears for other data numbers. This is estimated to result from a malfunction of the stepper 4, an error of measurement in the overlay checking device 5, a misoperation of the operator, or the like. The direct use of the true shear for the data number i+2 for calculation of the predicted stepper correction value causes the stepper set values for the data numbers i and i+1 to exceed an optimum stepper set value as indicated by the solid lines of FIG. 45, resulting in a stronger likelihood that the data with the data numbers i and i+1 are also out of specifications as well as the data with the data number i+2. Operator's misoperation or the like causing such great deviation of the values exerts a significant influence upon the calculation of the predicted stepper correction value because of its transient and high-value properties, and is commonly not repeated for the next lot. For this reason, the additional use of such data for the calculation of the predicted stepper value results in a stronger likelihood of the deterioration of the alignment precision and accordingly a stronger likelihood of the out-of-specification true shears as shown by the solid lines of FIG. 46.

Figure 47:
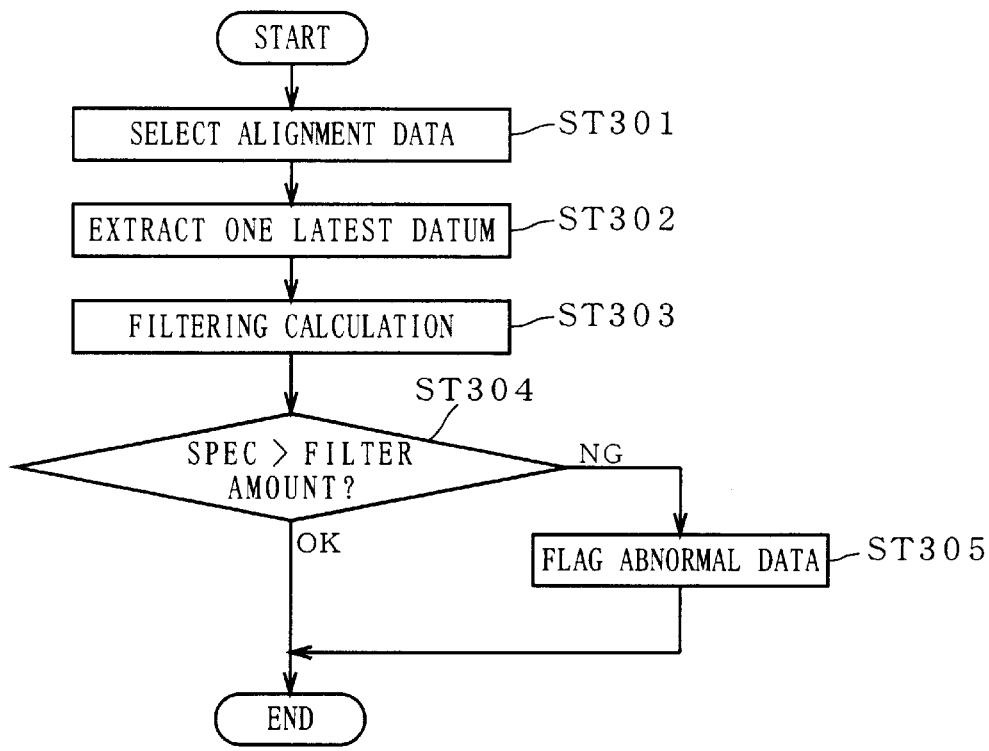
FIG. 47 is a flowchart showing the procedure of the method of correcting alignment in accordance with a second preferred embodiment of the present invention.

The method of correcting alignment according to the second preferred embodiment calculates the predicted stepper correction value without using abnormal data such as those with the data number i+1 shown in FIG. 44. FIG. 47 is a flowchart showing the procedure of the method of correcting alignment according to the second preferred embodiment. The processing shown in FIG. 47 is carried out at the end of Step S908 of FIG. 56. Initially, in Step ST301, data are selected in a manner performed in Step ST201 of FIG. 36. Next, in Step ST302, a latest one of the selected data is extracted. The latest data are the newest among groups of selected data for use in the calculation of the predicted stepper correction values, respectively. In Step ST302, the calculation expressed as $$\text{filter amount} = \text{true shear immediately after overlay checking} - \text{immediately preceding true shear} \quad (20)$$

is performed where the immediately preceding true shear is the datum extracted in Step ST302. In Step ST304, a comparison and judgement is made between the filter amount obtained by calculating Equation (20) in Step ST303 and a predetermined specification value. For example, if the specification value is greater than the filter amount, the result of judgment is acceptable (OK). On the other hand, if the specification value is not greater than the filter amount, the result of judgement is unacceptable (NG). When the result is judged as unacceptable, the flow proceeds to Step ST305, and a flag indicative of the unacceptable judgment result is inputted in the same list as the true shear immediately after the overlay checking. This indicates that the data about the true shear with the flag is unacceptable as the result of judgment. The data with such a flag is set so as not to be selected, for example, in Step ST201 of FIG. 36. Such setting may provide a filtering function for removing abnormal data.

Figure 45:
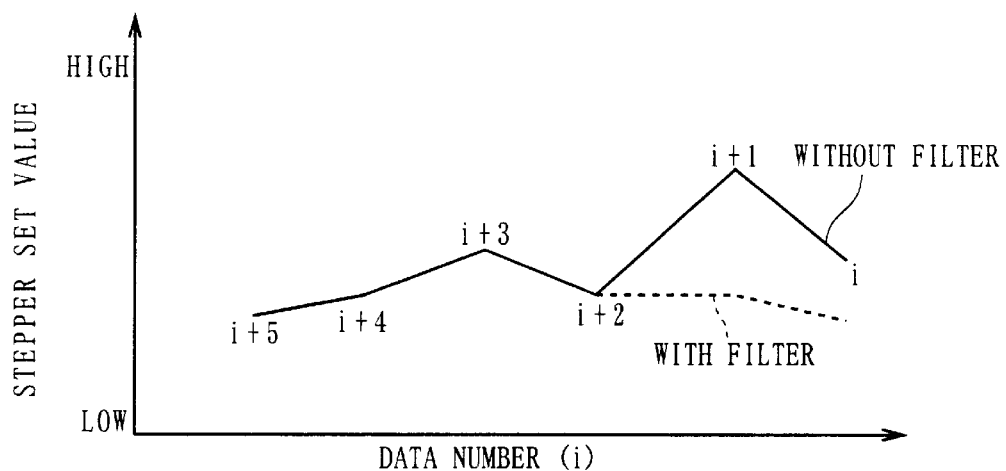
FIG. 45 is a graph illustrating a relationship between abnormal data and a stepper set value.
Figure 46:
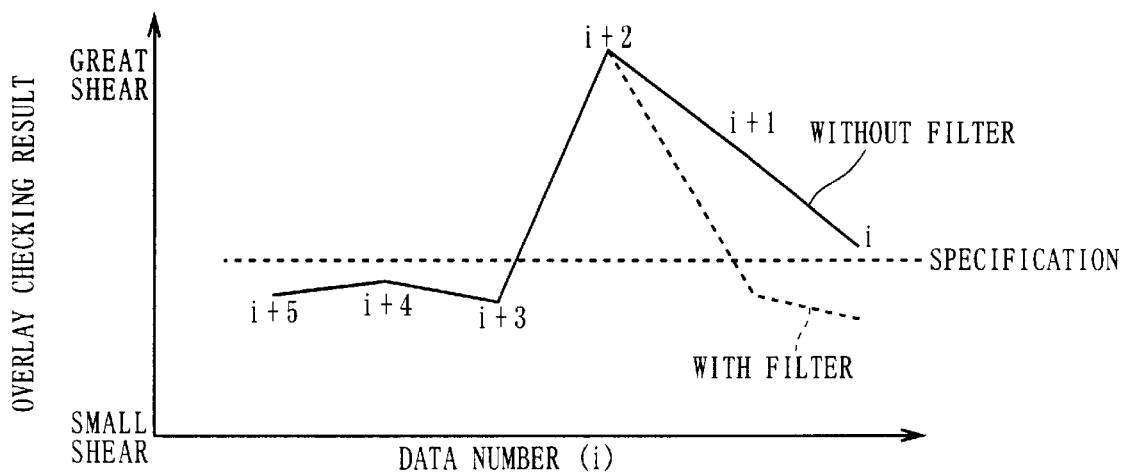
FIG. 46 is a graph illustrating a relationship between the abnormal data and an overlay checking result.

The stepper set value and the overlay checking result when such a filtering function is applied are shown by the broken lines of FIGS. 45 and 46. The application of the filtering function eliminates the data with the data number i+2 from the data for use in the calculation to prevent the data with the data number i+2 from being reflected in the predicted stepper correction value. This prevents the stepper set value from being greater than necessary and increases the likelihood that the overlay checking result falls within specifications. In other words, the addition of the filtering function to the conventional method of correcting alignment increases and improves the alignment precision.

The specification value for eliminating the abnormal data about true shears is set to the various overlay checking results for the wafer component and for the shot component. The specification value may be set to all of the overlay checking results or to a particular overlay checking result. In particular, the addition of the filtering function for the offsets X and Y among the wafer components is effective in eliminating abnormal data.

Third Preferred Embodiment

Figure 48A:
FIGS. 48A and 48B are a timing chart showing the progress of the processing of two products.
Figure 48B:
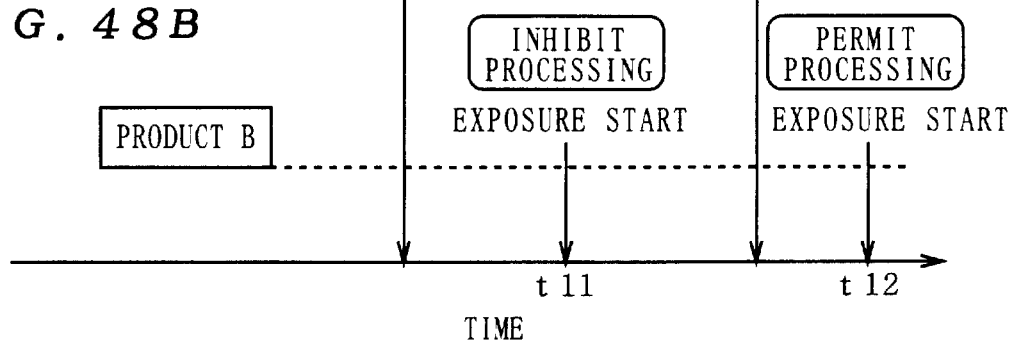

The method of correcting alignment according to a third preferred embodiment of the present invention will now be described with reference to FIGS. 48 and 49. FIGS. 48A and 48B are a timing chart showing the course of processing of a product A and a product B. Exposure limitation is discussed with reference to FIGS. 48A and 48B. It is assumed that the product A is processed by the stepper 4, following which the product B is processed by the stepper 4. The data about the products A and B are classified into the same group when selected, for example, in Step S201 of FIG. 61 and in Step ST201 of FIG. 36. For exposure of the product B after the completion of the exposure of the product A, there are two cases where the exposure of the product B is initiated at a point of time (time t11) prior to the completion of the overlay checking of the product A and where the exposure of the product B is initiated at a point of time (time t12) after the completion of the overlay checking of the product A. The exposure limitation is to inhibit the exposure of the product B prior to the completion of the overlay checking of the product A (at the time t11) and to permit the exposure of the product B after the completion of the overlay checking of the product A (at the time t12). Such exposure limitation allows the exposure of the product B to necessarily employ the latest alignment data to increase the likelihood of the improvement in the alignment precision, thereby reducing the likelihood that when the product A is out of specifications, the product B is also out of specifications because the alignment data about the product A is not available.

Figure 49:
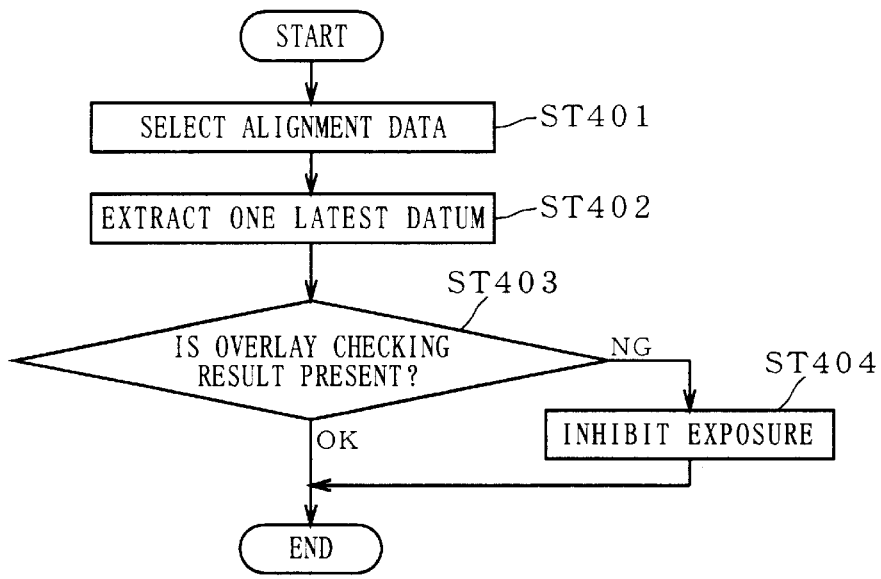
FIG. 49 is a flowchart showing the procedure of exposure limitation in the method of correcting alignment.

FIG. 49 is a flowchart showing the procedure of the exposure limitation in the method of correcting alignment of the third preferred embodiment. Step ST401, similar to the steps ST201 and ST301 of the first and second preferred embodiment, is the step of selecting the alignment data. In Step ST402 following Step ST401, a latest one of the selected alignment data is extracted. Step ST402 is similar to Step ST302 except that the datum to be extracted and used is the overlay checking completion flag added to the alignment data. The overlay checking completion flag is inputted, for example, in Step S908 of FIG. 56. In Step ST403, whether the overlay checking completion flag is present or absent is judged. If the overlay checking completion flag is not added to the alignment data, processing inhibition information indicative of exposure inhibition is outputted to inhibit the stepper processing of the product.

Fourth Preferred Embodiment

The method of correcting alignment according to a fourth preferred embodiment of the present invention will now be described. The method of correcting alignment of the fourth preferred embodiment is used only for particular limited products. The products to be processed by the stepper 4 are of two types: products to be mass-produced and products to be prototyped in small numbers experimentally for mass-production. The latter products are referred to hereinafter as "prototypes." The prototypes are characterized in that the number of prototypes to be manufactured is extremely less than the number of products to be mass-produced. For example, some types of prototypes include only several prototypes to be processed. Even though a multiplicity of lots of prototypes are manufactured to develop one type of products, manufacturing processes are often different for the respective lots. Thus, the alignment data are preferably fed back within a lot for implementation of the method of correcting alignment.

The implementation of the method of correcting alignment of the fourth preferred embodiment is predicated on, for example, the technique disclosed in Japanese Patent Application No. 9-151, that is, the technique of calculating the predicted stepper correction value using the alignment data of different products. In such a technique, the tree information, the specification information and the correction function code are stored as shown in FIG. 34. The method of correcting alignment of the fourth preferred embodiment omits the tree information, the specification information and the correction function code to store a smaller number of data than the method of correcting alignment shown in FIG. 34. The alignment correcting method of the fourth preferred embodiment may omit the tree information since the products are limited to the same type and the patterns to be aligned need not be set for each product. The alignment correction method of the fourth preferred embodiment may omit the specification information since the specification value is not set for the prototypes and the stepper is not fixed. The correction function code may be omitted since a short development time period over which the prototypes are manufactured eliminates the need to set the term of availability. Additionally, the use of only the immediately preceding data eliminates the need to store the count.

Figure 50:
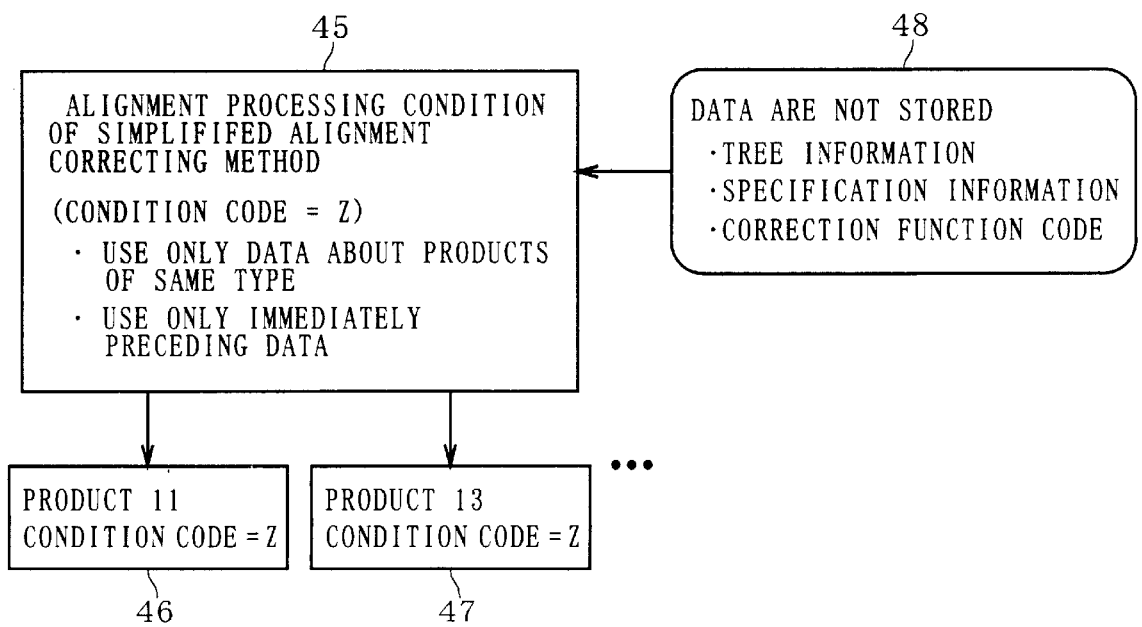
FIG. 50 conceptually illustrates a simplified method of correcting alignment.

Such a method of correcting alignment is referred to hereinafter as a simplified method of correcting alignment. FIG. 50 conceptually illustrates the simplified method of correcting alignment. The above-mentioned simplified method of correcting alignment has features (1) to (3) to be described below. (1) The simplified method is applied to the alignment correction of products of the same type. (2) The true shear for products of the same type which are immediately previously processed is used as the predicted stepper correction value. In Step 45, the contents of the condition code Z to be set as the processing conditions of the simplified method are such that only the data about products of the same type are used and only the immediately preceding data are used. In the steps designated by the reference numerals 46 and 47, products 11 and 13 which satisfy the above conditions are extracted. (3) The stepper to be used is not fixed. In this case, the tree information, the specification information and the correction function code are not stored as data in the step of storing data which is designated by the reference numeral 48.

FIG. 51 is a flowchart showing the procedure of the simplified alignment correction. The processing shown in the flowchart of FIG. 51 is executed at the beginning of Step S901 of FIG. 56. In Step ST501, the condition code assigned to each of the products is extracted. If the condition code indicates the implementation of the simplified method of correcting alignment, the flow proceeds to Step ST502 where the simplified method is implemented. On the other hand, if the result is "NO" or the condition code indicates the normal method of correcting alignment, the normal calculation is made in Step ST506 to determined the predicted stepper correction value.

In Step ST502, the alignment data are selected in the manner performed in Step ST201 of the first preferred embodiment and Step ST301 of the second preferred embodiment. Further, the latest data about products of the same type are extracted among the selected alignment data. In Step ST503, whether or not the extracted data are present or absent is judged. If the latest data are extracted in Step ST503, the processing in Step ST504 is performed to complete the calculation of the predicted stepper correction value. If the latest data are not extracted, the processing in Step ST505 is performed to complete the calculation of the predicted stepper correction value. In Step ST504, the true shear extracted in Step ST502 is given as to the predicted stepper correction value. In this case, the true shear for both or one of the shot and wafer components is calculated in the same manner as in the alignment correcting method of the first preferred embodiment. In Step ST505, the calculation results are all set at zero.

While the invention has been described in detail, the foregoing description is in all aspects illustrative and not restrictive. It is understood that numerous other modifications and variations can be devised without departing from the scope of the invention.

We claim:

1. A method of correcting alignment using true shears for a plurality of groups of products regarded as being subjected to stepper processing on the same condition, said method comprising the steps of:

calculating a mean value of said true shears for said plurality of groups of products;

calculating a difference in true shear between at least two groups of products which are manufactured consecutively among said plurality of groups of products; and adding a value proportional to said difference in true shear to said mean value to calculate a predicted stepper correction value.

2. The method according to claim 1, wherein said step of calculating said stepper correction value uses a proportionality constant which minimizes a variation in true shear to calculate the value proportional to said difference in true shear.

3. The method according to claim 2, wherein said step of calculating said stepper correction value comprises the step of detecting said proportionality constant in a range from –1 to 1.

4. The method according to claim 1, wherein said step of calculating said mean value comprises the step of determining a mean value of true shears for not less than three groups of products.

5. A method of correcting alignment using true shears for a plurality of groups of products regarded as being subjected to stepper processing on the same condition, said method comprising the steps of:

detecting whether or not said true shears fall within a predetermined range; and calculating a predicted stepper correction value without using a true shear which is outside said predetermined range.

6. A method of correcting alignment using true shears for a plurality of groups of products regarded as being subjected to stepper processing on the same condition, said method comprising the steps of:

extracting a group of products processed immediately previous to a product for which a predicted stepper correction value is to be calculated;

judging whether or not a measurement has been made on true shears for said group of products; and providing an instruction for inhibiting exposure using calculation of said predicted stepper correction value when said measurement has not yet been made.

7. A method of correcting alignment, comprising the steps of:

judging whether or not stepper processing is performed on products of a same type;

extracting a true shear for a product of said same type which is processed immediately previously; and determining a predicted stepper correction value, said predicted stepper correction value being said extracted true shear when said extracted true shear is extracted in said extracting step, and said predicted stepper correction value being a predetermined value when said extracted true shear is not extracted in said extracting step.

8. A device for correcting alignment using true shears for a plurality of groups of products regarded as being subjected to stepper processing on a same condition, said device comprising:

an average term calculation portion for calculating a mean value of said true shears for said plurality of groups of products;

a variable term calculation portion for calculating a difference in true shear between at least two groups of products which are manufactured consecutively among said plurality of groups of products; and an addition portion for adding a value proportional to an output of said variable term calculation portion to an output of said average term calculation portion to calculate a predicted stepper correction value.

9. A method of manufacturing a semiconductor device, comprising the step of positioning patterns with a method of correcting alignment using true shears for a plurality of groups of products regarded as being subjected to stepper processing on a same condition, wherein said method of correcting alignment comprises the steps of:

calculating a mean value of said true shears for said plurality of groups of products;

calculating a difference in true shear between at least two groups of products which are manufactured consecutively among said plurality of groups of products; and adding a value proportional to said difference in true shear to said mean value to calculate a predicted stepper correction value.

10. A method of manufacturing a semiconductor device comprising the step of positioning patterns with a method of correcting alignment using true shears for a plurality of groups of products regarded as being subjected to stepper processing on a same condition, wherein said method of correcting alignment comprises the steps of:

detecting whether or not said true shears fall within a predetermined range; and calculating a predicted stepper correction valve without using a true shear which is outside said predetermined range.

11. A method of manufacturing a semiconductor device comprising the step of positioning patterns with a method of correcting alignment using true shears for a plurality of groups of products regarded as being subjected to stepper processing on a same condition, wherein said method of correcting alignment comprises the steps of:

extracting a group of products processed immediately previous to a product for which a predicted stepper correction value is to be calculated;

judging whether or not a measurement has been made on true shears for said group of products; and providing an instruction for inhibiting exposure using calculation of said predicted stepper correction value when said measurement has not yet been made.

12. A method of manufacturing a semiconductor device comprising the step of positioning patterns with a method of correcting alignment, wherein said method of correcting alignment comprises the steps of:

judging whether or not stepper processing is performed on products of a same type;

extracting a true shear for a product of said same type which is processed immediately previously; and determining a predicted stepper correction value, said predicted stepper correction value being said extracted true shear when said extracted true shear is extracted in said extracting step, and said predicted stepper correction value being a predetermined value when said extracted true shear is not extracted in said extracting step.

13. A semiconductor device manufactured using a method of correcting alignment using true shears for a plurality of groups of products regarded as being subjected to stepper processing on a same condition, wherein said method of correcting alignment comprises the steps of:

calculating a mean value of said true shears for said plurality of groups of products;

calculating a difference in true shear between at least two groups of products which are manufactured consecutively among said plurality of groups of products; and adding a value proportional to said difference in true shear to said mean value to calculate a predicted stepper correction value.

14. A semiconductor device manufactured using a method of correcting alignment using true shears for a plurality of groups of products regarded as being subjected to stepper processing on a same condition, wherein said method of correcting alignment comprises the steps of:

detecting whether or not said true shears fall within a predetermined range; and calculating a predicted stepper correction value without using a true shear which is outside said predetermined range.

15. A semiconductor device manufactured using a method of correcting alignment using true shears for a plurality of groups of products regarded as being subjected to stepper processing on a same condition, wherein said method of correcting alignment comprises the steps of:

extracting a group of products processed immediately previous to a product for which a predicted stepper correction value is to be calculated;

judging whether or not a measurement has been made on true shears for said group of products; and providing an instruction for inhibiting exposure using calculation of said predicted stepper correction value when said measurement has not yet been made.

16. A semiconductor device manufactured using a method of correcting alignment, wherein said method of correcting alignment comprises the steps of:

judging whether or not stepper processing is performed on products of a same type;

extracting a true shear for a product of said same type which is processed immediately previously; and determining a predicted stepper correction value, said predicted stepper correction value being said extracted true shear when said extracted true shear is extracted in said extracting step, and said predicted stepper correction value being a predetermined value when said extracted true shear is not extracted in said extracting step.

17. A semiconductor device manufactured using a device for correcting alignment using true shears fur a plurality of groups of products regarded as being subjected to stepper processing on a same condition, wherein said device for correcting alignment comprises:

an average term calculation portion for calculating a mean value of said true shears for said plurality of groups of products;

a variable term calculation portion for calculating a difference in true shear between at least two groups of products which are manufactured consecutively among said plurality of groups of products; and an addition portion for adding a value proportional to an output of said variable term calculation portion to an output of said average term calculation portion to calculate a predicted stepper correction value.

* * * * *

UNITED STATES PATENT AND TRADEMARK OFFICE
CERTIFICATE OF CORRECTION

PATENT NO.     : 6,338,971 B1
DATED          : January 15, 2002
INVENTOR(S)    : Tsuneo Yasuda et al.

It is certified that error appears in the above-identified patent and that said Letters Patent is hereby corrected as shown below:

<u>Title page,</u>
Item [*] Notice, delete "This patent is subject to a terminal disclaimer.".

Signed and Sealed this

Eleventh Day of March, 2003

JAMES E. ROGAN
*Director of the United States Patent and Trademark Office*